(12) United States Patent
Chen et al.

(10) Patent No.: US 12,014,966 B2
(45) Date of Patent: Jun. 18, 2024

(54) SEMICONDUCTOR MEMORY DEVICE HAVING COMPOSITE DIELECTRIC FILM STRUCTURE AND METHODS OF FORMING THE SAME

(71) Applicant: Taiwan Semiconductor Manufacturing Company Limited, Hsinchu (TW)

(72) Inventors: Sheng-Chieh Chen, Taichung (TW); Wei-Ming Wang, Taichung (TW); Ming-Lun Lee, Hsinchu (TW); Chih-Ren Hsieh, Changhua (TW); Ming Chyi Liu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/115,810

(22) Filed: Mar. 1, 2023

(65) Prior Publication Data

US 2023/0207409 A1  Jun. 29, 2023

Related U.S. Application Data

(63) Continuation of application No. 17/474,297, filed on Sep. 14, 2021, now Pat. No. 11,637,046.

(Continued)

(51) Int. Cl.
*H01L 27/11524* (2017.01)
*H01L 21/28* (2006.01)
(Continued)

(52) U.S. Cl.
CPC ............ *H01L 23/291* (2013.01); *H01L 21/56* (2013.01); *H01L 23/3192* (2013.01);
(Continued)

(58) Field of Classification Search
CPC ... H01L 23/291; H01L 21/56; H01L 23/3192; H01L 29/40114; H01L 29/41775;
(Continued)

(56) References Cited

U.S. PATENT DOCUMENTS 10,325,918 B2 * 6/2019 Wu .................. H10B 41/42
2018/0301542 A1 10/2018 Zhou
(Continued)

FOREIGN PATENT DOCUMENTS

JP         201651745 A    4/2016
KR     20000004457 A    1/2000
(Continued)

OTHER PUBLICATIONS

Taiwan Patent and Trademark Office; Application No. 110148225 Office Action dated Sep. 8, 2022; 11 pages.

(Continued)

*Primary Examiner* — David Vu
(74) *Attorney, Agent, or Firm* — The Marbury Law Group, PLLC

(57) ABSTRACT

A semiconductor memory device and method of making the same are disclosed. The semiconductor memory device includes a substrate that includes a memory region and a peripheral region, a transistor including a metal gate located in the peripheral region, a composite dielectric film structure located over the metal gate of the transistor, the composite dielectric film structure including a first dielectric layer and a second dielectric layer over the first dielectric layer, where the second dielectric layer has a greater density than a density of the first dielectric layer, and at least one memory cell located in the memory region. The composite dielectric film structure provides enhanced protection of the metal gate against etching damage and thereby improves device performance.

20 Claims, 56 Drawing Sheets

Related U.S. Application Data

(60) Provisional application No. 63/152,454, filed on Feb. 23, 2021.

(51) Int. Cl.

| | | |
|---|---|---|
| *H01L 21/56* | (2006.01) | |
| *H01L 23/29* | (2006.01) | |
| *H01L 23/31* | (2006.01) | |
| *H01L 29/417* | (2006.01) | |
| *H01L 29/423* | (2006.01) | |
| *H01L 29/66* | (2006.01) | |
| *H01L 29/788* | (2006.01) | |
| *H10B 41/35* | (2023.01) | |
| *H10B 41/41* | (2023.01) | |
| *H10B 41/43* | (2023.01) | |
| *H10B 41/50* | (2023.01) | |

(52) U.S. Cl.
CPC .. *H01L 29/40114* (2019.08); *H01L 29/41775* (2013.01); *H01L 29/42328* (2013.01); *H01L 29/66825* (2013.01); *H01L 29/788* (2013.01); *H10B 41/35* (2023.02); *H10B 41/41* (2023.02); *H10B 41/43* (2023.02); *H10B 41/50* (2023.02)

(58) Field of Classification Search
CPC ......... H01L 29/42328; H01L 29/66825; H01L 29/788; H10B 41/35; H10B 41/41; H10B 41/43; H10B 41/50; H10B 41/49; H10B 41/30; H10B 41/40; H10B 41/42
See application file for complete search history.

(56) References Cited

U.S. PATENT DOCUMENTS

| | | |
|---|---|---|
| 2019/0304991 A1 | 10/2019 | Seo et al. |
| 2020/0168701 A1 | 5/2020 | Lin et al. |

FOREIGN PATENT DOCUMENTS

| | | |
|---|---|---|
| KR | 20010017246 A | 3/2001 |
| KR | 20030020148 A | 3/2003 |
| TW | 201705302 A | 2/2017 |
| TW | 201834212 A | 9/2018 |

OTHER PUBLICATIONS

German Patent and Trademark Office, Application No. 10 2022 0007101, First Examination Report dated Dec. 22, 2022, 9 pages.
Korean Patent and Trademark Office, Application No. 110 2022 0007101, First Examination Report dated Dec. 23, 2022, 6 pages.
Korean Patent and Trademark Office, Application No. 10 2022 0007101, Notice of Final Rejection, dated Oct. 19, 2023, 7 pages.
Korean Patent and Trademark Office, Application No. 10 2022 0007101, Third Office Action, mailed Apr. 19, 2024; 6 pages.

* cited by examiner

SEMICONDUCTOR MEMORY DEVICE HAVING COMPOSITE DIELECTRIC FILM STRUCTURE AND METHODS OF FORMING THE SAME

RELATED APPLICATIONS

This application is a continuation of U.S. patent application Ser. No. 17/474,297, entitled "Semiconductor Memory Device Having Composite Dielectric Film Structure and Methods of Forming the Same," filed on Sep. 14, 2021, which claims priority to U.S. Provisional Patent Application No. 63/152,454 entitled "A Method to Enhance Metal-Gate Missing Window for ESF3 Flash" filed on Feb. 23, 2021, the entire contents of both of which are hereby incorporated by reference for all purposes

BACKGROUND

The semiconductor integrated circuit (IC) industry has experienced exponential growth over the last few decades. Over the course of IC evolution, functional density (i.e., the number of interconnected devices per chip area) has generally increased while geometry size (i.e., the smallest component (or line) that can be created using a fabrication process) has decreased.

Super-flash technology has enabled designers to create cost effective and high performance programmable system-on-chip (SOC) solutions through the use of split-gate flash memory cells. The aggressive scaling of the third generation embedded super-flash memory (ESF3) enables designing flash memories with high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
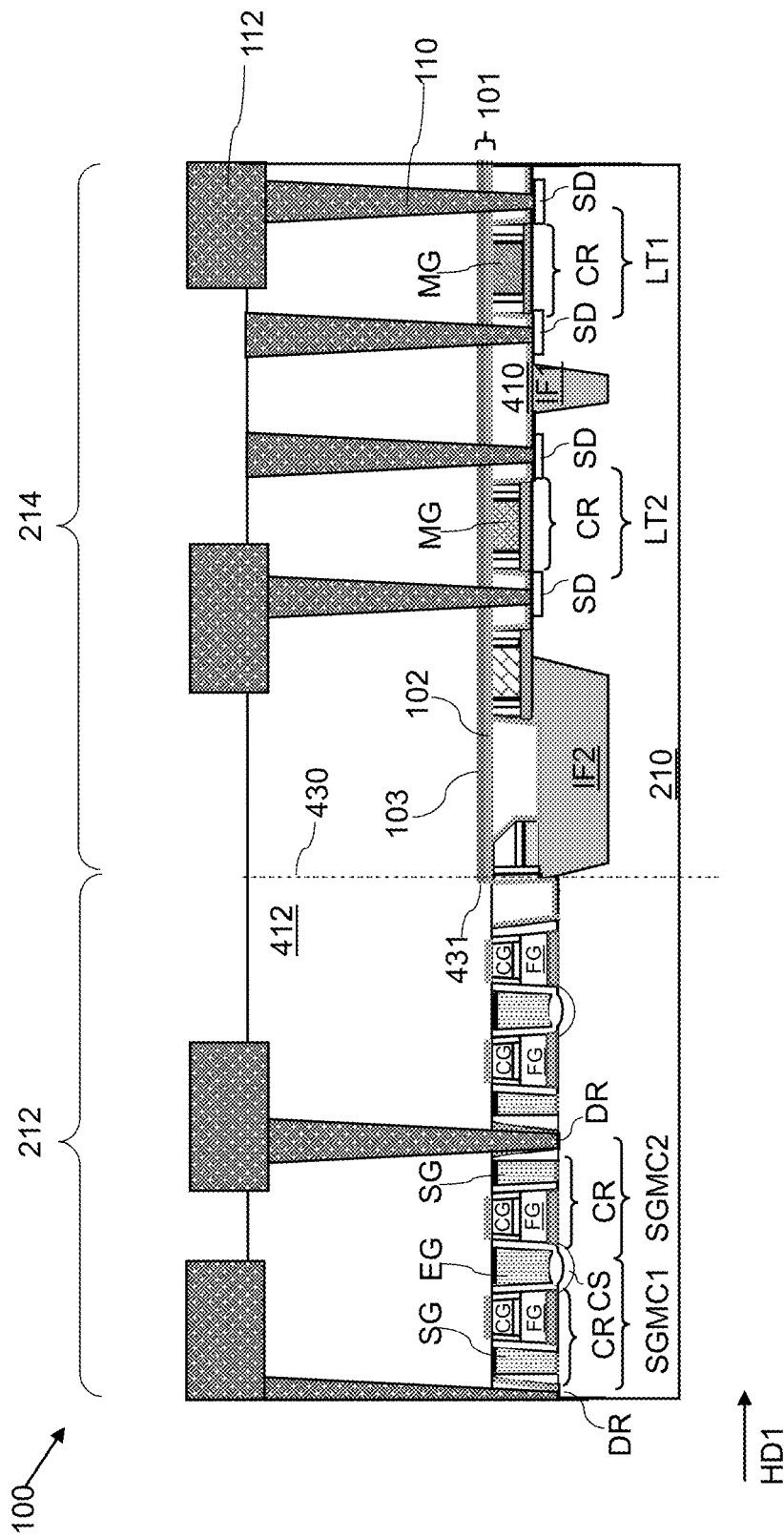
FIG. 1 is a vertical cross-sectional view of a memory device according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices, and specifically to semiconductor memory devices including memory cells and logic transistors formed on a common substrate.

FIG. 1 illustrates a vertical cross-sectional view of a memory device 100 according to various embodiments of the present disclosure. In some embodiments, the memory device 100 may be an ESF3 memory device, or a so-called "third generation SUPERFLASH" memory device 100. For example, the ESF3 memory device 100 may include an array of symmetric split gate memory cells SGMC1, SGMC2. Each split gate memory cell SGMC1, SGMC2 may include a source region CS, a drain region DR and a channel region CR arranged there between. In the ESF3 architecture, the source regions CS for each of the split gate memory cells SGMC1, SGMC2 may be a common source region CS shared with its neighboring cell. Each split gate memory cell (e.g., SGMC1 and SGMC2) may have its own drain region DR. One of ordinary skill in the art would understand that the source regions CS may also be designated the drain regions DR. Thus, in other embodiments, the neighboring split gate memory cells may also share a common drain region DR.

Within each split gate cell SGMC1, SGMC2, a floating gate FG may be arranged over the channel region CR of the split gate cell SGMC1, SGMC2. Further, a control gate CG may be arranged over the floating gate FG. A select gate SG may be arranged on one side of the floating gate FG and control gates CG (e.g., between an individual source/drain region CS, DR of the ESF3 memory cell and a sidewall of the floating gate FG and/or control gate CG). An erase gate EG may be arranged over a common source/drain region CS, DR between the split gate cells SGMC1 and SGMC2. At least one split gate cell SGMC1, SGMC2 may be configured to store a variable charge level on its floating gate FG, wherein the level of this charge corresponds to a data state stored in the split gate cell SGMC1, SGMC2 and may be stored in a non-volatile manner so that the stored charge/data persists in the absence of power.

A typical flash memory cell uses a floating gate FG to store a bit by the presence or absence of a charge. If the floating gate FG is not charged (i.e., neutral), then the device operates similarly to a conventional MOSFET, e.g. a positive charge in the control gate CG creates a channel CR in the semiconductor material substrate 210 that carries a current from source CS to drain region DR. However, in instances in which the floating gate FG is negatively charged, then this charge shields the channel region CR somewhat from the control gate CG and prevents the formation of a channel between source CS and drain DR. The threshold voltage $V_{th}$ is the voltage applied to the control gate CG at which a transistor becomes conductive. The presence or the absence of a charge results in a more positive or more negative threshold voltage $V_{th}$. With reference to flash memory terms, programming (putting electrons into the floating gate FG) means writing a 0, erasing (removing the charge from the floating gate FG) means resetting the flash memory contents to 1; or in other words: a programmed cell stores a logic 0, an erased (a.k.a. flashed) split gate memory cell SGMC1, SGMC2 stores a logic 1.

In various embodiments, an ESF3 memory device 100 such as shown in FIG. 1 may include an array of split gate memory cells SGMC1, SGMC2 within a memory region 212 of the device 100. In some embodiments, at least some of the split gate memory cells SGMC1, SGMC2 may share a common drain region DR with a neighboring memory cell along a first horizontal direction (HD1). The select gates SG, which may also be referred to as word lines WLs, may extend between split gate memory cells SGMCs of the array along a second horizontal direction (HD2, see FIG. 2) that is perpendicular to the first horizonal direction (HD1). In embodiments, adjacent split gate memory cells SGMCs along the second horizontal direction (HD2) may be separated from one another by isolation features, such as shallow trench isolation (STI) features.

Referring again to FIG. 1, the memory device 100 according to various embodiments may also include a peripheral region 214. The peripheral region 214 may include a plurality of logic transistors LT1, LT2. Each of the logic transistors LT1, LT2 may include a metal gate MG arranged over a channel region CR of the logic transistor LT1, LT2, and source and drain regions SD on either side of the metal gate MG. The logic transistors LT1, LT2 in the peripheral region 214 may form logic devices, such as memory selectors, power gates and input/output elements, of the memory device 100.

Referring again to FIG. 1, a composite dielectric film structure 101 may extend over each of the metal gates MG of the logic transistors LT1, LT2 within the peripheral region 214 of the memory device 100. The composite dielectric film structure 101 may include at least two layers of dielectric material 102, 103. In some embodiments, each of the layers of dielectric material 102, 103 may have a thickness of at least about 5 nm, such as between about 5 nm and about 30 nm (e.g., between ~5 nm and ~15 nm). A total thickness of the composite dielectric film structure 101 may be between about 10 nm and about 60 nm (e.g., between ~10 nm and about 45 nm), which may provide adequate protection for the metal gates MG during fabrication of the memory device 100.

In various embodiments, the composite dielectric film structure 101 may include a first layer of dielectric material 102. The first layer of dielectric material 102 may be located above an upper surface of the metal gates MG of the logic transistors LT1, LT2. In some embodiments, the first layer of dielectric material 102 may directly contact the upper surface of the metal gates MG of the logic transistors LT1, LT2. The first layer of dielectric material 102 may be composed of a suitable dielectric material, such as an oxide or nitride material (e.g., silicon oxide, silicon nitride, silicon oxynitride, etc.). In some embodiments, the first layer of dielectric material 102 may be composed of silicon oxide formed using a tetraethoxysilane (TEOS) precursor. In some embodiments, the first layer of dielectric material 102 may be a resist protective oxide (RPO) material. Other suitable dielectric materials are within the contemplated scope of disclosure. In some embodiments, the first layer of dielectric material 102 may have good adherence properties, including good adherence to the material(s) of the metal gates MG of the logic transistors LT1, LT2.

The composite dielectric film structure 101 may include a second layer of dielectric material 103 that may be located above the first layer of dielectric material 102. In some embodiments, the second layer of dielectric material 103 may directly contact the first layer of dielectric material 102. The second layer of dielectric material 103 may have a different composition and/or different physical characteristics than the first layer of dielectric material 102. In various embodiments, the second layer of dielectric material 103 may have a density that is greater than a density of the first layer of dielectric material 102. For example, the second layer of dielectric material 103 may have a density that is at least 10%, such as at least 50%, including at least 100% greater than a density of the first layer of dielectric material 102. In some embodiments, the second layer of dielectric material 103 may have lower etch rate (i.e., a higher etch resistance) than the material of the first layer of dielectric material 102.

The second layer of dielectric material 103 may be composed of a suitable dielectric material, such as an oxide or nitride material (e.g., silicon oxide, silicon nitride, silicon oxynitride, etc.). In some embodiments, the second layer of dielectric material 103 may be composed of a buffer oxide material, a silicon nitride material, a high-temperature oxide (HTO) material, and the like. Other suitable dielectric materials are within the contemplated scope of disclosure. In some embodiments, the composite dielectric film structure 101 may include one or more additional layers of dielectric material, where the one or more additional layers may be located between the first layer of dielectric material 102 and the upper surface of the metal gates MG of the logic transistors LT1, LT2, between the first layer of dielectric material 102 and the second layer of dielectric material 103, and/or over the second layer of dielectric material 103.

Referring again to FIG. 1, in some embodiments, an isolation feature IF2, such as a shallow-trench isolation (STI) feature may be located between the memory cells SGMC1, SGMC2 of the memory region 212 and the logic transistors LT1, LT2 of the peripheral region 214 of the memory device 100. A peripheral edge of the isolation feature IF2 may define a boundary 430 between the memory region 212 and the peripheral region 214 of the memory device 100. In various embodiments, a peripheral edge 431 of the composite dielectric film structure 101 may be within ±300 nm (e.g., ±200 nm, such as ±100 nm) of the boundary 430 between the memory region 212 and the peripheral region 214 of the memory device 100. By providing the peripheral edge 431 within ±300 nm of the boundary 430 between the memory region 212 and the peripheral region 214, the composite dielectric film structure 101 may not extend too far into the memory region 212, where it may interfere with subsequent processing steps used to form the memory cells SGMC1, SGMC2, while also ensuring that the dielectric film structure 101 extends sufficiently within the peripheral region 214 to protect the metal gates MG of the logic transistors LT. Thus, in various embodiments, the composite dielectric film structure 101 may not extend over an upper surface of the memory cells SGMC1, SGMC2 of the memory region 212. In some embodiments, a lower surface of the composite dielectric film structure 101 may be substantially co-planar with an upper surface of the memory cells SGMC1, SGMC2 of the memory region 212.

In various embodiments, an inter-level dielectric (ILD) layer 412 may be located over the upper surfaces of the memory cells SGMC1, SGMC2 in the memory region 212, and over the upper surface of the composite dielectric film structure 101 in the peripheral region 214 of the memory device 100. A plurality of conductive vias 110 may extend through the interlevel dielectric material layer 412. In the memory region 212 of the memory device 100, conductive vias 110 may electrically contact drain regions DR of the memory cells SGMC1, SGMC2, and may electrically connect the memory cells SGMC1, SGMC2 to overlying metal feature(s) 112 of the memory device 100. In the peripheral region 214 of the memory device 100, conductive vias 110 may extend through the composite dielectric film structure 101 and may electrically contact respective source and drain regions SD of the logic transistors LT1, LT2. The conductive vias 110 may electrically connect the logic transistors LT1, LT2 to overlying metal feature(s) 112 of the memory device 100. In various embodiments, the composite dielectric film structure 101 may extend continuously between the conductive vias 110 within the peripheral region 214 of the memory device 100.

In some embodiments, an upper surface of the semiconductor material substrate 210 on which the split gate memory cells SGMC1, SGMC2 are located within the memory region 212 of the memory device 100 may be recessed relative to the upper surface of the semiconductor material substrate 210 on which the logic transistors LT1, LT2 are located within the peripheral region 214 of the device 100.

In various embodiments, a composite dielectric film structure 101 in a peripheral region 214 of the memory device 100 may provide improved protection to logic transistors LT1, LT2 within the peripheral region. In particular, the composite dielectric film structure 101 may protect the integrity of the metal gates MG of the logic transistors LT1, LT2. In some instances, processing steps during fabrication of a memory device 100 may produce metal precipitates from the metal material(s) (e.g., aluminum) forming the metal gate MG structures of the logic transistors LT1, LT2. The presence of these metal precipitates may produce weak spots, such as sidewall pit-holes, in a dielectric material layer that is subsequently formed over the metal gate structures MG. During subsequent fabrication steps, such as a wet etching step following a silicidation of the select gates SG and erase gates EG of the memory cells, portions of the metal gate(s) MG may be unintentionally etched through the weak spots in the overlying dielectric layer. This may negatively affect performance of the memory device 100. In various embodiments, by providing a composite dielectric film structure 101 over the metal gates MG of the logic transistors LT1, LT2 in the peripheral region 214 of the memory device 100, the metal gates MG may be better protected against etching damage, which may improve performance and yield of memory devices 100. In addition to memory devices, such as an ESF3 memory device 100 such as shown in FIG. 1, a composite dielectric film structure 101 as shown and described herein may be used in other types of integrated circuit (IC) devices, including devices including metal gate structures that may include a composite dielectric film structure 101 over the gate structure(s) in order to avoid metal gate etching damage and/or metal gate peeling.

Figure 2:
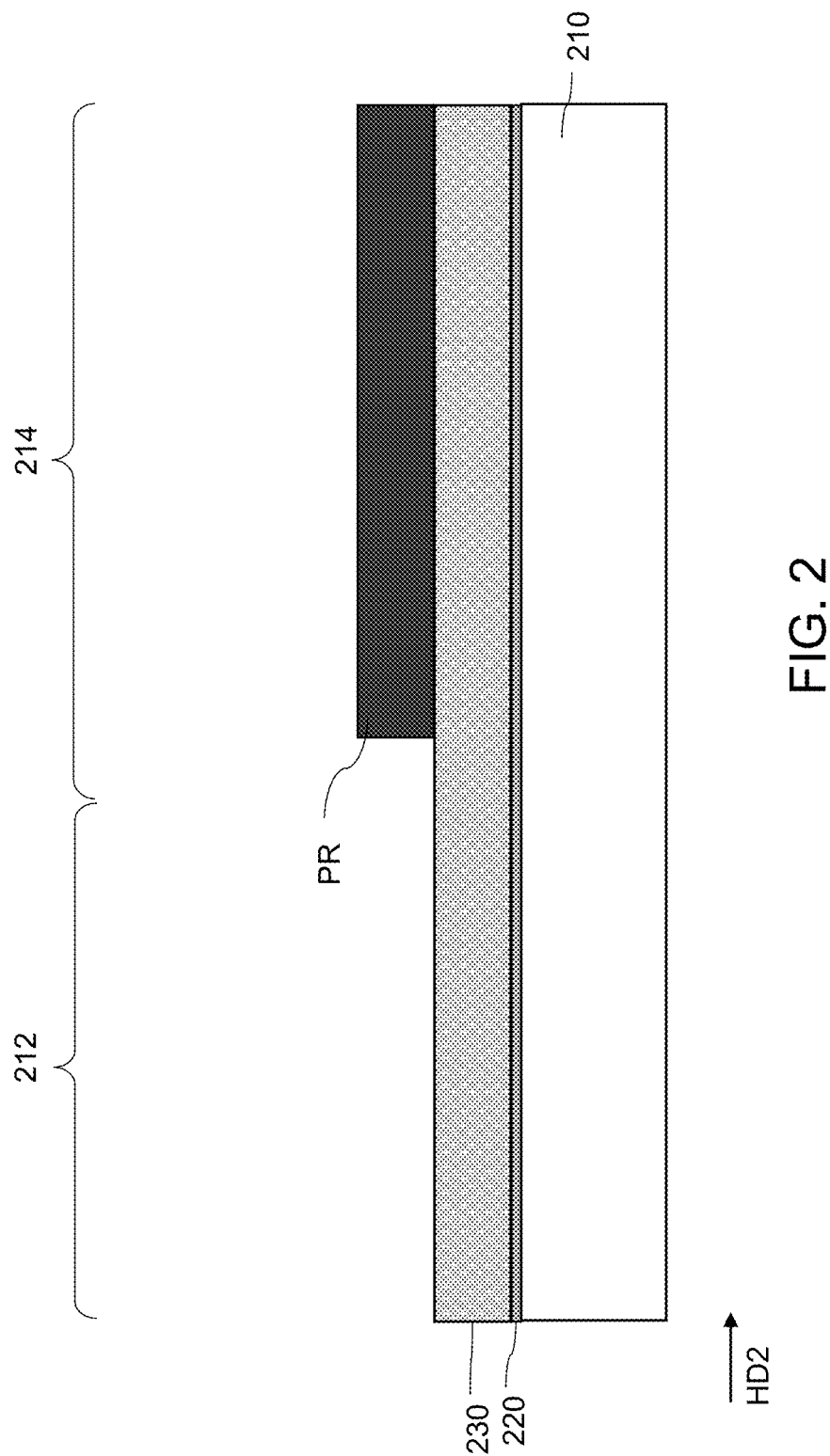
FIG. 2 is a vertical cross-section view of an exemplary intermediate structure for forming a memory device including a substrate, first and second dielectric layers, and a patterned mask according to various embodiments of the present disclosure.
Figure 55:
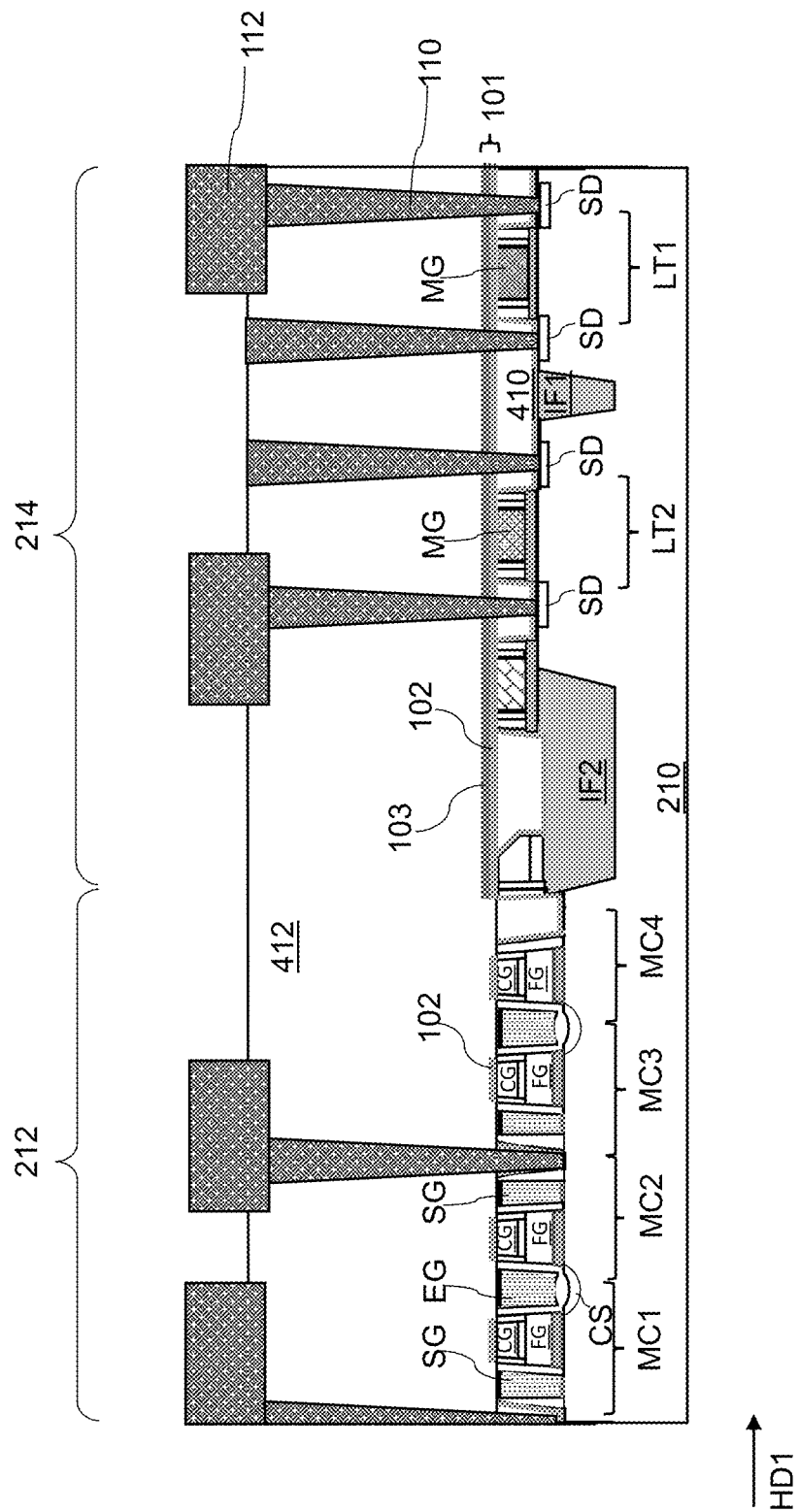
FIG. 55 is a vertical cross-section view of the exemplary intermediate structure showing an inter-level dielectric (ILD) layer over the intermediate structure, metal features over the ILD layer, and conductive vias extending between the metal features and the memory cells and the logic transistors according to various embodiments of the present disclosure.

FIGS. 2 to 55 are sequential vertical cross-sectional views illustrating an intermediate structure during a method for manufacturing a memory device 100, such as an ESF3 memory device as shown in FIG. 1, in accordance with some embodiments. It is understood that additional steps may be implemented before, during, or after the method, and some of the steps described may be replaced or eliminated for other embodiments of the method.

FIG. 2 is a vertical cross-section view of the exemplary intermediate structure including a substrate 210, first dielectric layer 220 and second dielectric layer 230 and a patterned mask PR according to various aspects of the present disclosure. Referring to FIG. 2, the substrate 210 is shown in vertical cross-section along horizontal direction HD2. Thus, the cross-section view shown in FIG. 2 is rotated 90° relative to the orientation of FIG. 1, which is a vertical cross-section view the memory device 100 along horizontal direction, HD1. In various embodiments, the substrate 210 may be a semiconductor material substrate, such as a bulk silicon substrate, a germanium substrate, a compound substrate, or other suitable substrate. In some embodiments, the substrate 210 may include an epitaxial layer overlying a bulk semiconductor, a silicon germanium layer overlying a bulk silicon, a silicon layer overlying a bulk silicon germanium, or a semiconductor-on-insulator (SOI) structure. The substrate 210 may include a memory region 212 and a peripheral region 214. The peripheral region 214 may be located such that it surrounds the memory region 212.

Referring again to FIG. 2, a first dielectric layer 220 may formed over the substrate 210. The first dielectric layer 220 may include, for example, a dielectric material such as silicon dioxide ($SiO_2$), silicon nitride ($Si_3N_4$), silicon oxynitride (SiON), high-k materials, other non-conductive materials, or combinations thereof. Other suitable dielectric materials are within the contemplated scope of disclosure.

A second dielectric material layer 230 may be formed over the first dielectric layer 220. The dielectric material layer 230 may include a suitable dielectric material, such as silicon dioxide ($SiO_2$), silicon nitride ($Si_3N_4$), silicon oxynitride (SiON), high-k materials, other non-conductive materials, or combinations thereof. In one non-limiting embodiment the first dielectric material layer 220 may include silicon oxide, and the second dielectric material layer 230 may include silicon nitride. In various embodiments, a thickness of the second dielectric material layer 230 may be greater than a thickness of the first layer 220.

The first dielectric material layer 220 and the second dielectric material layer 230 may be deposited using any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a low pressure CVD process, a metalorganic CVD (MOCVD) process, a plasma enhanced CVD (PECVD) process, a sputtering process, laser ablation, or the like.

Referring again to FIG. 2, a patterned mask, such as a photoresist mask PR may be formed over the second dielectric layer 230 in the peripheral region 214 of the intermediate structure. The patterned mask may be formed by depositing a layer of photoresist material over the second dielectric layer 230 and lithographically patterning the photoresist material to form a patterned mask PR covering the second dielectric layer 230 in the peripheral region 214 of the intermediate structure. The second dielectric layer 230 may be exposed through the patterned mask PR in the memory region 212 of the intermediate structure.

Figure 3:
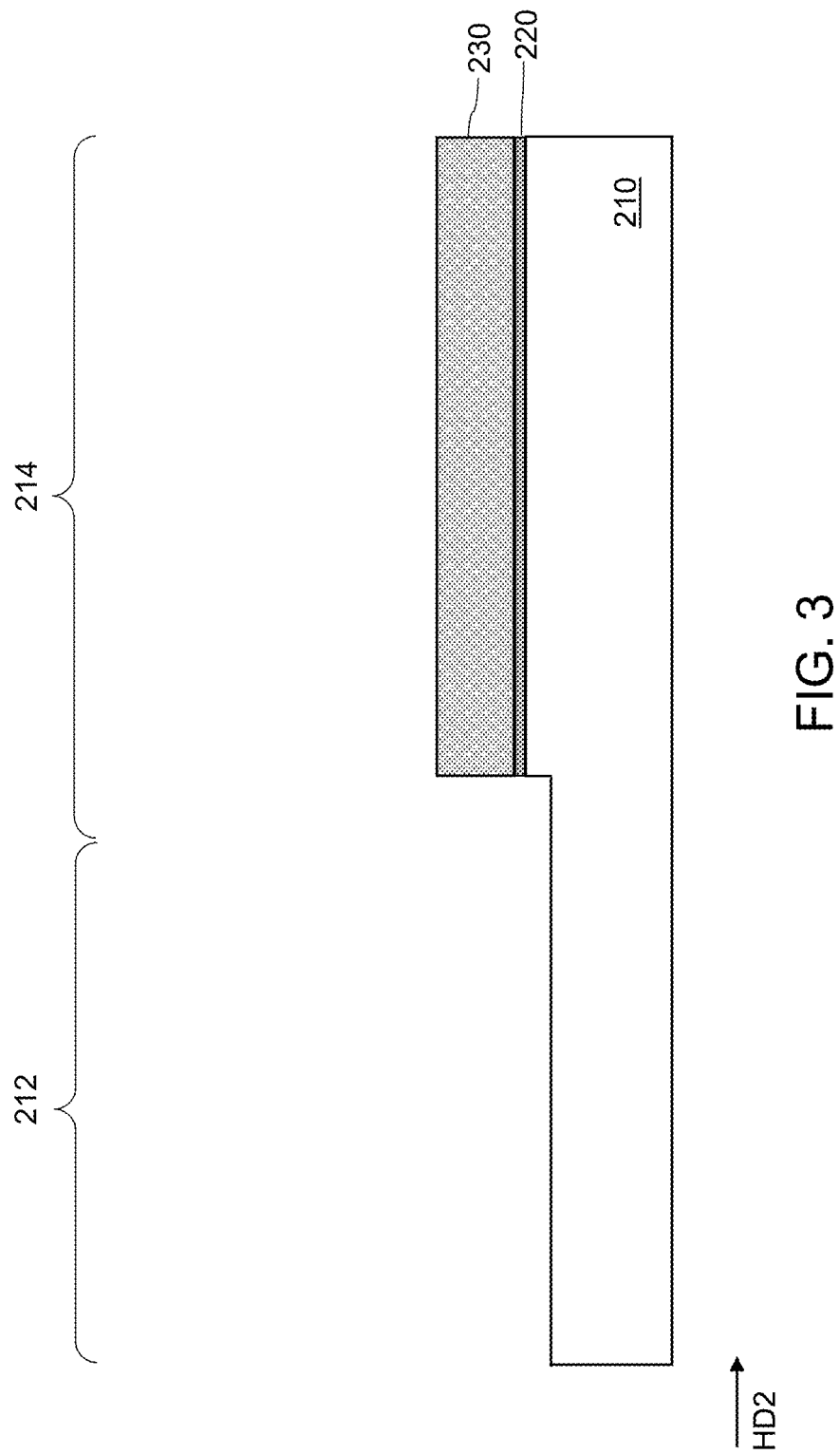
FIG. 3 is a vertical cross-section view of the exemplary intermediate structure following an etching process that removes the second dielectric layer, the first dielectric layer and portions of the substrate from the memory region according to various embodiments of the present disclosure.

FIG. 3 is a vertical cross-section view of the exemplary intermediate structure following an etching process that removes the second dielectric layer 230, the first dielectric layer 220 and portions of the substrate 210 from the memory region 212 of the intermediate structure. Referring to FIG. 3, following the etching process, the upper surface of the substrate 210 in the memory region 212 may be recessed relative to the upper surface of the substrate 210 in the peripheral region 214. Following the etching process, the patterned mask may be removed using a suitable process, such as by ashing or by dissolution with a solvent.

Figure 4:
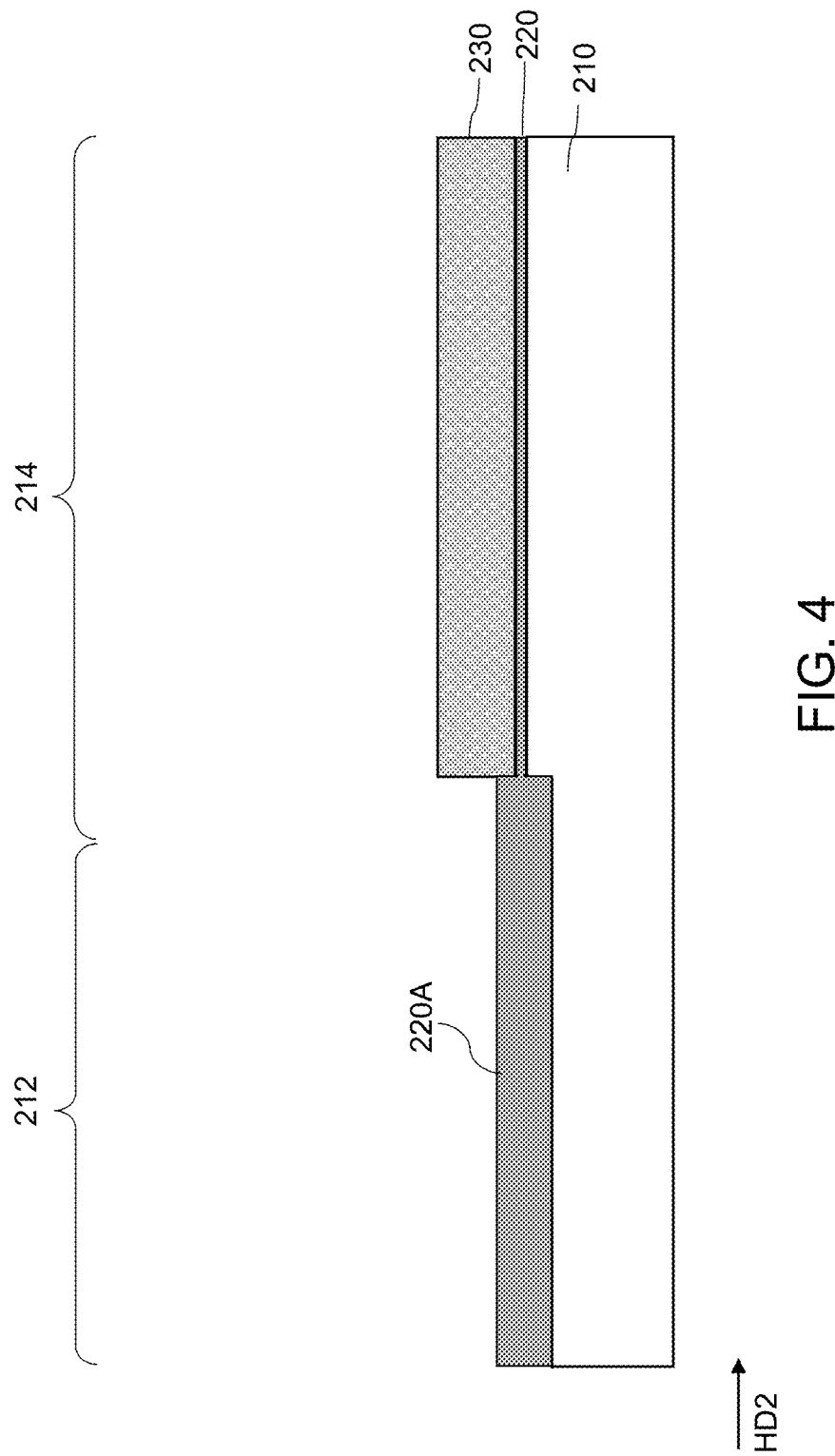
FIG. 4 is a vertical cross-section view of the exemplary intermediate structure showing a dielectric material layer deposited over the recessed surface of the substrate in the memory region according to various embodiments of the present disclosure.

FIG. 4 is a vertical cross-section view of the exemplary intermediate structure showing a dielectric material layer 220A deposited over the recessed surface of the substrate 210 in the memory region 212. In embodiments, the dielectric material layer 220A deposited over the recessed surface of the substrate 210 may be the same dielectric material as the material of the first dielectric layer 220 (e.g., silicon oxide). The dielectric material layer 220A may have a vertical height that is greater than the distance by which the substrate 210 is recessed in the memory region 212. Thus, the side surface of dielectric material layer 220A may contact the exposed side surface of dielectric layer 220 such that layers 220 and 220A may be continuous. Dielectric material layer 220A may be deposited using a suitable deposition method as described above.

Figure 5:
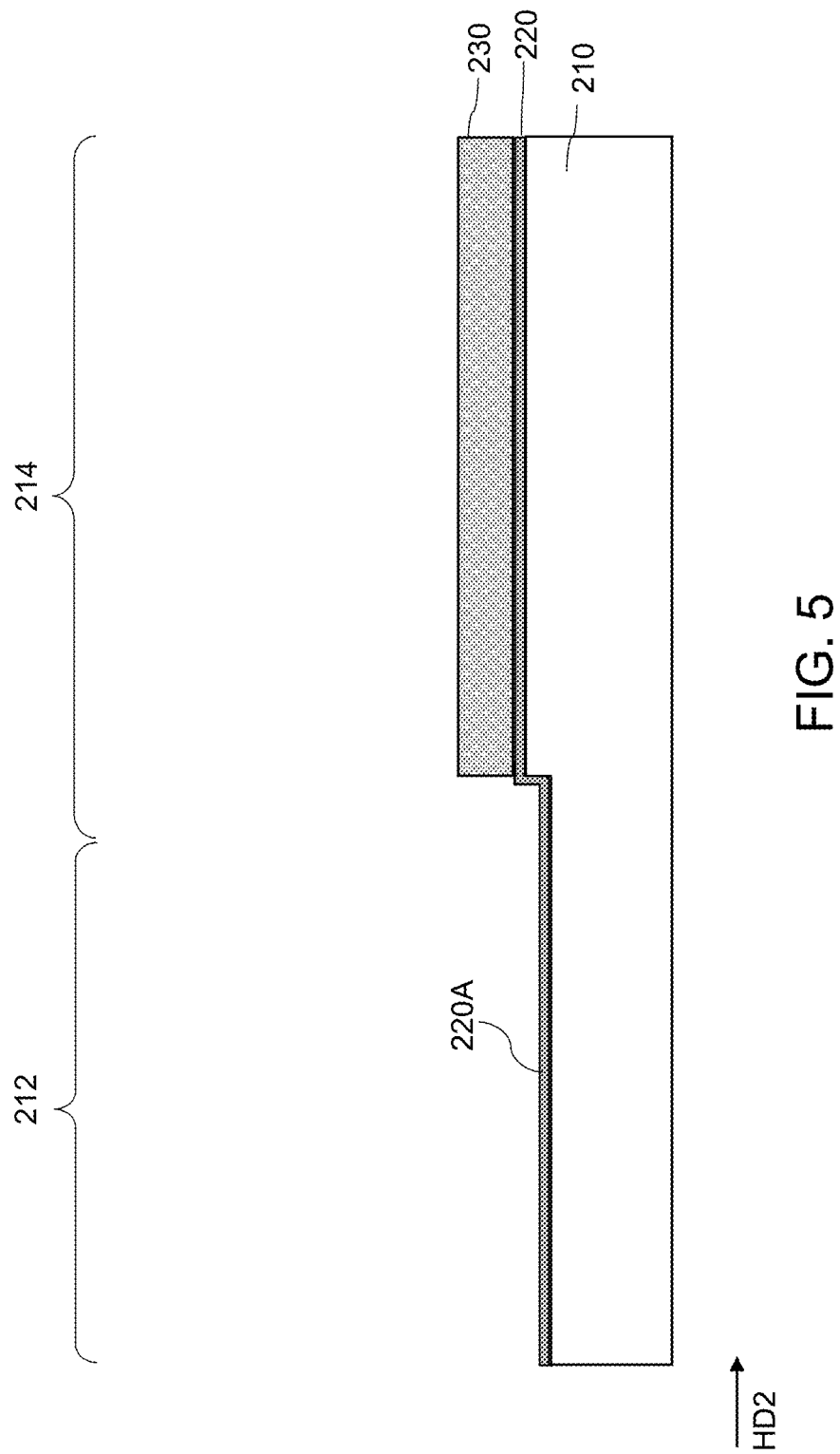
FIG. 5 is a vertical cross-section view of the exemplary intermediate structure following an etching process that removes a portion of the second dielectric layer from the peripheral region and a portion of a dielectric material layer from the memory region according to various embodiments of the present disclosure.

FIG. 5 is a vertical cross-section view of the exemplary intermediate structure following an etching process that removes a portion of the second dielectric layer 230 from the peripheral region 214 and a portion of dielectric material layer 220A from the memory region 212. Referring to FIG. 5, in various embodiments, the exemplary intermediate structure may be etched using an etching process having a higher etch rate for the material of dielectric material layer 220A than for the material of the second dielectric material layer 230. Thus, as shown in FIG. 5, a greater thickness of the dielectric material layer 220A may be removed from the memory region 212 than the thickness of the second dielectric material layer 230 removed from the peripheral region 214. In some embodiments, following the etching process the thickness of the remaining dielectric material layer 220A in the memory region 212 may be approximately the same as the thickness of the first dielectric material layer 220 in the peripheral region 214. As shown in FIG. 5, dielectric material layer 220A in the memory region 212 may be continuous with the first dielectric material layer 220 in the peripheral region 214, and layers 220A and 220 may collectively also be referred to as a tunneling layer 220.

Figure 6:
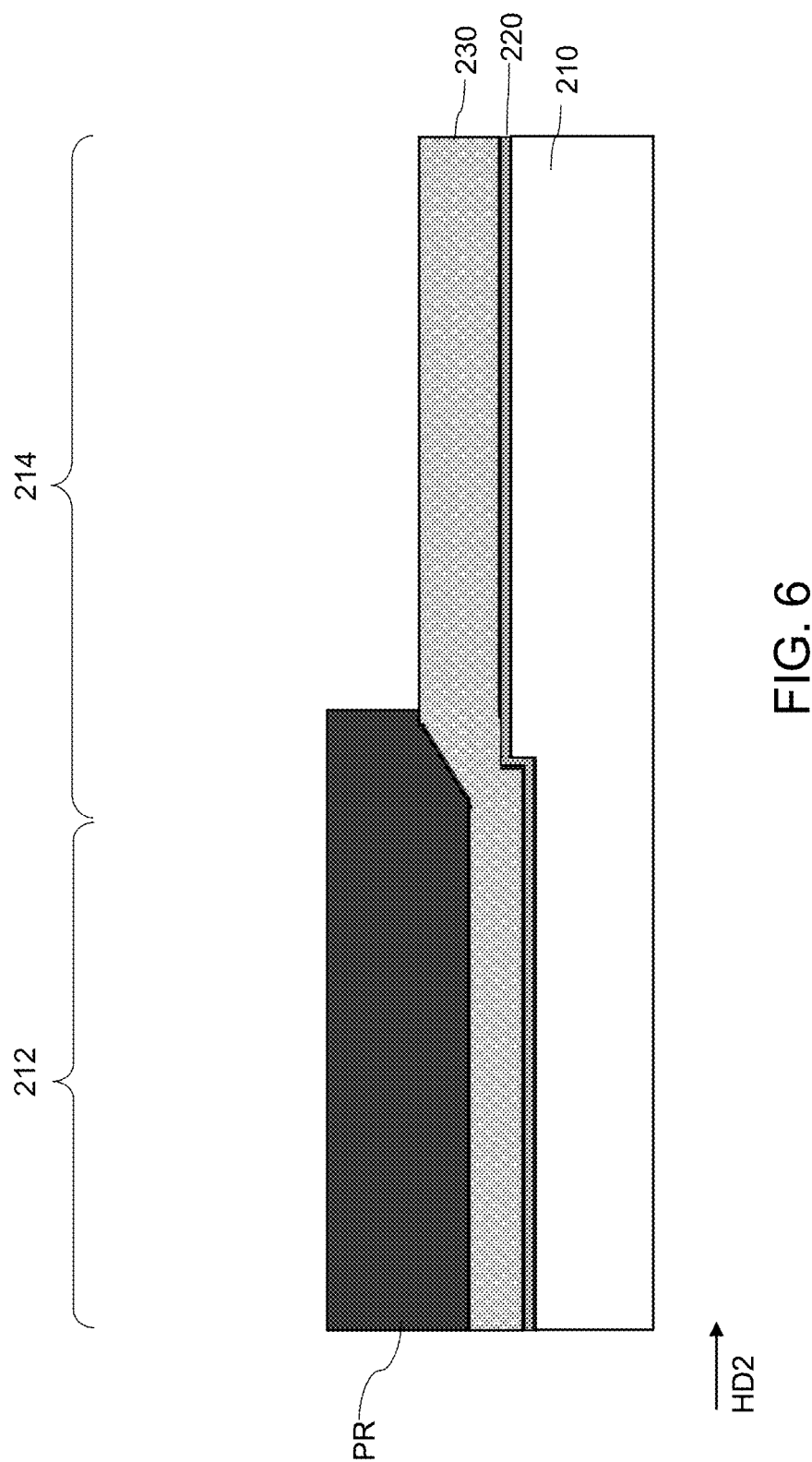
FIG. 6 is a vertical cross-section view of the exemplary intermediate structure showing a second dielectric layer over the tunneling layer in the memory region and in the peripheral region, and a patterned mask over the second dielectric layer in the memory region and a portion of the peripheral region according to various embodiments of the present disclosure.

FIG. 6 is a vertical cross-section view of the exemplary intermediate structure showing a second dielectric layer 230 over the tunneling layer 220 in the memory region 212 and in the peripheral region 214, and a patterned mask PR over the second dielectric layer 230 in the memory region 212 and a portion of the peripheral region 214. Referring to FIG. 6, additional dielectric material may be deposited over the second dielectric layer 230 in the peripheral region 214 and over the tunneling layer 220 in the memory region. The additional dielectric material may be the same material as the material of second dielectric layer 230. Thus, the additional dielectric material may increase the thickness of the second dielectric layer 230 in the peripheral region 214, and may extend the second dielectric layer 230 into the memory region 212. In various embodiments, the additional dielectric material may include silicon nitride, and may be deposited using a suitable deposition method as described above.

Referring again to FIG. 6, a patterned mask, such as a photoresist mask PR may be formed over the second dielectric layer 230 in the memory region 212 and in a portion of the peripheral region 214. The patterned mask may be formed by depositing a layer of photoresist material over the second dielectric layer 230 and lithographically patterning the photoresist material to form a patterned mask PR covering the second dielectric layer 230 in the memory region 212 and a portion of the peripheral region 214. The second dielectric layer 230 may be exposed through the patterned mask PR in the remainder of the peripheral region.

Figure 7:
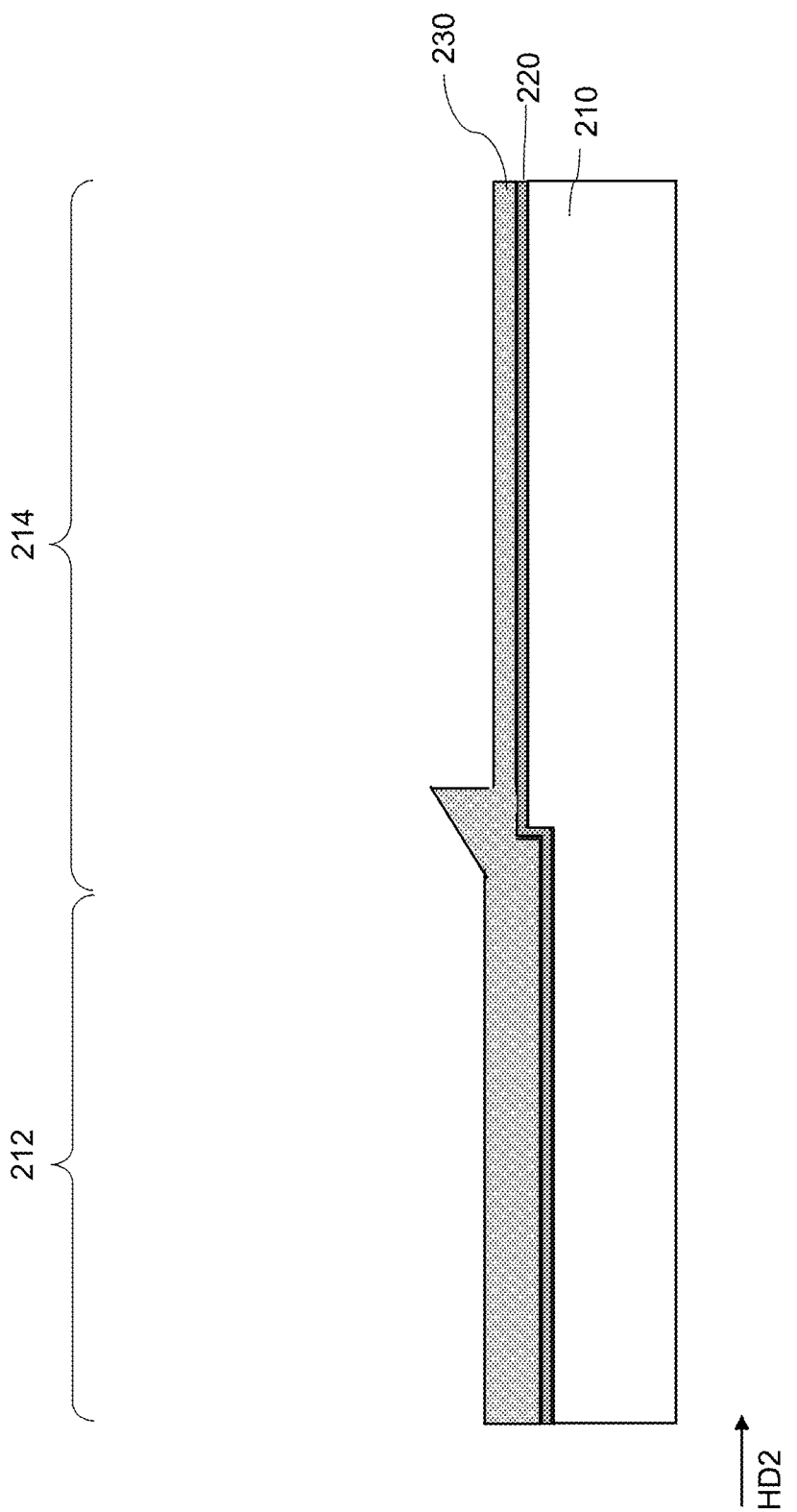
FIG. 7 is a vertical cross-section view of the exemplary intermediate structure following an etching process that removes a portion of the second dielectric layer in the peripheral region according to various embodiments of the present disclosure.

FIG. 7 is a vertical cross-section view of the exemplary intermediate structure following an etching process that removes a portion of the second dielectric layer 230 in the peripheral region 214 of the intermediate structure. Referring to FIG. 7, following the etching process, a thickness of the second dielectric layer 230 may be decreased in the peripheral region 214. In some embodiments, following the etching process, the thickness of the second dielectric layer 230 in the peripheral region 214 may be less than the thickness of the second dielectric layer 230 in the memory region 212. Following the etching process, the patterned mask may be removed using a suitable process, such as by ashing or by dissolution with a solvent.

Figure 8:
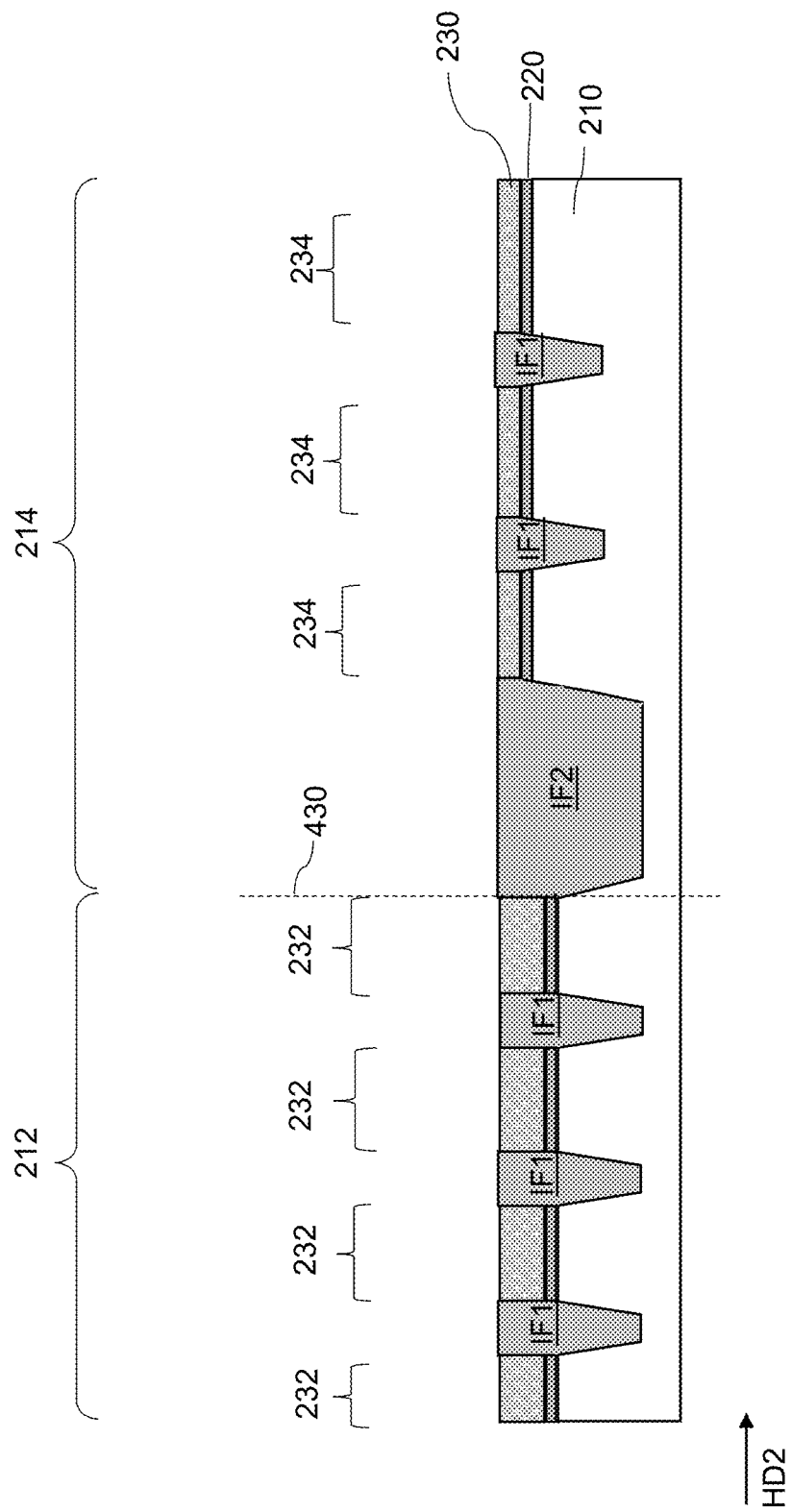
FIG. 8 is a vertical cross-section view of the exemplary intermediate structure showing a plurality of isolation features extending through the first and second dielectric layers and into the substrate in the memory region and in the peripheral region according to various embodiments of the present disclosure.

FIG. 8 is a vertical cross-section view of the exemplary intermediate structure showing a plurality of isolation features IF1, IF2 extending through the first dielectric layer 220 and second dielectric layer 230 and into the substrate 210 in the memory region 212 and the peripheral region 214 of the exemplary structure. Referring to FIG. 8, isolation features IF1, IF2 may be formed by applying and patterning a photoresist layer (not shown in FIG. 8) over the upper surface of the second dielectric layer 230, and performing an anisotropic etch process to remove portions of the second dielectric layer 230, the first dielectric layer 220 and the substrate 210 and form a plurality of trenches through the first and second dielectric layers 220, 230 and into an upper portion of the substrate 210. The photoresist layer may be subsequently removed, for example, by ashing or by dissolution with a solvent. A dielectric material may be deposited in the trenches, and a planarization process, such as a chemical mechanical planarization (CMP) process may be performed to remove excess portions of the dielectric material from above the upper surface of the second dielectric layer 230 and provide an intermediate structure having a planar upper surface as shown in FIG. 8. Following the planarization process, the remaining portions of the dielectric material that fill the trenches may form isolation features IF1 and IF2, which may be shallow trench isolation (STI) structures. Each of the isolation featured IF1, IF2 may be embedded within the second dielectric layer 230, the first dielectric layer/tunneling layer 220 and the substrate 210. In various embodiments, the dielectric material of the isolation features IF1, IF2 may include an oxide material and/or other suitable dielectric materials.

A first plurality of isolation features IF1 may be located in the memory region 212 and in the peripheral region 214. Each of the first plurality of isolation features IF1 may extend in a first horizontal direction HD1 that is perpendicular to the second horizontal direction HD2. Thus, the first plurality of isolation features IF1 may separate the memory region 212 and the peripheral region 214 into a plurality of active regions 232 and 234, respectively, extending along the first horizontal direction HD1. In some embodiments, the isolation features IF1 within the memory region 212 may have a bottom surface that is at a depth below a depth of the bottom surfaces of the isolation features IF1 within the peripheral region 214.

Referring again to FIG. 8, a second isolation feature IF2 may be located between the memory region 212 and the peripheral region 214 of the exemplary structure. As noted above with reference to FIG. 1, the peripheral edge of the second isolation feature IF2 adjacent to the memory region 212 may define the boundary 430 between the memory region 212 and the peripheral region 214. The second isolation feature IF2 may extend in the first horizontal direction HD1 that is perpendicular to the second horizontal direction HD2. In some embodiments, the second isolation feature IF2 may extend continuously around the entire memory region 212. As shown in FIG. 8, the upper surface of the substrate 210 may contact a first side of the second isolation feature IF2 in the peripheral region 214, and the upper surface of the substrate 210 may contact a second side of the second isolation feature IF2 in the memory region 212, where the upper surface of the substrate 210 in the memory region 212 may be vertically recessed relative to the upper surface of the substrate 210 in the peripheral region 214. The second isolation feature IF2 may have a lateral thickness (i.e., along HD2) that is greater than the lateral thicknesses of the first plurality of isolation features IF1.

Figure 9:
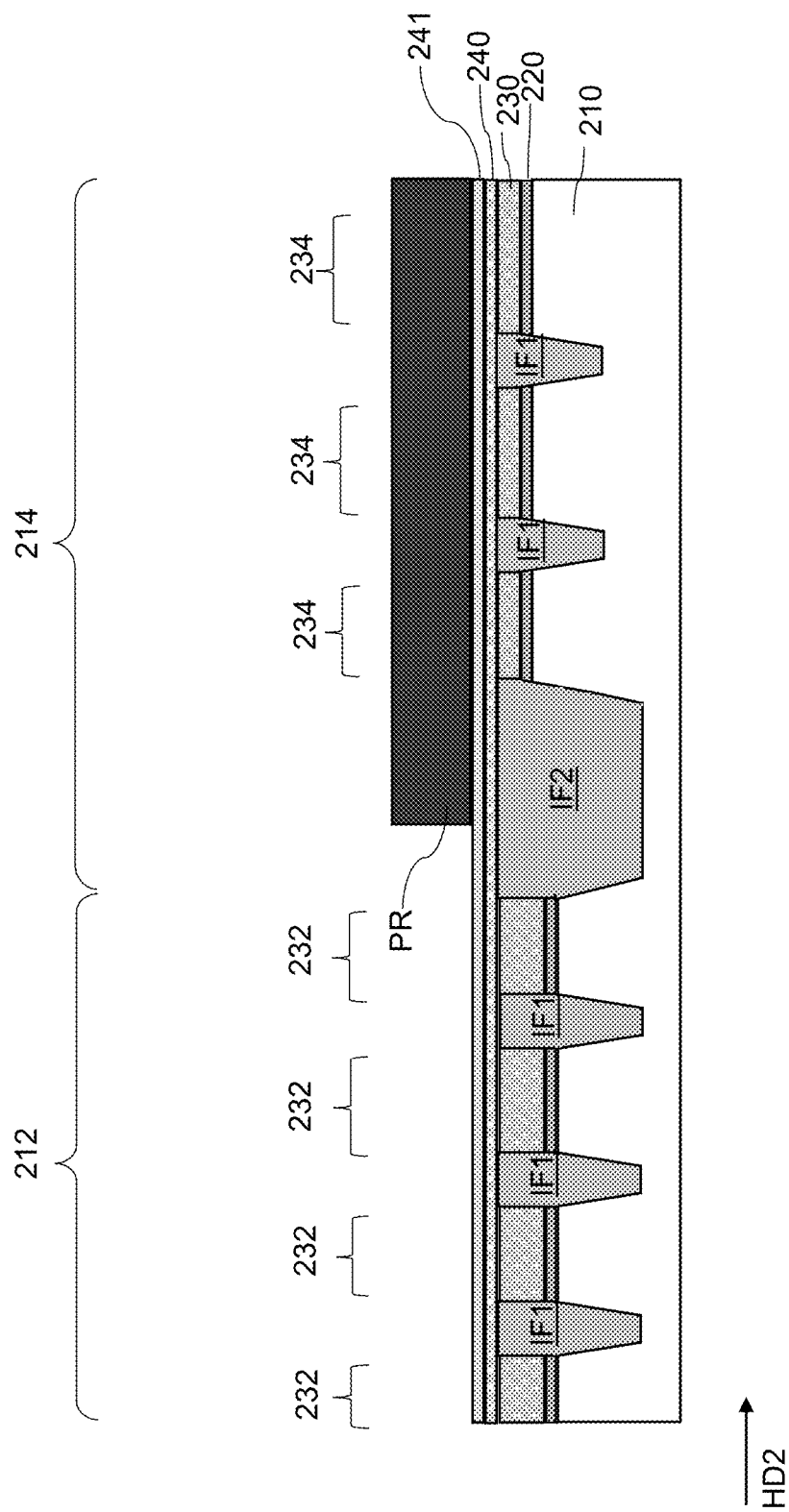
FIG. 9 is a vertical cross-section view of the exemplary intermediate structure showing a third dielectric material layer over the upper surfaces of the second dielectric layer and the isolation features, a fourth dielectric material layer over an upper surface of the third dielectric material layer, and a patterned mask over an upper surface of the fourth dielectric material layer according to various embodiments of the present disclosure.

FIG. 9 is a vertical cross-section view of the exemplary intermediate structure showing a third dielectric material layer 240 over the upper surfaces of the second dielectric layer 230 and the isolation features IF1, IF2, a fourth dielectric material layer 241 over an upper surface of the third dielectric material layer 240, and a patterned mask PR over an upper surface of the fourth dielectric material layer 241. Referring to FIG. 9, the third dielectric material layer 240 may be composed of the same dielectric material as the second dielectric material layer 230. In various embodiments, the third dielectric material layer 240 may be composed of silicon nitride. The fourth dielectric material layer 241 may be formed over the upper surface of the third dielectric material layer 240. The fourth dielectric material layer 241 may be composed of a different dielectric material than the material of the third dielectric material layer 240. In some embodiments, the fourth dielectric material layer 241 may be composed of an oxide material (e.g., silicon oxide), such as resist protective oxide (RPO) material. The third dielectric material layer 240 and fourth dielectric material layer 241 may be deposited using a suitable deposition method as described above.

Referring again to FIG. 9, a patterned mask, such as a photoresist mask PR may be formed over the fourth dielectric layer 241 in the peripheral region 214 of the intermediate structure. The patterned mask may be formed by depositing a layer of photoresist material over the fourth dielectric layer 241 and lithographically patterning the photoresist material to form a patterned mask PR covering the fourth dielectric layer 241 in the peripheral region 214 of the intermediate structure. As shown in FIG. 9, the edge of the mask PR may be located over the upper surface of the second isolation feature IF2.

Figure 10:
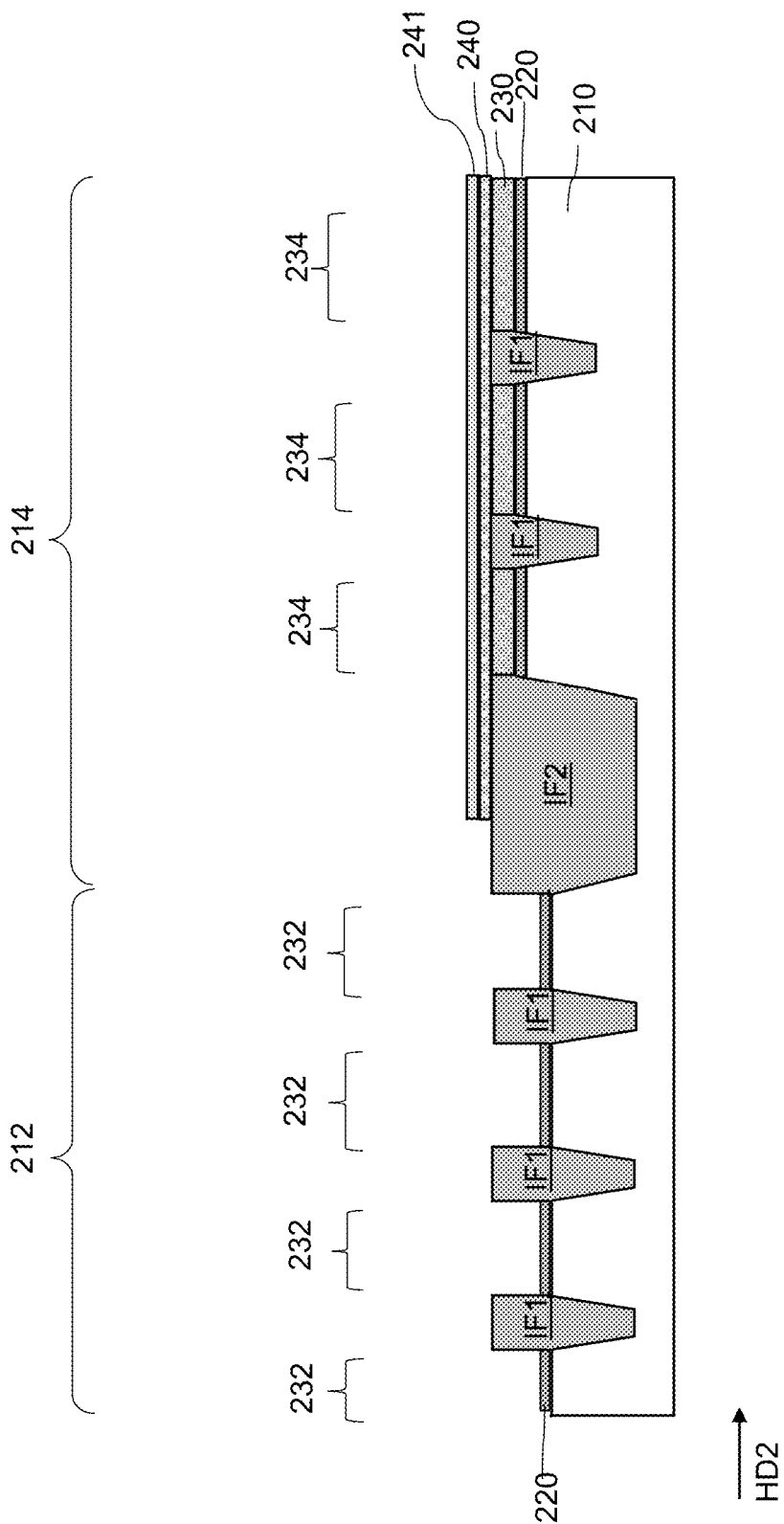
FIG. 10 is a vertical cross-section view of the exemplary intermediate structure following an etching process that removes portions of the fourth dielectric layer, the third dielectric layer and the second dielectric layer from the memory region and exposes isolation features and the upper surface of the tunneling layer in the memory region according to various embodiments of the present disclosure.

FIG. 10 is a vertical cross-section view of the exemplary intermediate structure following an etching process that removes portions of the fourth dielectric layer 241, the third dielectric layer 240 and the second dielectric layer 230 from the memory region 212 and exposes isolation features IF1, IF2 and the upper surface of the tunneling layer 220 in the memory region 212 of the exemplary structure. Referring to FIG. 10, the exemplary structure may be etched through the patterned mask PR to remove the portions of the fourth dielectric layer 241, the third dielectric layer 240 and the second dielectric layer 230 that are exposed through the mask. The etching process may stop at the tunneling layer 220. The etching process may be a selective etching process that preferentially etches the materials of the fourth dielectric layer 241, the third dielectric layer 240 and the second dielectric layer 230 relative to the materials of the isolation features IF1, IF2 and the tunneling layer 220. In one non-limiting example, the etching process may include a first etching step that removes the fourth dielectric layer 241, which may be an oxide material, followed by a second etching step that preferentially etches the material of the second and third dielectric material layers 230, 240, which may be nitride materials, relative to the material of the tunneling layer 220 and the isolation features IF1, IF2, which may be composed of oxide materials. Following the etching process, the first isolation features IF1 may protrude above the upper surface of the tunneling layer 220, as shown in FIG. 10. In addition, the etching process may additionally remove portions of layers 240 and 241 exposed through the patterned mask PR from above the second isolation feature IF2. Thus, portions of the upper surface and lateral side surface of the second isolation feature IF2 may be exposed following the etching process, as shown in FIG. 10. Following the etching process, the patterned mask PR may be removed using a suitable process, such as by ashing or dissolution using a solvent.

Figure 11:
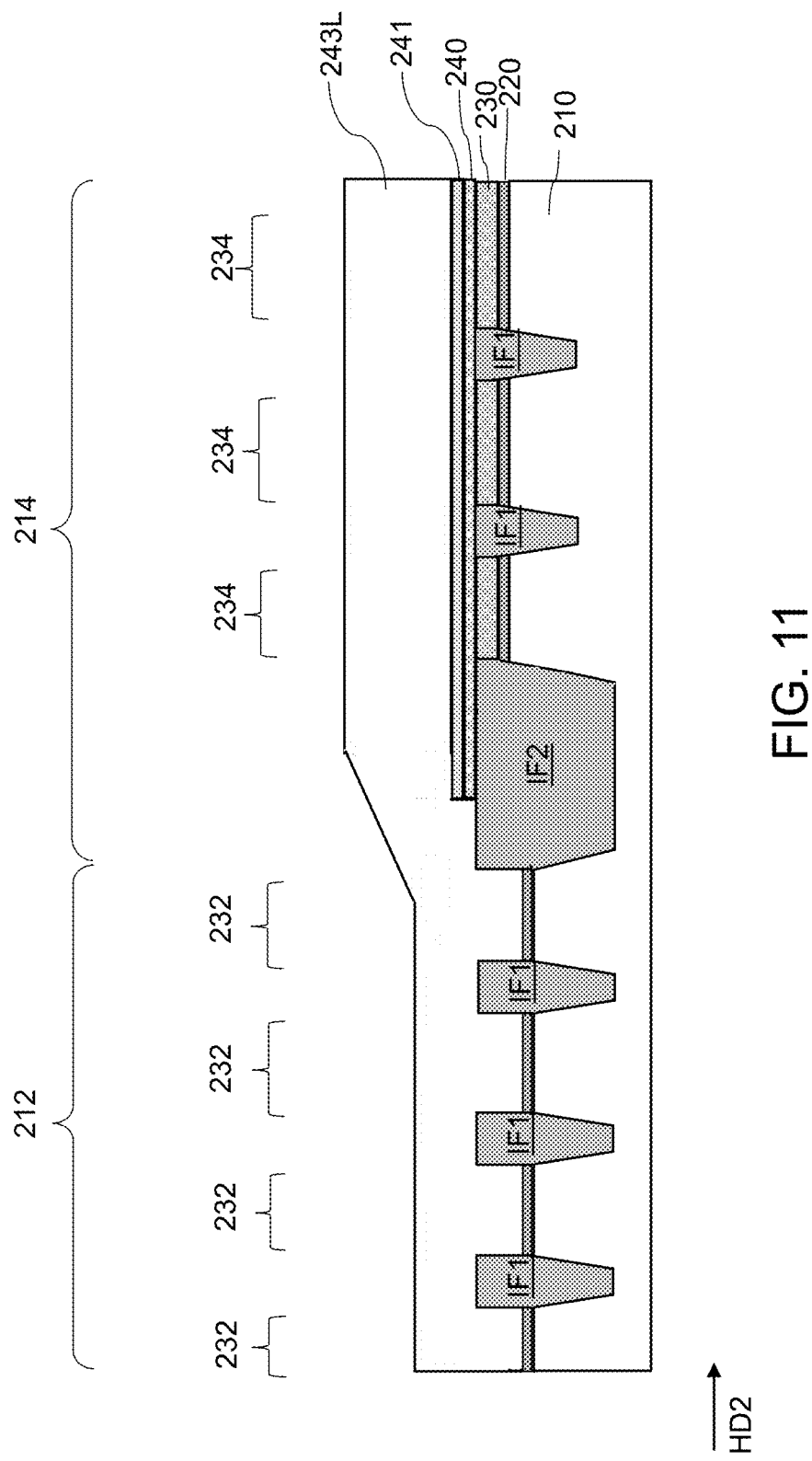
FIG. 11 is a vertical cross-section view of the exemplary intermediate structure showing a continuous floating gate layer over the tunneling layer and the first isolation features in the memory region, and over the fourth dielectric layer and the second isolation feature in the peripheral region according to various embodiments of the present disclosure.

FIG. 11 is a vertical cross-section view of the exemplary intermediate structure showing a continuous floating gate layer 243L over the tunneling layer 220 and the first isolation features IF1 in the memory region 212, and over the fourth dielectric layer 241 and the second isolation feature IF2 in the peripheral region 214. Referring to FIG. 11, in some embodiments, the continuous floating gate layer 243L may be composed of a semiconductor material, such as polysilicon. In other embodiments, the continuous floating gate layer 243L may include metal, metal alloys, single crystalline silicon, or combinations thereof. Other suitable materials for the continuous floating gate layer 243L are within the contemplated scope of disclosure. The continuous floating gate layer 243L may be deposited using a suitable deposition method as described above.

Figure 12:
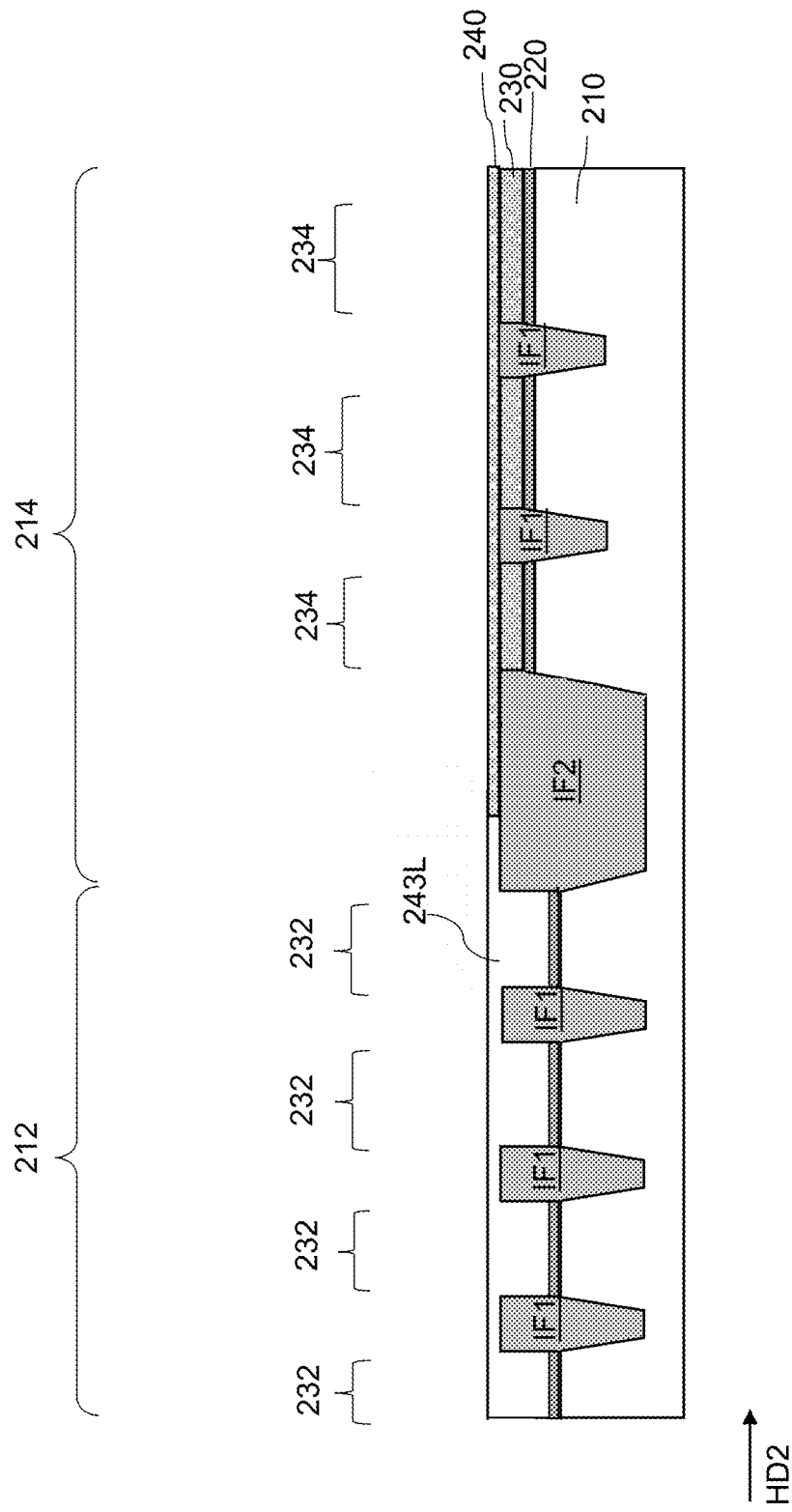
FIG. 12 is a vertical cross-section view of the exemplary intermediate structure following a planarization process to remove portions of the floating gate layer and the fourth dielectric material layer from over an upper surface of the third dielectric material layer according to various embodiments of the present disclosure.

FIG. 12 is a vertical cross-section view of the exemplary intermediate structure following a planarization process to remove portions of the floating gate layer 243L and the fourth dielectric material layer 241 from over an upper surface of the third dielectric material layer 240. Referring to FIG. 12, the exemplary structure may be subjected to a planarization process, such as a chemical mechanical planarization (CMP) process. The planarization process may remove portions of the floating gate layer 243L. The planarization may also remove the remaining portion of the fourth dielectric material layer 241 to expose the upper surface of the third dielectric material layer 240 in the peripheral region 214. Following the planarization process, the exemplary intermediate structure may include a planar top surface formed by the upper surface of the continuous floating gate layer 243L in the memory region 212 and the upper surface of the third dielectric material layer 240 in the peripheral region 214 of the exemplary structure.

Figure 13:
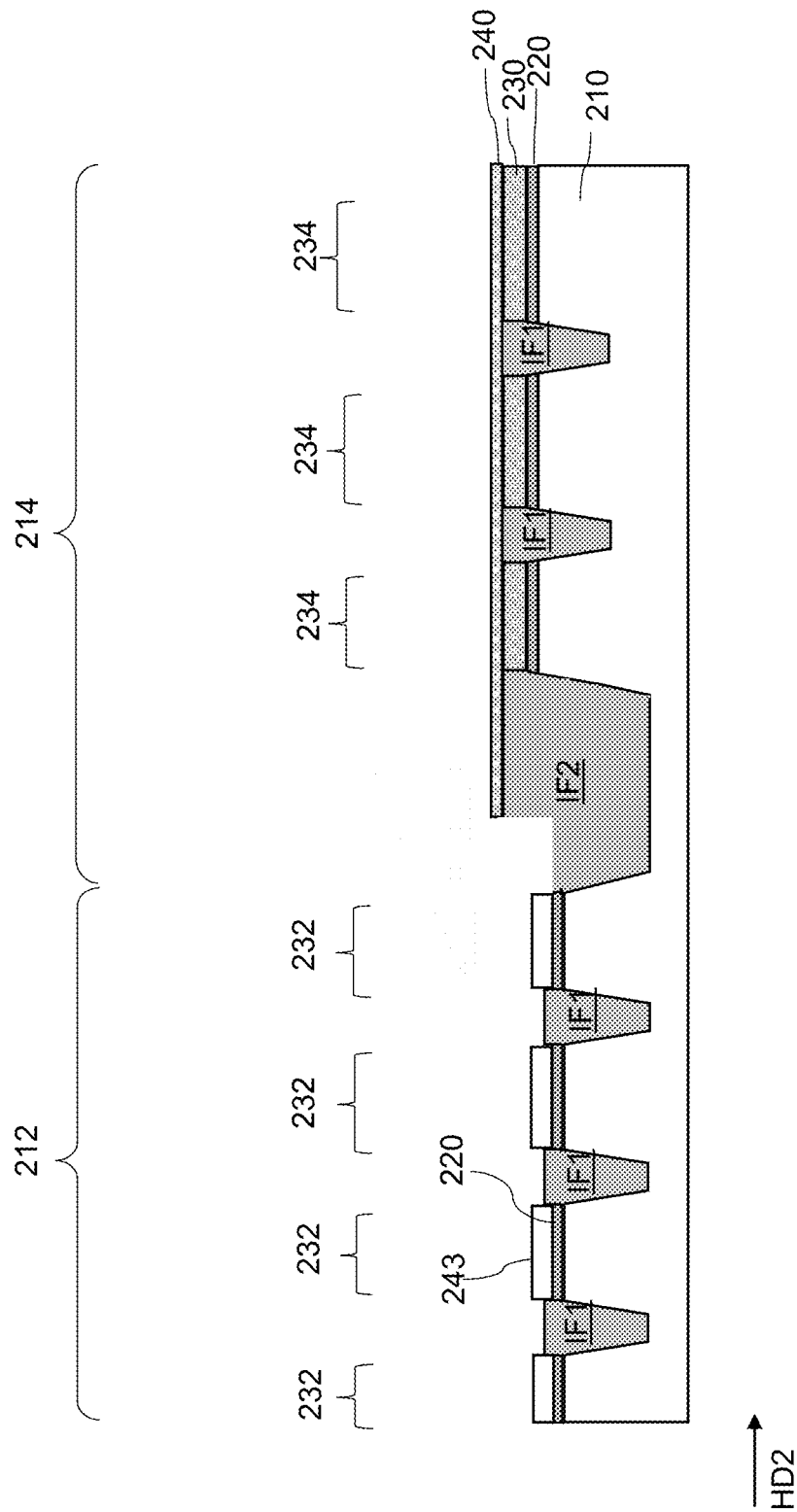
FIG. 13 is a vertical cross-section view of the exemplary intermediate structure following an etching process that recesses the floating gate layer and the first isolation features in the memory region according to various embodiments of the present disclosure.

FIG. 13 is a vertical cross-section view of the exemplary intermediate structure following an etching process that recesses the floating gate layer 243 and the first isolation features IF1 in the memory region 212. Referring to FIG. 13, the exemplary structure may be subjected to an etching process that removes the floating gate layer 243 from over the upper surfaces of the isolation features IF1, IF2 and recesses the height of the floating gate layer 243 within the memory region 212. The etching process may also remove portions of the isolation features IF1 and IF2. In embodiments, the first isolation features IF1 may be etched at a higher etch rate than the floating gate layer 243, such that following the etching process, the upper surface of the floating gate layer 243 may be above the upper surfaces of the first isolation features IF1 in the memory region 212. The etching process may also remove a portion of the second isolation feature IF2 such that an upper surface of the second isolation feature IF2 adjacent to the memory region 212 may be substantially co-planar with the upper surfaces of the first isolation features IF1 and may be below the upper surface of the floating gate layer 243.

Referring again to FIG. 13, following the etching process, the floating gate layer 243 may include a plurality of discrete floating gate layers 243 separated by first isolation features IF1 within the memory region 212. Each of the discrete floating gate layers 243 may be located within an active region 232 of the memory region 212, and may extend continuously along the first horizontal direction HD1 (i.e., into and out of the page in FIG. 13). In each of the active regions 232, a tunneling layer 220 may be located between the floating gate layer 243 and the upper surface of the substrate 210.

Figure 14:
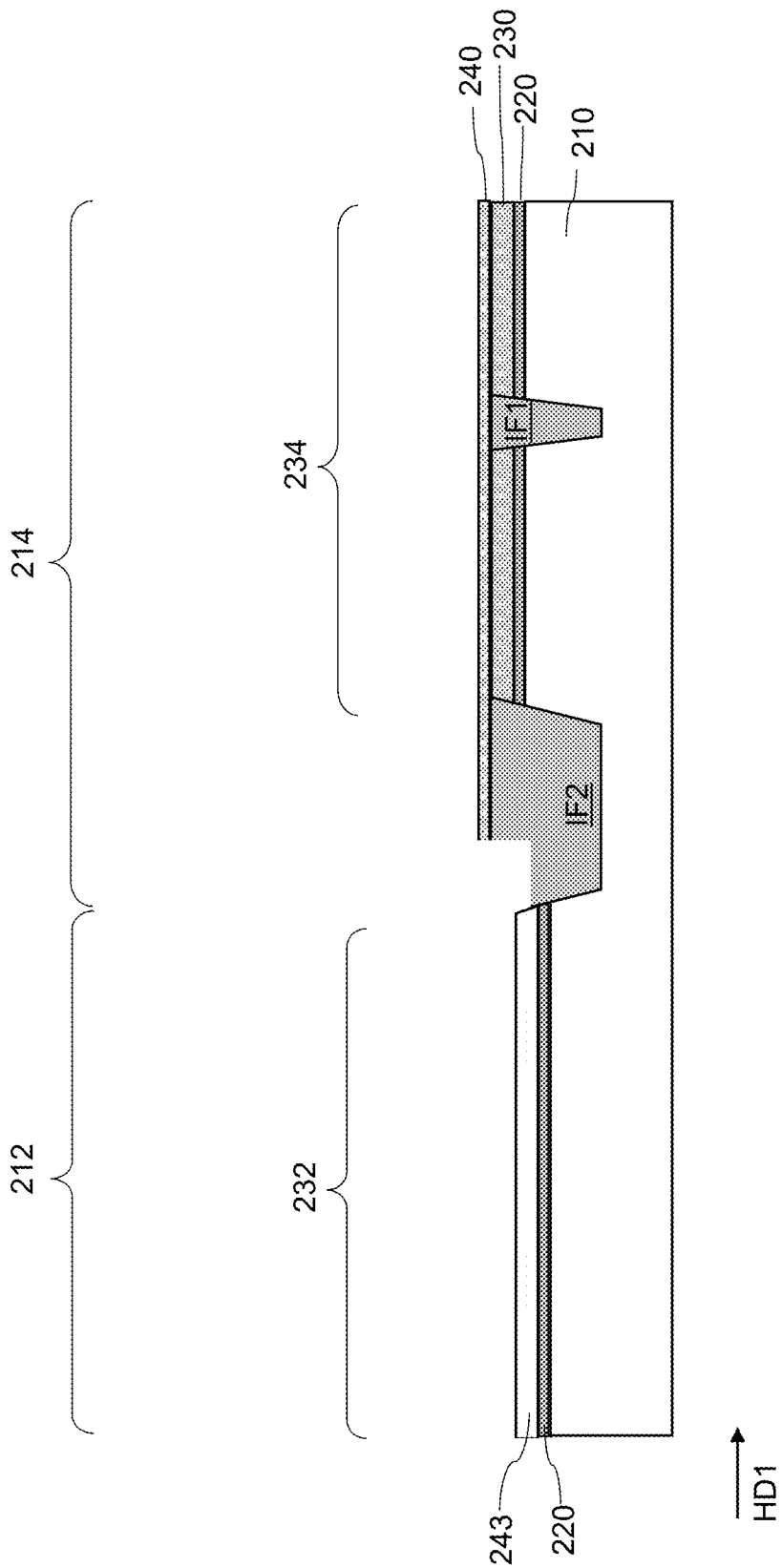
FIG. 14 is a vertical cross-section view of the exemplary intermediate structure of FIG. 13 shown along a horizontal direction that is rotated 90° relative to the orientation shown in FIGS. 2-13.

FIG. 14 is a vertical cross-section view of the exemplary intermediate structure of FIG. 13 shown along horizontal direction HD1. Thus, the cross-section view of the intermediate structure shown in FIG. 14 is rotated 90° relative to the orientation shown in FIGS. 2-13. Referring to FIG. 14, an active region 232 of the memory region 212 is shown, including a tunneling layer 220 over the upper surface of the substrate 210 and a floating gate layer 243 over the tunneling layer 220. FIG. 14 also shows an active region 234 of the peripheral region 214 of the intermediate structure. Active regions 232 and 234 may be separated by a second isolation feature, IF2. In some embodiments, the active region 234 of the peripheral region may include one or more first isolation features, IF1. The one or more first isolation features IF1 may be located between portions of the active region 234 on which logic transistors may be subsequently formed.

Figure 15:
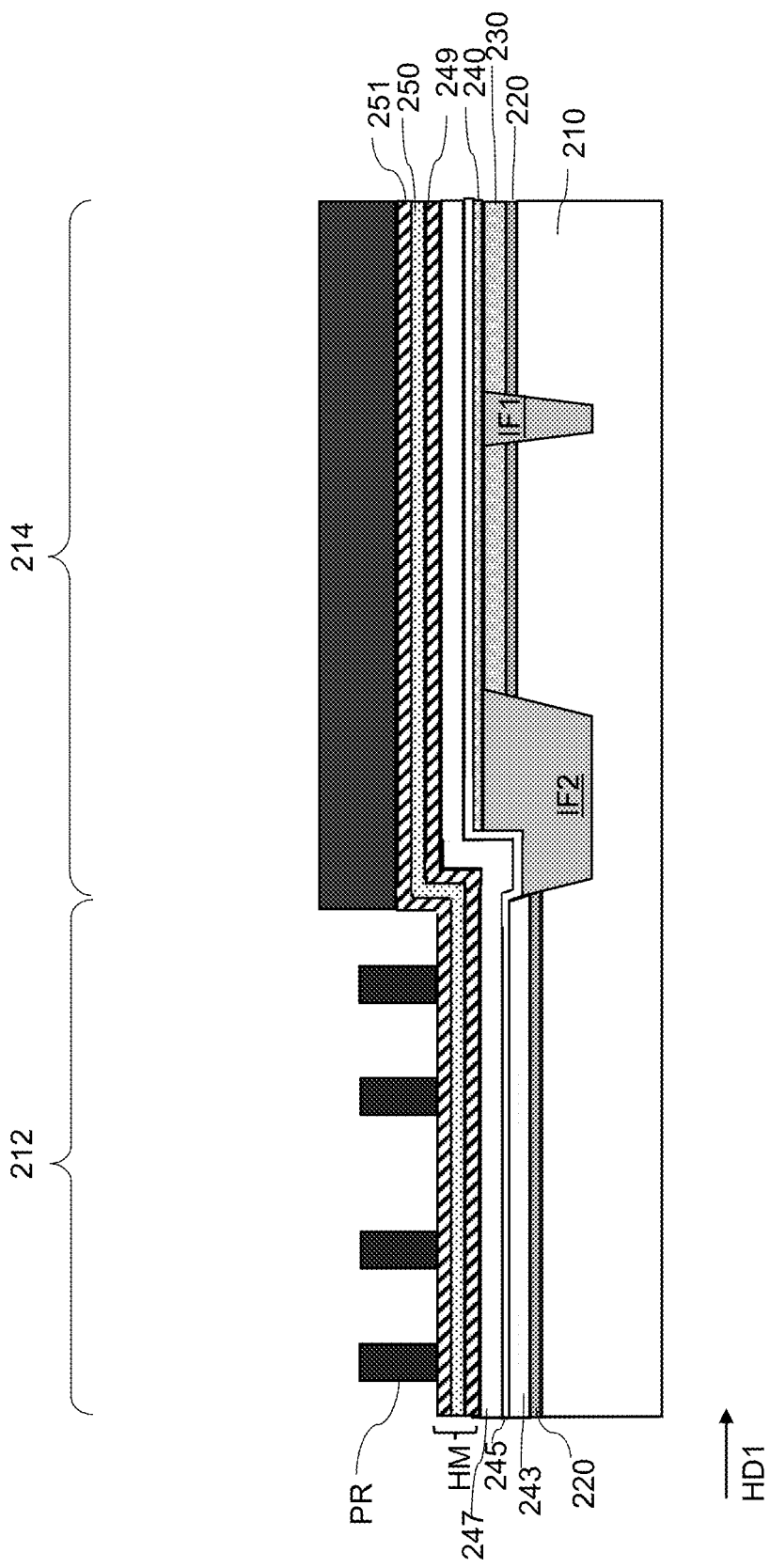
FIG. 15 is a vertical cross-section view of the exemplary intermediate structure showing a blocking layer, a control gate layer, a hard mask, and a patterned mask formed over the memory region and the peripheral region according to various embodiments of the present disclosure.

FIG. 15 is a vertical cross-section view of the exemplary intermediate structure showing a blocking layer 245, a control gate layer 247, a hard mask HM, and a patterned mask PR formed over the memory region 212 and the peripheral region 214 of the exemplary structure. Referring to FIG. 15, the blocking layer 245 may be conformally deposited over the third dielectric layer 240 in the peripheral region 214 and over the floating gate layer 243 in the memory region 212. The blocking layer 245 may also be deposited over the side surface and upper surface of the second isolation feature IF2.

In some embodiments, the blocking layer 245 and the tunneling layer 220 may be formed of the same material. In other embodiments, the blocking layer 245 and the tunneling layer 220 may be formed of different materials. That is, the blocking layer 245 may include, for example, a dielectric material such as silicon dioxide (SiO2), silicon nitride (Si3N4), silicon oxynitride (SiON), high-k materials, other non-conductive materials, or combinations thereof. In some embodiments, the blocking layer 245 may be composed of a multi-layer structure that may include different dielectric materials. Other suitable dielectric materials are within the contemplated scope of disclosure.

Referring again to FIG. 15, the control gate layer 247 may be conformally deposited over the blocking layer 245. In some embodiments, the control gate layer 247 may be composed of a semiconductor material, such as polysilicon. In other embodiments, the control gate layer 247 may include metal, metal alloys, single crystalline silicon, or combinations thereof. Other suitable materials for the control gate layer 247 are within the contemplated scope of disclosure.

Referring again to FIG. 15, the hard mask HM may be conformally deposited over the control gate layer 247. In various embodiments, the hard mask HM may include a multi-layer structure including different dielectric material layers. In one non-limiting example, the hard mask HM may include a nitride-oxide-nitride ("NON") structure and may include a layer 249 of nitride material (e.g., silicon nitride) deposited over the control gate layer 247, a layer 250 of oxide material (e.g., silicon oxide) deposited over nitride layer 249, and another layer 251 of nitride material (e.g., silicon nitride) deposited over the oxide layer 250.

Referring again to FIG. 15, a patterned mask, such as a photoresist mask PR may be formed over the hard mask HM in the memory region 212 and in the peripheral region 214 of the intermediate structure. The patterned mask PR may be formed by depositing a layer of photoresist material over the fourth dielectric layer 241 and lithographically patterning the photoresist material to form a patterned mask PR. In embodiments, the patterned mask PR may cover the entirety of the peripheral region 214 of the intermediate structure. The patterned mask PR may cover portions of the memory region 212 that may correspond to the locations of memory cells that may be subsequently formed.

Figure 16:
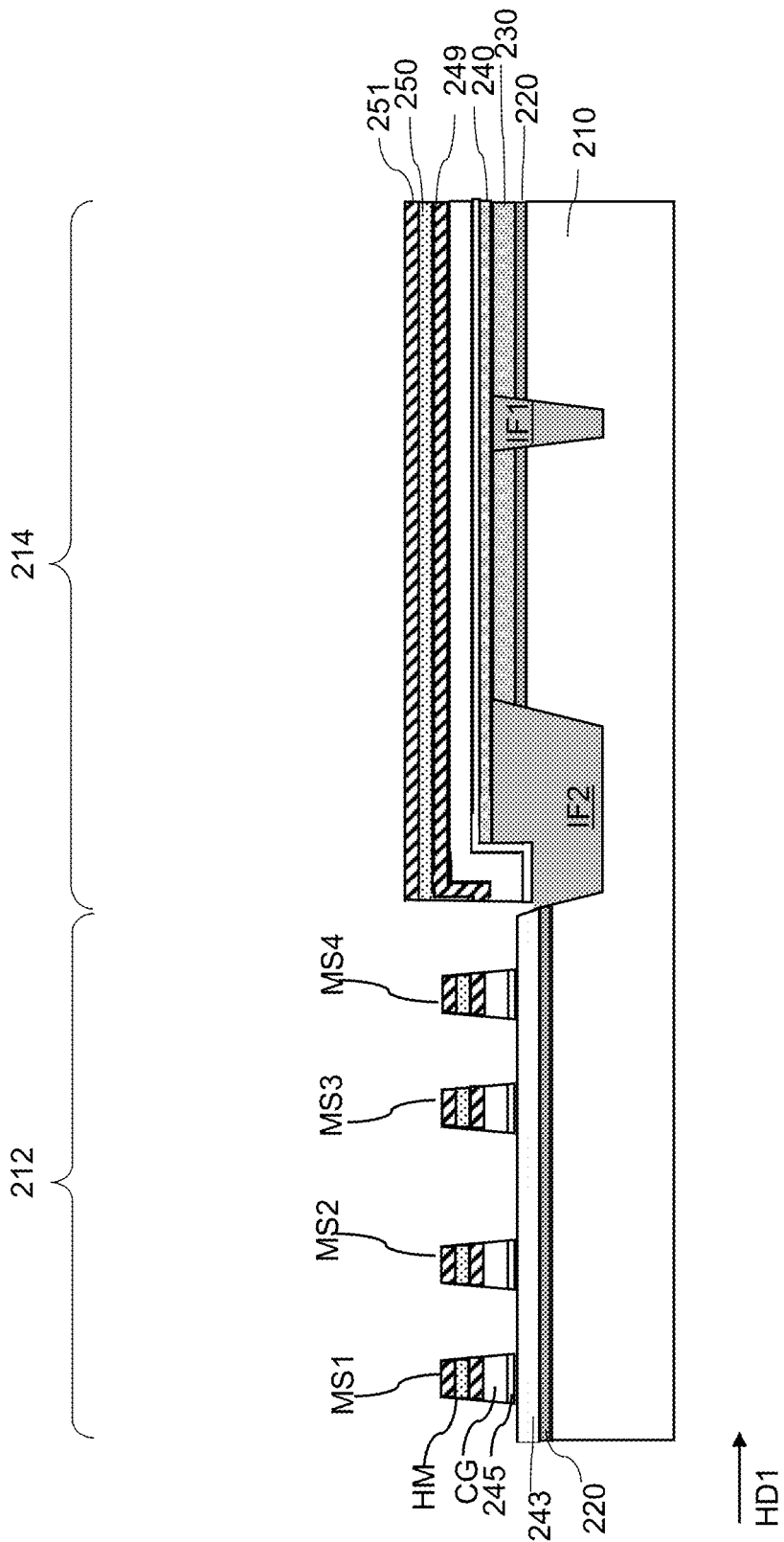
FIG. 16 is a vertical cross-section view of the exemplary intermediate structure showing a plurality of memory stacks over the floating gate layer in the memory region according to various embodiments of the present disclosure.

FIG. 16 is a vertical cross-section view of the exemplary intermediate structure showing a plurality of memory stacks MS1, MS2, MS3, MS4 over the floating gate layer 243 in the memory region 212 of the intermediate structure. Referring to FIG. 16, an anisotropic etching process may be performed to remove portions of the hard mask HM, the control gate layer 247 and the blocking layer 245 that are exposed through the patterned mask PR. The etching process may stop at the floating gate layer 243. Following the etching process, a plurality of memory stacks MS1-MS4 may be located over the floating gate layer 243 in the memory region 212. Each memory stack MS1-MS4 may include a blocking layer 245 over the floating gate layer 243, a control gate CG over the blocking layer 245, and a hard mask HM over the control gate CG. Following the etching process, the patterned mask PR may be removed using a suitable process, such as by ashing or dissolution using a solvent.

Figure 17:
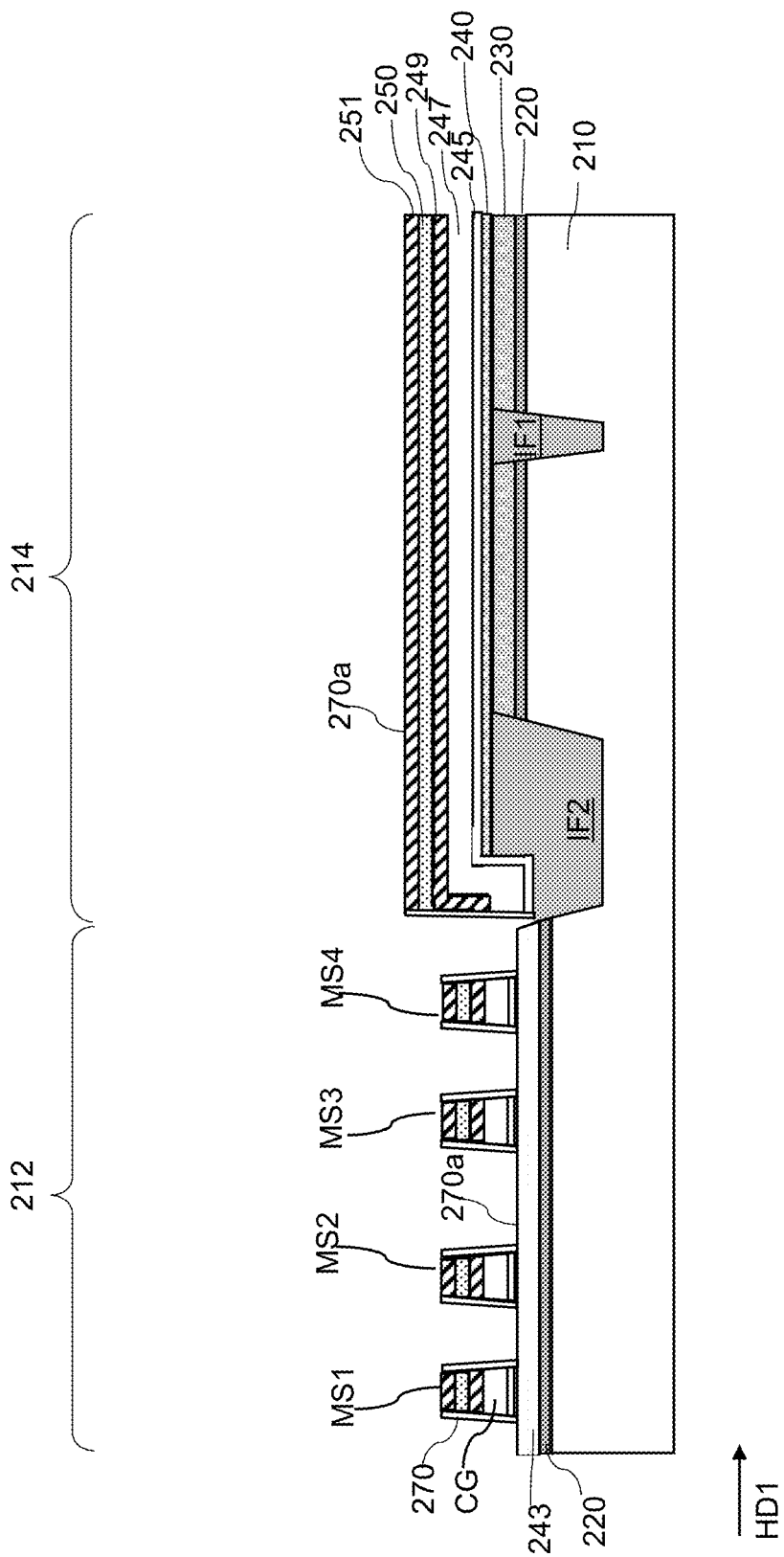
FIG. 17 is a vertical cross-section view of the exemplary intermediate structure showing sidewall structures formed over the side surfaces of the memory stacks according to various embodiments of the present disclosure.

FIG. 17 is a vertical cross-section view of the exemplary intermediate structure showing sidewall structures 270 formed over the side surfaces of the memory stacks MS1-MS4. Referring to FIG. 17, the sidewall structures 270 may include one or more dielectric materials over the exposed side surfaces of the hard mask HM, control gate CG, and blocking layer 245 in each of the memory stacks MS1-MS4. In some embodiments, the sidewall structures 270 may include a multi-layer structure including different dielectric material layers. In one non-limiting example, the sidewall structures 270 may include and oxide-nitride-oxide ("ONO") structure that includes a first oxide layer, a nitride layer over the first oxide layer, and a second oxide layer over the nitride layer. In embodiments, the sidewall structures 270 may be formed by conformally depositing layer(s) of dielectric material, such as ONO layers, over the intermediate structure, including over the upper surface and side surfaces of the memory stacks MS1-MS4, over the upper surface of the floating gate layer 243 in the memory region 212, over the exposed side surfaces of layers 240, 245, 247, 249, 250 and 251 and over the upper surface of the hard mask HM in the peripheral region 214. In some embodiments, an anisotropic etch process, such as a reactive ion etch process, may be used to remove horizontally-extending portions of the dielectric material layer(s) while leaving sidewall structures 270 over vertically-extending surfaces. In some embodiments, the sidewall structures 270 may have include ONO layers, and the anisotropic etch process may remove the second oxide layer and the nitride layer of the ONO layers from over horizontally-extending surfaces, and may leave the first oxide layer 270a of the ONO layers over horizontally-extending surfaces of the intermediate structure.

Figure 18:
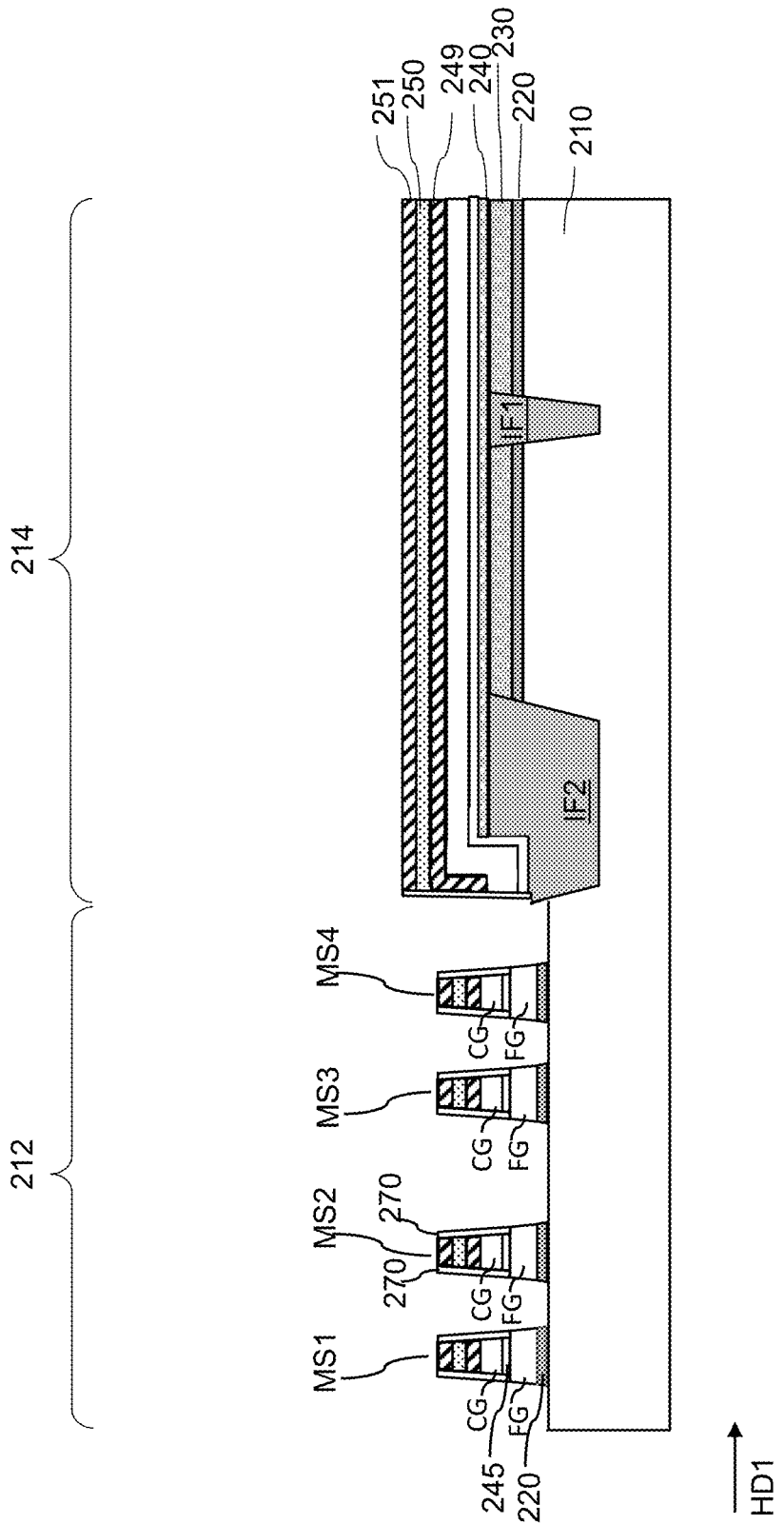
FIG. 18 is a vertical cross-section view of the exemplary intermediate structure following an etching process to remove portions of the floating gate layer and the tunneling layer from the memory region according to various embodiments of the present disclosure.

FIG. 18 is a vertical cross-section view of the exemplary intermediate structure following an etching process to remove portions of the floating gate layer 243 and the tunneling layer 220 from the memory region 212 of the intermediate structure. Referring to FIG. 18, an anisotropic etch process may be used to remove the floating gate layer 243 and the tunneling layer 220 between the respective memory stacks MS1-MS4. The etching process may also remove the first oxide layer 270a from over horizontally-extending surfaces of the intermediate structure. Portions of the floating gate layer 243 and the tunneling layer 220 located under the memory stacks MS1-MS4 may be protected from etching by the memory stacks MS1-MS4 in a self-aligned etching process. Following the etching process, each of the memory stacks MS1-MS4 in the memory region 212 may include a tunneling layer 220 over the substrate 210, a floating gate FG over the tunneling layer 220, a blocking layer 245 over the floating gate FG, a control gate CG over the blocking layer 245, and a hard mask HM over the control gate CG. Sidewall structures 270 may extend over the side surfaces of the hard mask HM, the control gate CG and the blocking layer 245, and may contact an upper surface of the floating gate FG.

Figure 19:
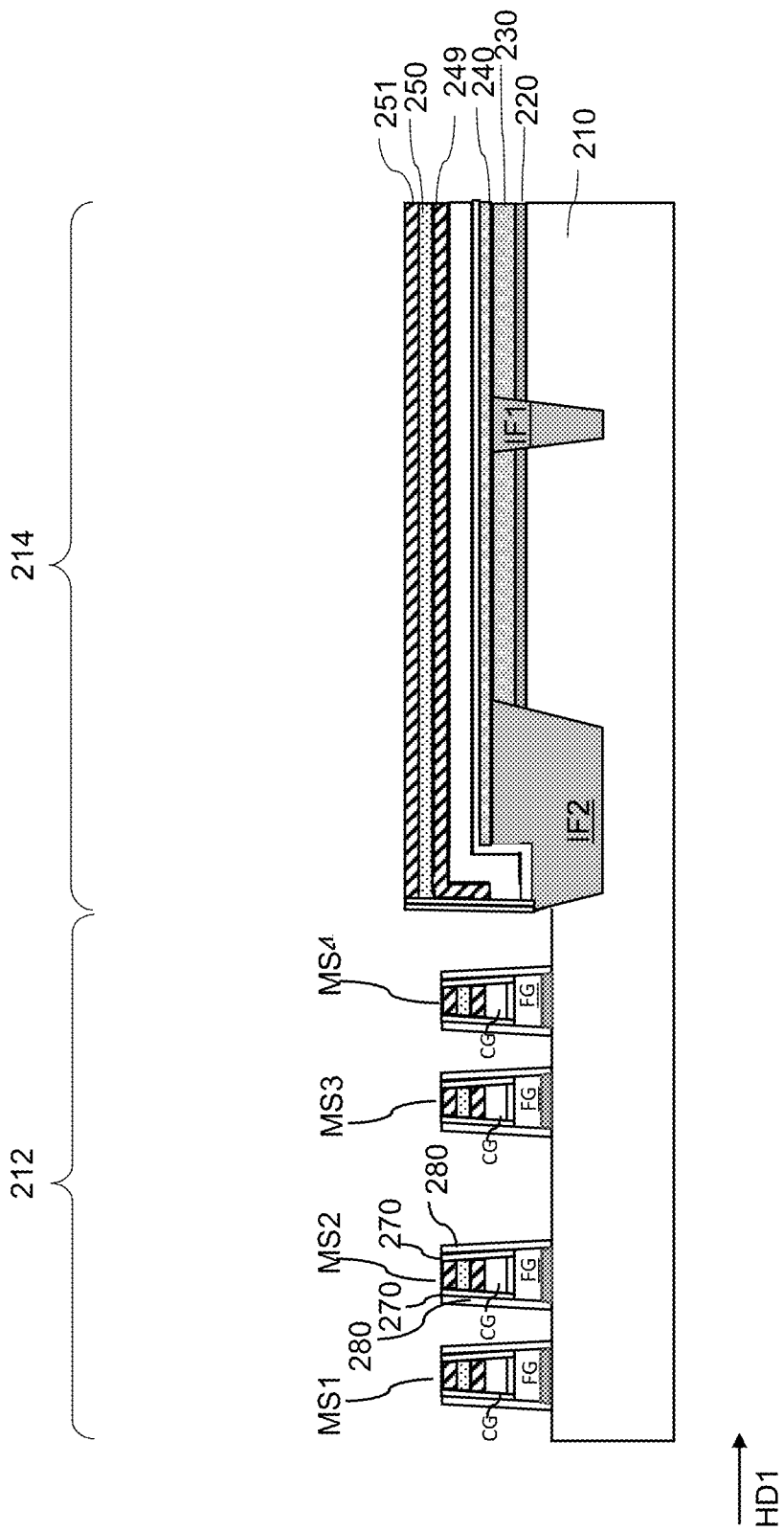
FIG. 19 is a vertical cross-section view of the exemplary intermediate structure showing inter-gate dielectric layers formed over the side surfaces of the memory stacks according to various embodiments of the present disclosure.

FIG. 19 is a vertical cross-section view of the exemplary intermediate structure showing inter-gate dielectric layers 280 formed over the side surfaces of the memory stacks MS1-MS4. Referring to FIG. 19, the inter-gate dielectric layers 280 may include one or more dielectric materials over the sidewall structures 270 and over the exposed side surfaces of the floating gate FG and tunneling layer 220 in each of the memory stacks MS1-MS4. In some embodiments, the inter-gate dielectric layers 280 may be composed of an oxide material, such as a high-temperature oxide (HTO). Other suitable dielectric materials, including oxides, nitrides, multi-layer structures (e.g., ONO structures), and combinations thereof, are within the contemplated scope of disclosure.

In various embodiments, the inter-gate dielectric layers 280 may be formed in a similar manner as described above with respect to the sidewall structures 270. In particular, a continuous inter-gate dielectric layer 280 may be conformally deposited over the intermediate structure, and an anisotropic etch process may be used to remove horizontally-extending portions of the inter-gate dielectric layer 280. Following the etching process, the inter-gate dielectric layer 280 may remain over vertically-extending surfaces, including the side surfaces of the memory stacks MS1-MS4.

Figure 20:
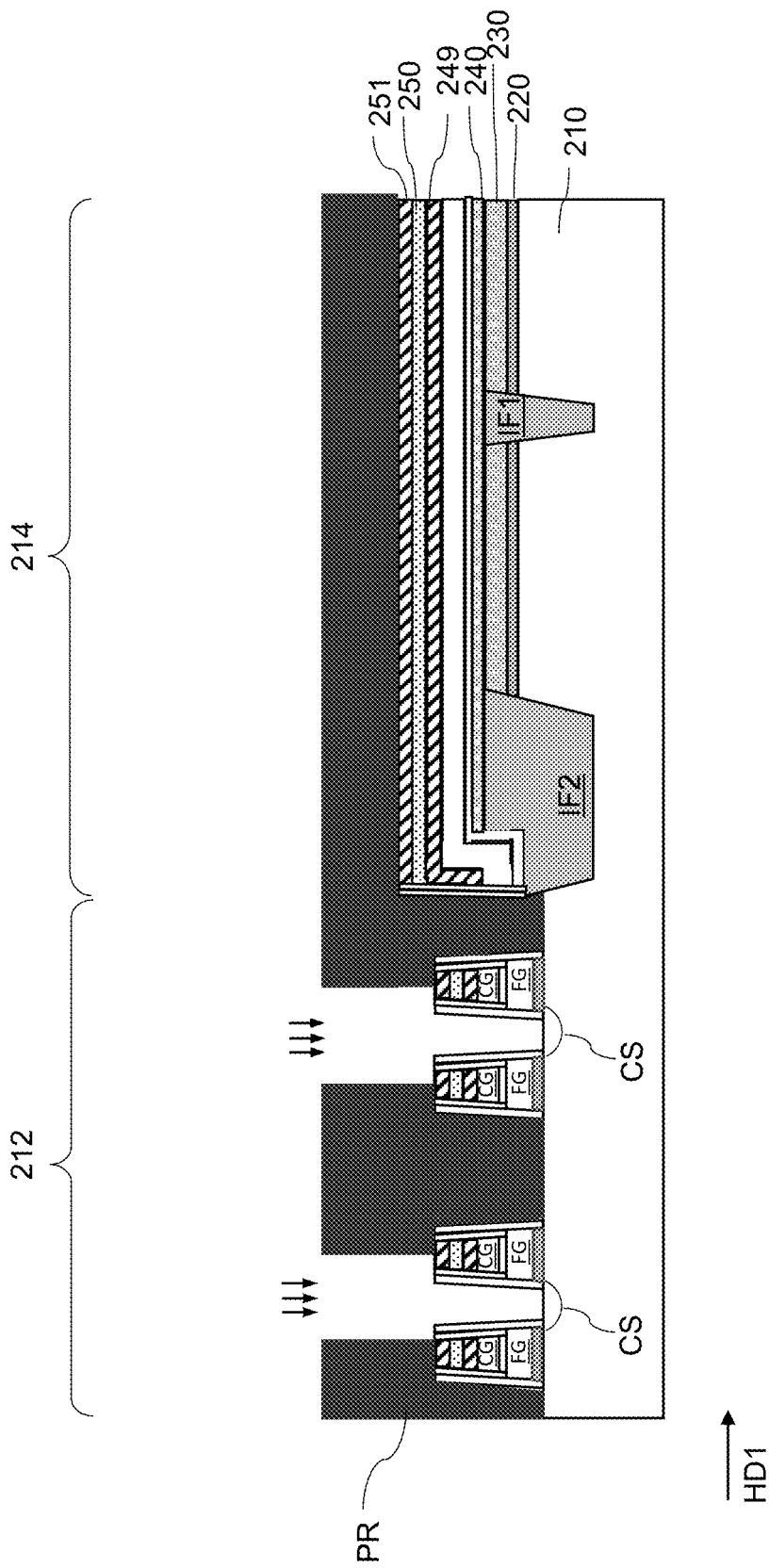
FIG. 20 is a vertical cross-section view of the exemplary intermediate structure showing common source regions formed between adjacent pairs of memory stacks via a masked implantation process according to various embodiments of the present disclosure.

FIG. 20 is a vertical cross-section view of the exemplary intermediate structure showing common source regions CR formed between adjacent pairs of memory stacks via a masked implantation process. Referring to FIG. 20, a patterned mask, such as a photoresist mask PR may be formed over the memory region 212 and the peripheral region 214 of the intermediate structure. The patterned mask may be formed by depositing a layer of photoresist material over the intermediate structure and lithographically patterning the photoresist material to form a patterned mask PR. The patterned mask may include openings that expose portions of the substrate 210 between pairs of adjacent memory stacks MS1-MS4 within the memory region 212. An ion implantation process may be performed through the patterned mask PR to form common source regions CR in the substrate 210 between the pairs of adjacent memory stacks MS1-MS4.

Figure 21:
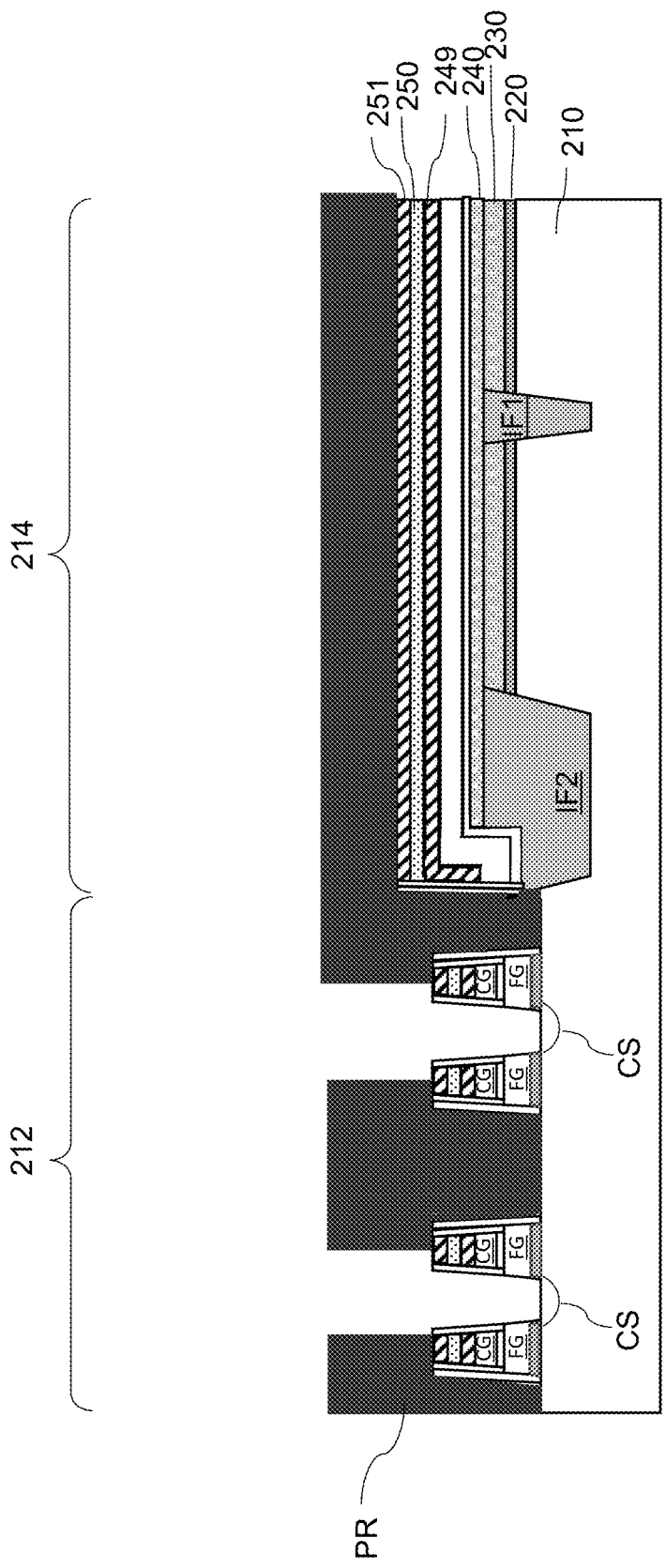
FIG. 21 is a vertical cross-section view of the exemplary intermediate structure showing the inter-gate dielectric layers removed from the side surfaces of the memory stacks adjacent to the common source regions according to various embodiments of the present disclosure.

FIG. 21 is a vertical cross-section view of the exemplary intermediate structure showing the inter-gate dielectric layers 280 removed from the side surfaces of the memory stacks MS1-MS4 adjacent to the common source regions CR. Referring to FIG. 21, an etching process may be used to remove the inter-gate dielectric layers 280 that are adjacent to the common source regions CR from along the side surfaces of the memory stacks MS1-MS4. The inter-gate dielectric layers 280 that are not adjacent to the common source regions CR may remain on the side surfaces of the memory stacks MS1-MS4.

Figure 22:
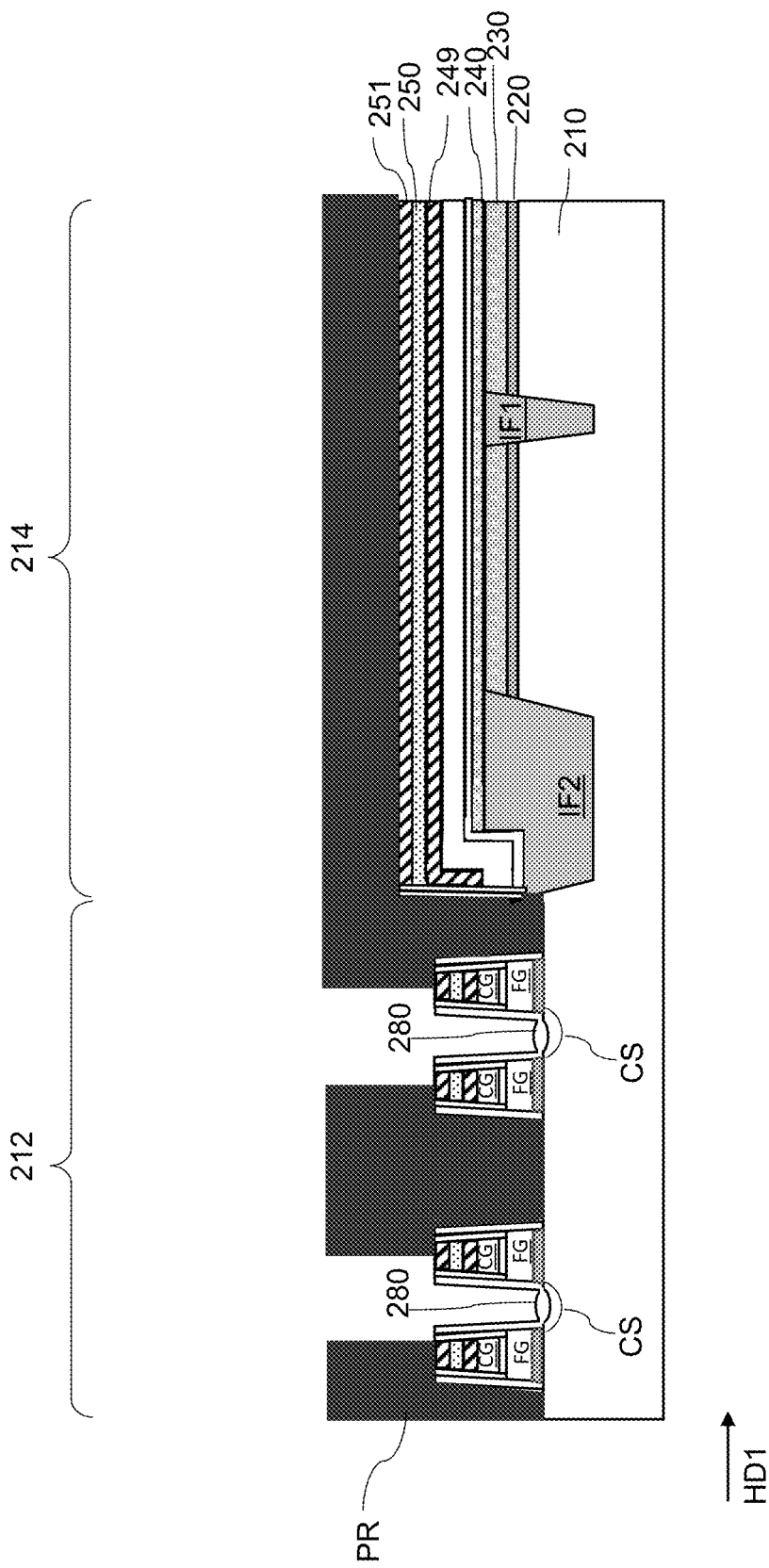
FIG. 22 is a vertical cross-section view of the exemplary intermediate structure showing common source dielectric layers over the common source regions and over the side surfaces of the memory stacks according to various embodiments of the present disclosure.

FIG. 22 is a vertical cross-section view of the exemplary intermediate structure showing common source dielectric layers 280 over the common source regions CR and over the side surfaces of the memory stacks MS1-MS4. Referring to FIG. 22, the common source dielectric layers 280 may be composed of a suitable dielectric material, such as an oxide material (e.g., silicon oxide). The common source dielectric layers 280 may be formed over the common source regions CS using, for example, surface oxidation, CVD, other suitable deposition techniques, or the like. In some embodiments, formation of the common source dielectric layer 280 may include depositing a layer dielectric material and etching portions of the dielectric layer not located between the memory stacks MS1, MS2 or MS3, MS4 such that the remaining portion of the dielectric layer forms the common source dielectric layer 280 over the common source region CS and over the side surfaces of the memory stacks MS1-MS4.

Figure 23:
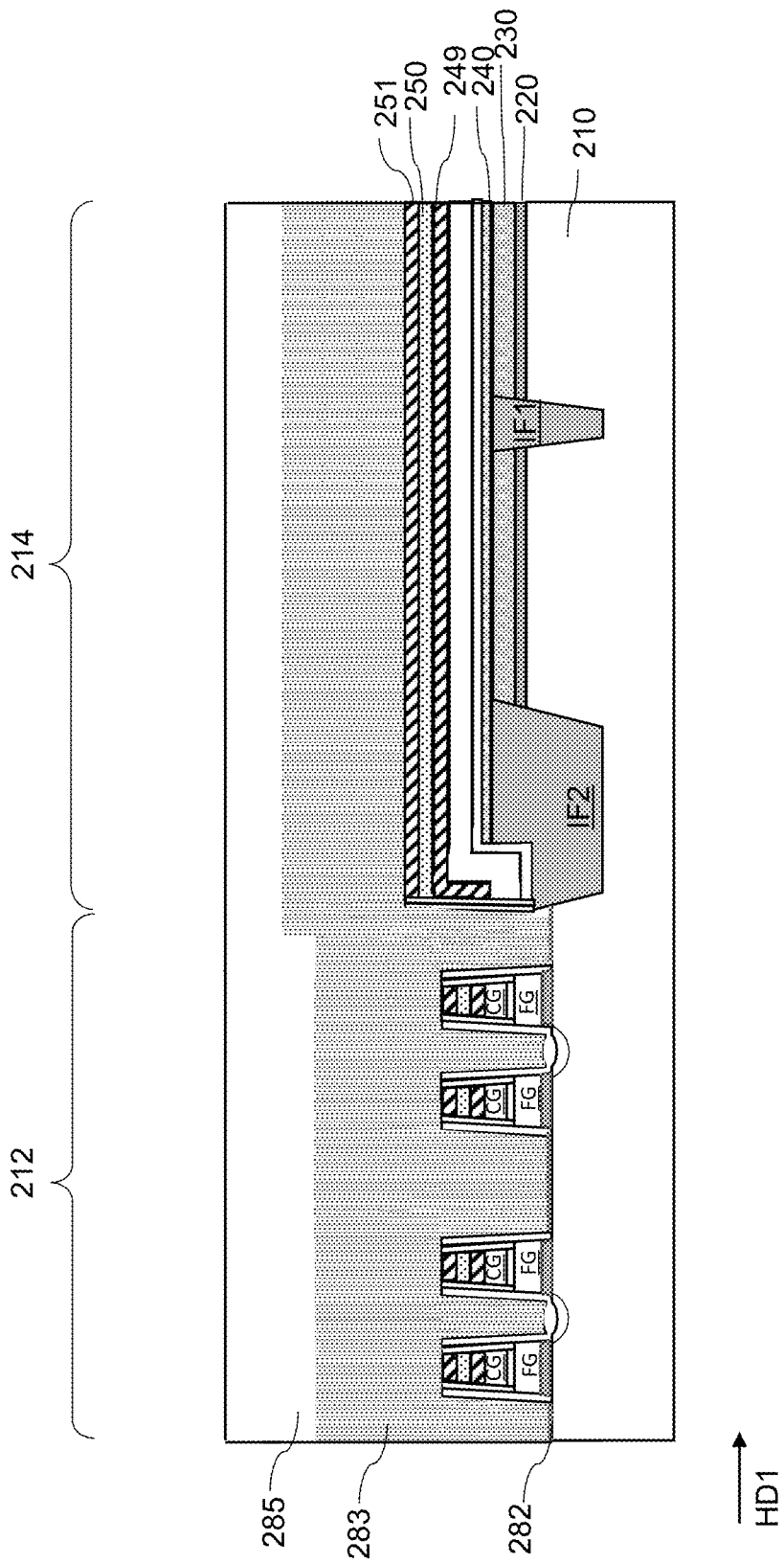
FIG. 23 is a vertical cross-section view of the exemplary intermediate structure showing a select gate dielectric layer over the substrate in the memory region, a conductive material layer over the memory region and the peripheral region of the intermediate structure, and a BL coating over the conductive material layer according to various embodiments of the present disclosure.

FIG. 23 is a vertical cross-section view of the exemplary intermediate structure showing a select gate dielectric layer 282 over the substrate 210 in the memory region 212, a conductive material layer 283 over the memory region 212 and the peripheral region 214 of the intermediate structure, and a bottom layer (BL) coating 285 over the conductive material layer 283. The BL coating 285 may composed of a suitable material, such as an organic photoresist, that may provide a substantially planar upper surface over the exemplary intermediate structure. Referring to FIG. 23, a select gate dielectric layer 282 may be formed over the surface of the substrate 210 between each pair of memory stacks MS1-MS4 that share a common source region CS. The select gate dielectric layer 282 may be composed of a suitable dielectric material, such as an oxide material (e.g., silicon oxide). The select gate dielectric layer 282 may be formed between the pairs of memory stacks MS1-MS4 using, for example, surface oxidation, CVD, other suitable deposition techniques, or the like. In some embodiments, formation of the select gate dielectric layer 282 may include depositing a layer dielectric material and etching portions of the dielectric layer not located between pairs of memory stacks MS1-MS4 sharing a common source region CS, such that the remaining portion of the dielectric layer forms the select gate dielectric layer 282 between pairs of memory stacks MS1-MS4 sharing a common source region CS.

Referring again to FIG. 23, a conductive material layer 283 may be formed over the memory region 212 and the peripheral region 214 of the intermediate structure. The conductive material layer 283 may be composed of a suitable electrically conductive material, such as a doped polysilicon material. In other embodiments, the conductive material layer 283 may include metal, metal alloys, doped amorphous silicon, or combinations thereof. Other suitable materials for the conductive material layer 283 are within the contemplated scope of disclosure. The conductive material layer 283 may be deposited using a suitable deposition process as described above. In various embodiments, a BL coating 285 may be deposited over the upper surface of the conductive material layer 283.

Figure 24:
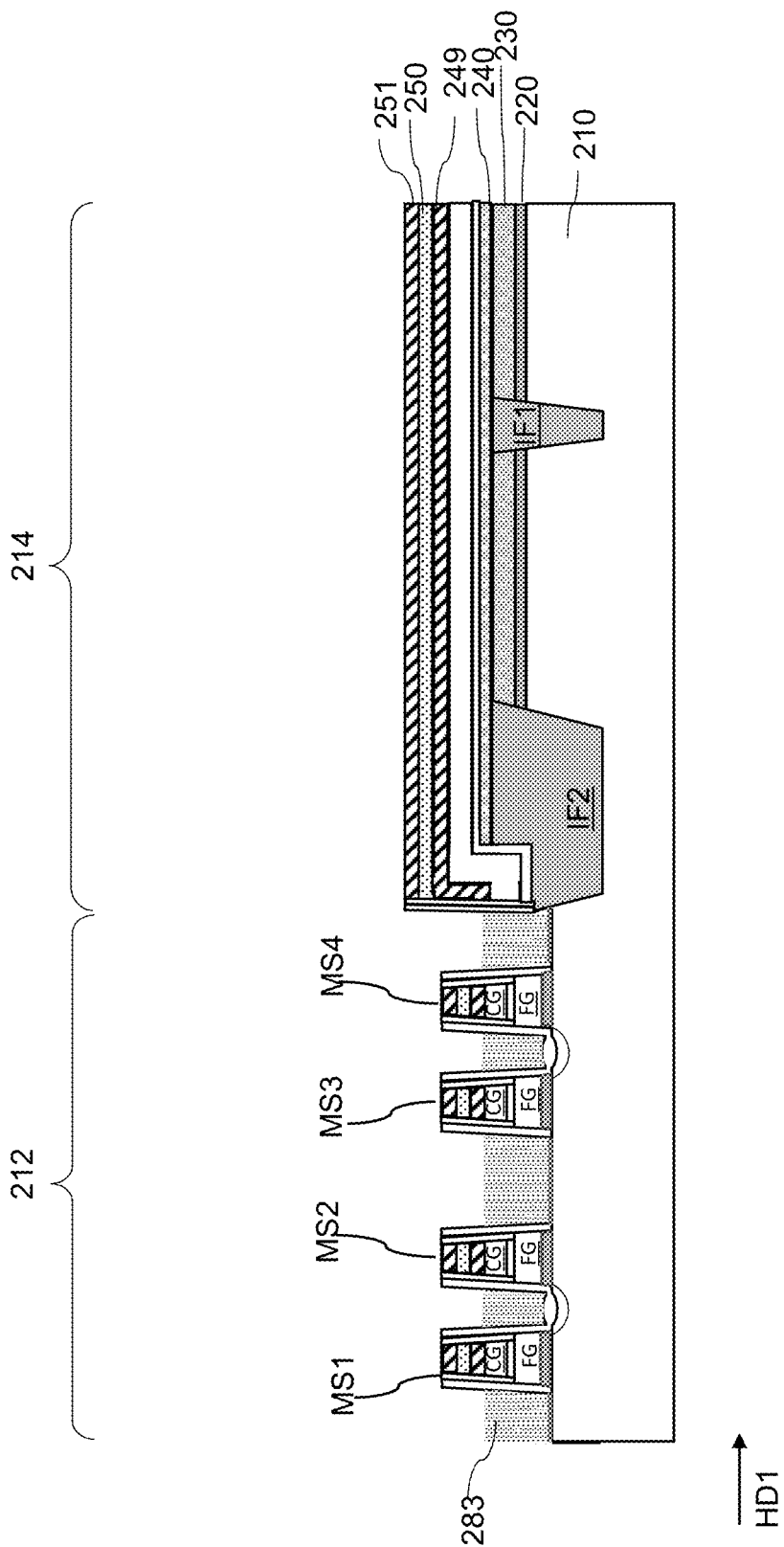
FIG. 24 is a vertical cross-section view of the exemplary intermediate structure following an etching process that removes the BL coating from the intermediate structure and the conductive material layer from over the peripheral region and recesses the conductive material layer within the memory region of the intermediate structure according to various embodiments of the present disclosure.

FIG. 24 is a vertical cross-section view of the exemplary intermediate structure following an etching process that removes the BL coating 285 from the intermediate structure and the conductive material layer 283 from over the peripheral region 214 and recesses the conductive material layer 283 within the memory region 212 of the intermediate structure. Referring to FIG. 24, the exemplary structure may undergo an etching process that removes the entirety of the BL coating 285. The etching process may also remove the conductive material layer 283 from the peripheral region 214 and may remove portions of the conductive material layer 283 from the memory region 212 such that the memory stacks MS1-MS4 protrude above the upper surface of the conductive material layer 283. In various embodiments, the height of the conductive material layer 283 may be recessed such that the upper surface of the conductive material layer 283 is approximately co-planar with the upper surface of the control gates CG within the memory stacks MS1-MS4. The conductive material layer 283 may form select gates SG and erase gates EG of the memory cells formed in the memory region 212 of the exemplary structure.

Figure 25:
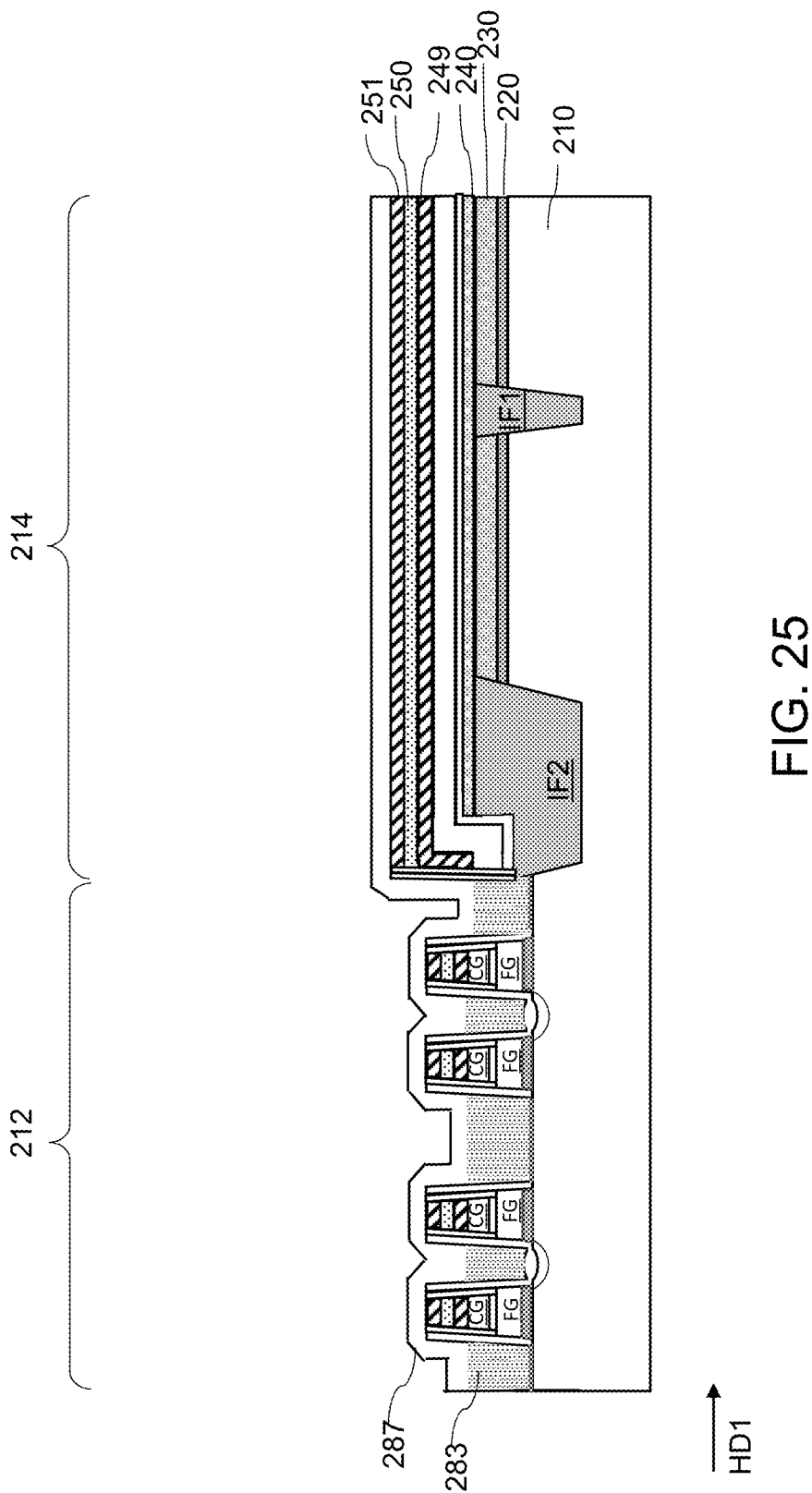
FIG. 25 is a vertical cross-section view of the exemplary intermediate structure showing a hard mask layer over the memory region and the peripheral region of the intermediate structure according to various embodiments of the present disclosure.

FIG. 25 is a vertical cross-section view of the exemplary intermediate structure showing a hard mask layer 287 over the memory region 212 and the peripheral region 214 of the intermediate structure. Referring to FIG. 25, the hard mask layer 287 may be composed of a dielectric material, such as a nitride material (e.g., silicon nitride). Other suitable dielectric materials are within the contemplated scope of disclosure. The hard mask layer 287 may protect and help to define the select gates SG and erase gates EG of the memory cells to be subsequently formed in the memory region 212. The hard mask layer 287 may be conformally deposited using a suitable deposition method, as described above.

Figure 26:
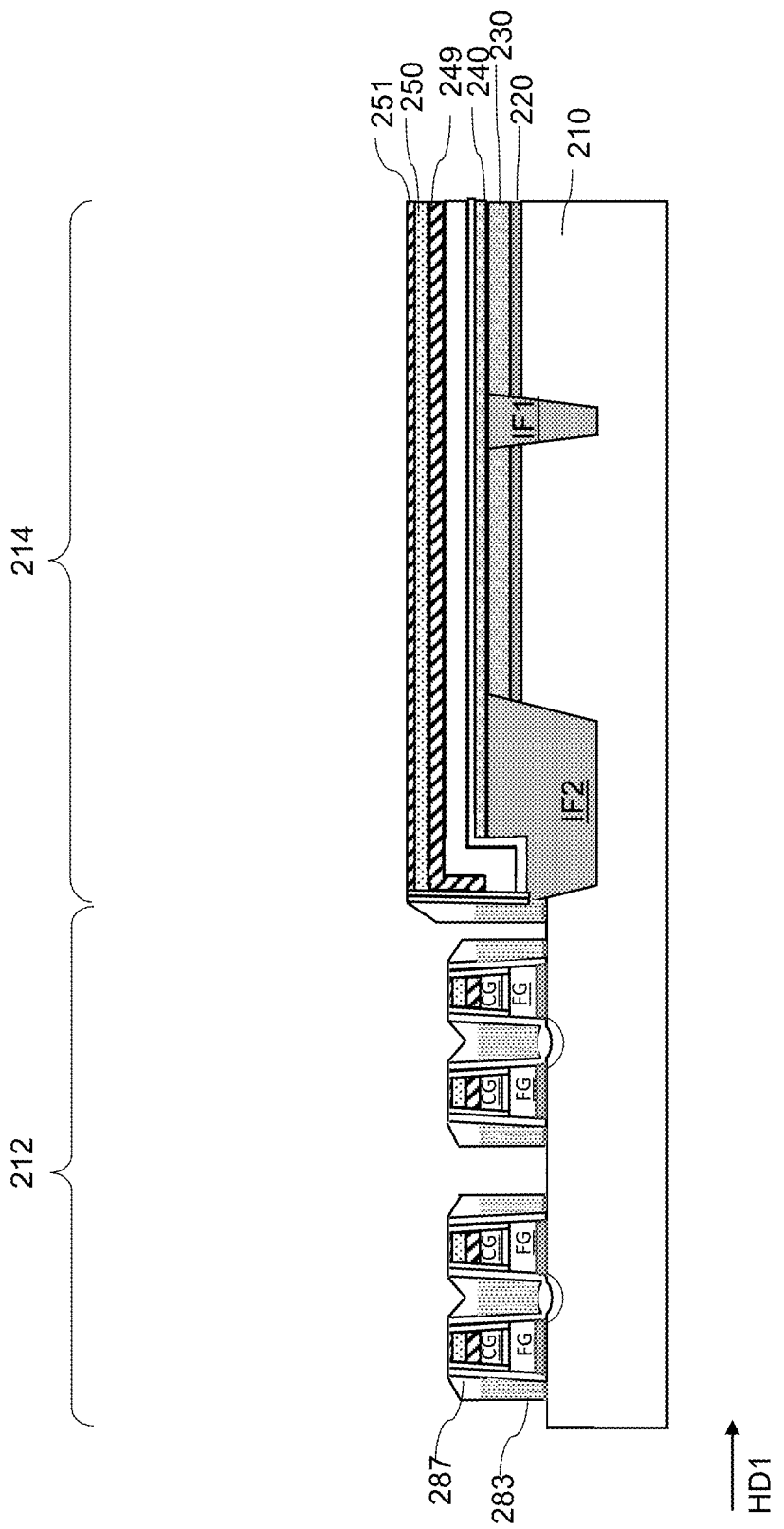
FIG. 26 is a vertical cross-section view of the exemplary intermediate structure following an etching process that removes the hard mask layer from the peripheral region and from over upper surfaces of the memory stacks in the memory region and removes portions of the hard mask layer and the conductive material layer between adjacent pairs of memory stacks according to various embodiments of the present disclosure.

FIG. 26 is a vertical cross-section view of the exemplary intermediate structure following an etching process that removes the hard mask layer 287 from the peripheral region 214 and from over upper surfaces of the memory stacks MS1-MS4 in the memory region 212 and removes portions of the hard mask layer 287 and the conductive material layer 283 between adjacent pairs of memory stacks MS1-MS4. Referring to FIG. 26, the exemplary structure may undergo an etching process that may remove the hard mask layer 287 from the peripheral region 214 of the exemplary structure and may also remove portions of the hard mask layer 287 and the conductive material layer 283 from the memory region 212 of the exemplary structure. In the peripheral region 214, the etching process may remove the hard mask layer 287 and may remove a portion of dielectric material layer 251. In the memory region 212, the etching process may remove the hard mask layer 287 from above the upper surfaces of the memory stacks MS1-MS4 and may also remove at least a portion of the uppermost layer (i.e., dielectric material layer 251) of the hard masks HM of each of the memory stacks MS1-MS4. Following the etching process, the remaining portions of the hard mask layer 287 may be located adjacent to the side surfaces of each of the memory stacks MS1-MS4 and over the remaining portions of the conductive material layer 283. Between adjacent pairs of memory stacks MS1-MS4 that share a common source region CS, the hard mask layer 287 and the conductive material layer 283 may be completely removed to form gaps between the pairs of memory stacks MS1-MS4. In embodiments, an upper surface of the substrate 210 may be exposed in each of the gaps.

Figure 27:
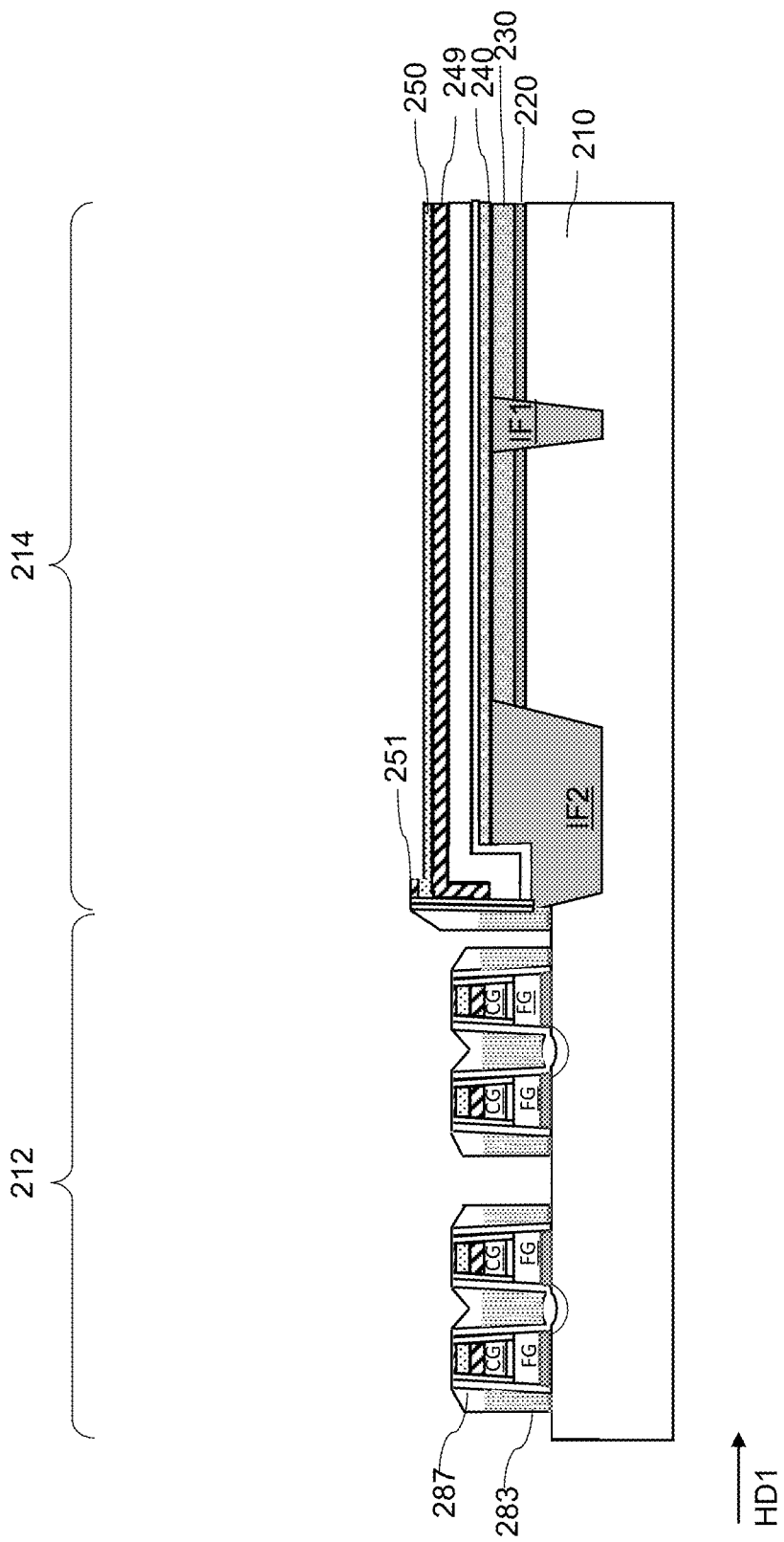
FIG. 27 is a vertical cross-section view of the exemplary intermediate structure following an additional etching process that removes dielectric material layer and a portion of dielectric material layer from the peripheral region of the exemplary structure according to various embodiments of the present disclosure.

FIG. 27 is a vertical cross-section view of the exemplary intermediate structure following an additional etching process that removes dielectric material layer 251 and a portion of dielectric material layer 250 from the peripheral region 214 of the exemplary structure. Referring to FIG. 27, the exemplary structure may undergo an additional etching process that may remove a remaining portion of dielectric material layer 251 and may further remove a portion of dielectric material layer 250 from the peripheral region 214. A mask (not shown in FIG. 27) may cover the memory region 212 to protect the memory region 212 from being etched. In some embodiments, the mask may extend over a portion of the second isolation feature IF2 such that following the etching process, a small portion of dielectric material layer 251 may remain over the second isolation feature IF2.

Figure 28:
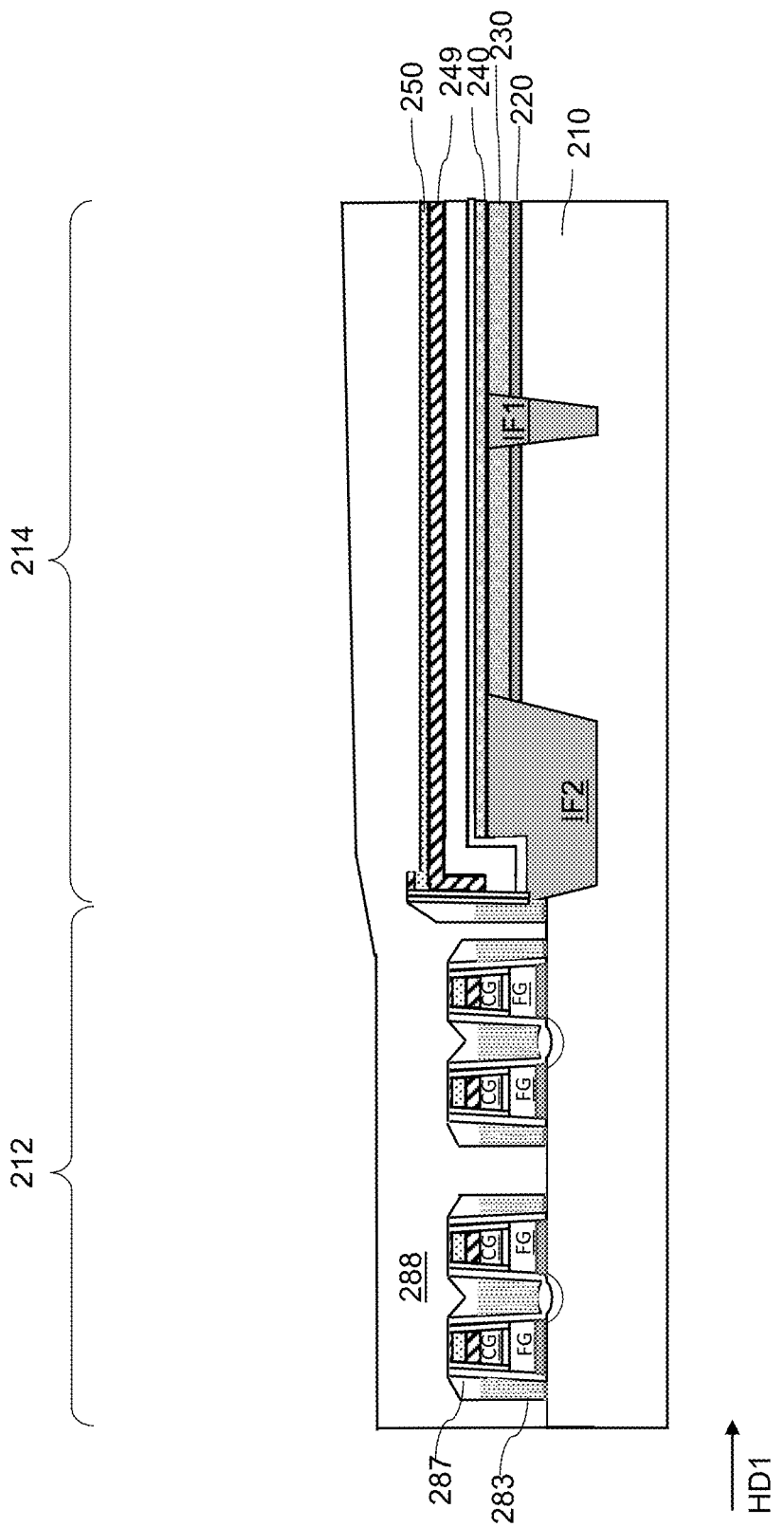
FIG. 28 is a vertical cross-section view of the exemplary intermediate structure showing a BL coating over the exemplary intermediate structure according to various embodiments of the present disclosure.

FIG. 28 is a vertical cross-section view of the exemplary intermediate structure showing a BL coating 288 over the exemplary intermediate structure.

Figure 29:
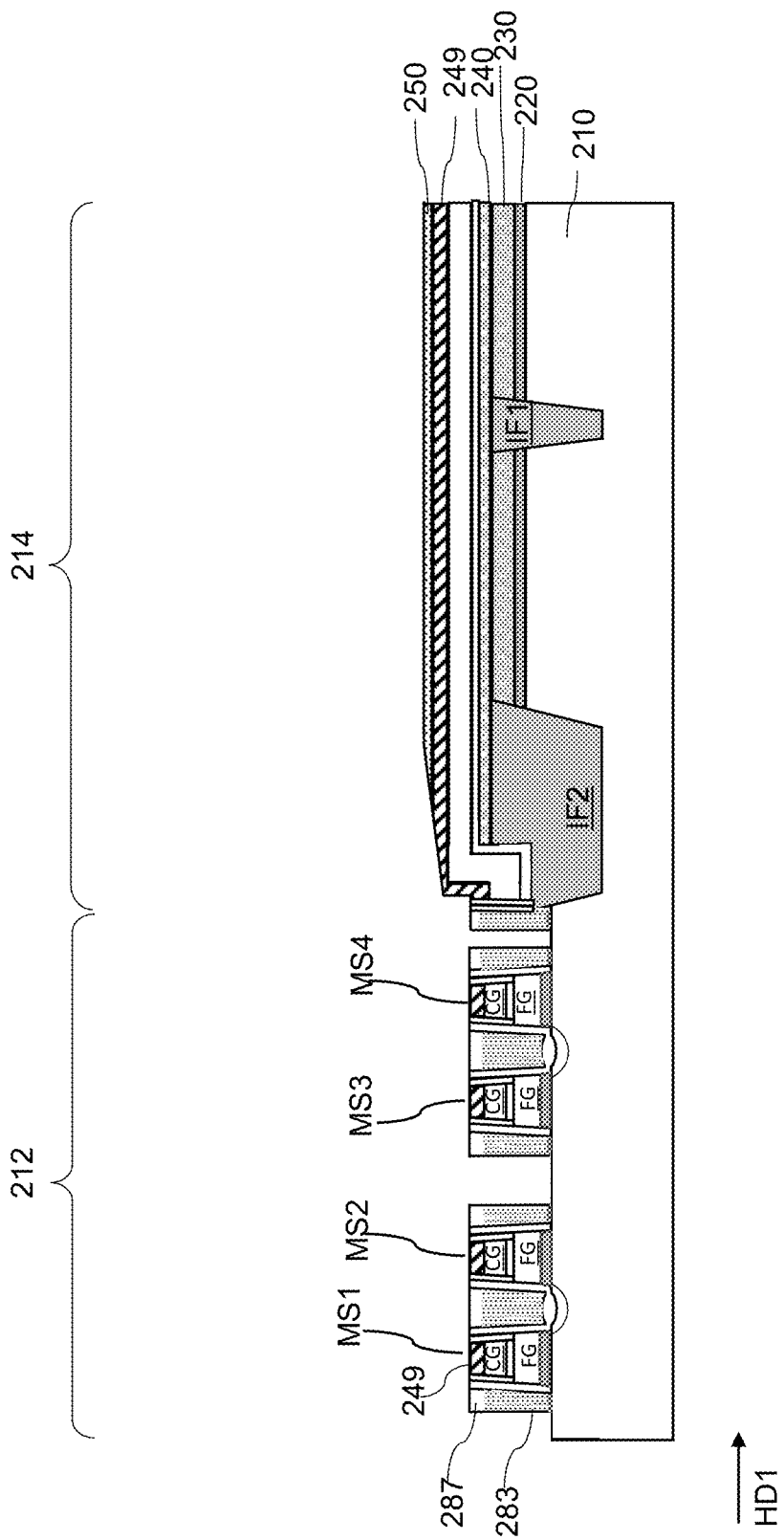
FIG. 29 is a vertical cross-section view of the exemplary intermediate structure following an etching process that removes the BL coating and additional portions of the memory stacks and the hard mask layer from the memory region according to various embodiments of the present disclosure.

FIG. 29 is a vertical cross-section view of the exemplary intermediate structure following an etching process that removes the BL coating 288 and additional portions of the memory stacks MS1-MS4 and the hard mask layer 287 from the memory region 212. Referring to FIG. 29, the etching process may remove dielectric material layer 250 of the hard masks HM in each of the memory stacks MS1-MS4. The etching process may also remove portions of the hard mask layer 287 such that following the etching process, dielectric material layer 249 of the hard masks HM defines the upper surface of each of the memory stacks MS1-MS4, and the upper surface of the hard mask layer 287 is substantially co-planar with the upper surface of each of the memory stacks MS1-MS4.

Figure 30:
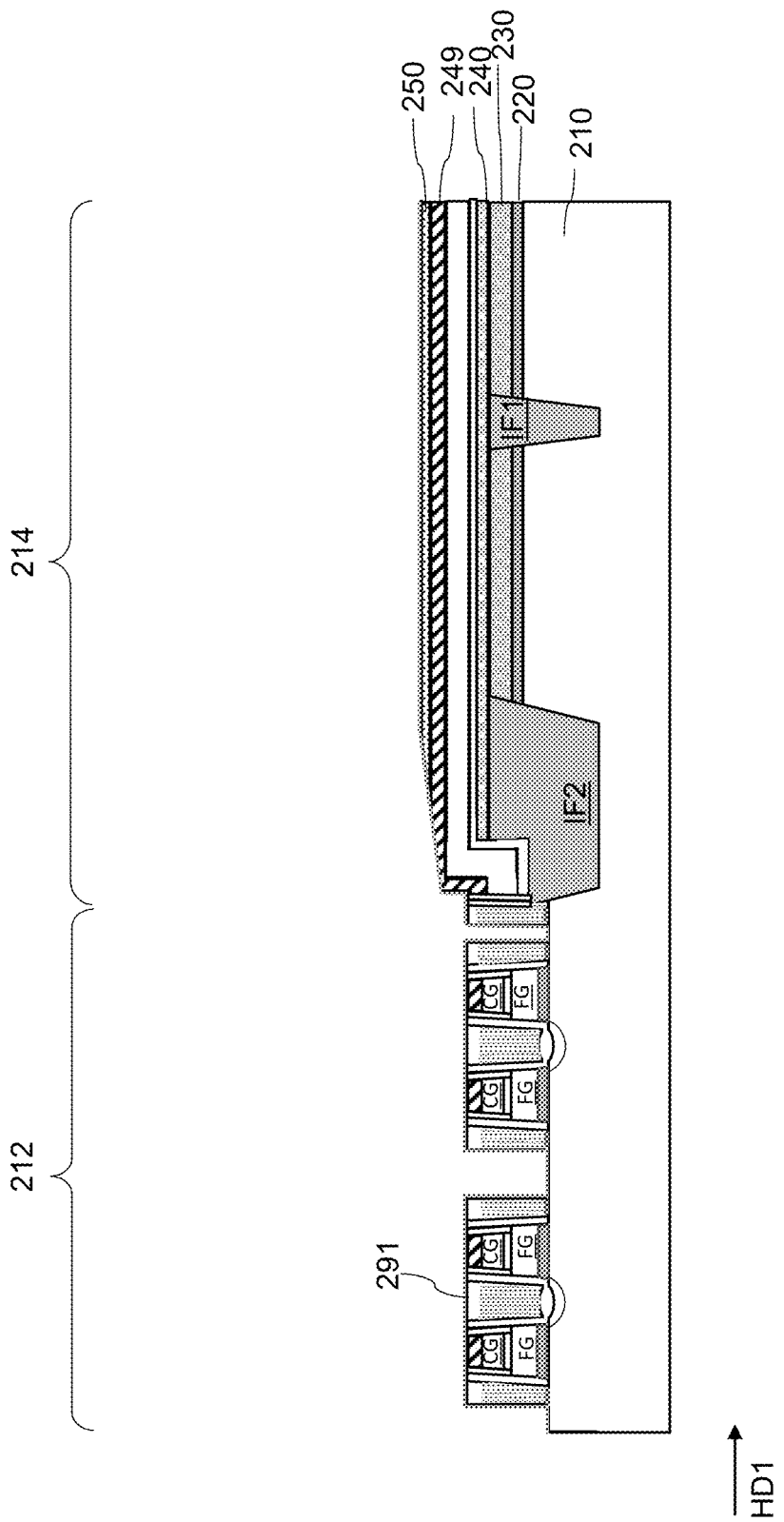
FIG. 30 is a vertical cross-section view of the exemplary intermediate structure showing a liner layer over exposed surfaces of the exemplary intermediate structure according to various embodiments of the present disclosure.

FIG. 30 is a vertical cross-section view of the exemplary intermediate structure showing a liner layer 291 over exposed surfaces of the exemplary intermediate structure. Referring to FIG. 30, the liner layer 291 may include a dielectric material, such as an oxide material, that may be conformally deposited over the exposed surfaces of the exemplary structure in the memory region 212 and the peripheral region 214. The liner layer 291 may be formed using a suitable deposition process as described above.

Figure 31:
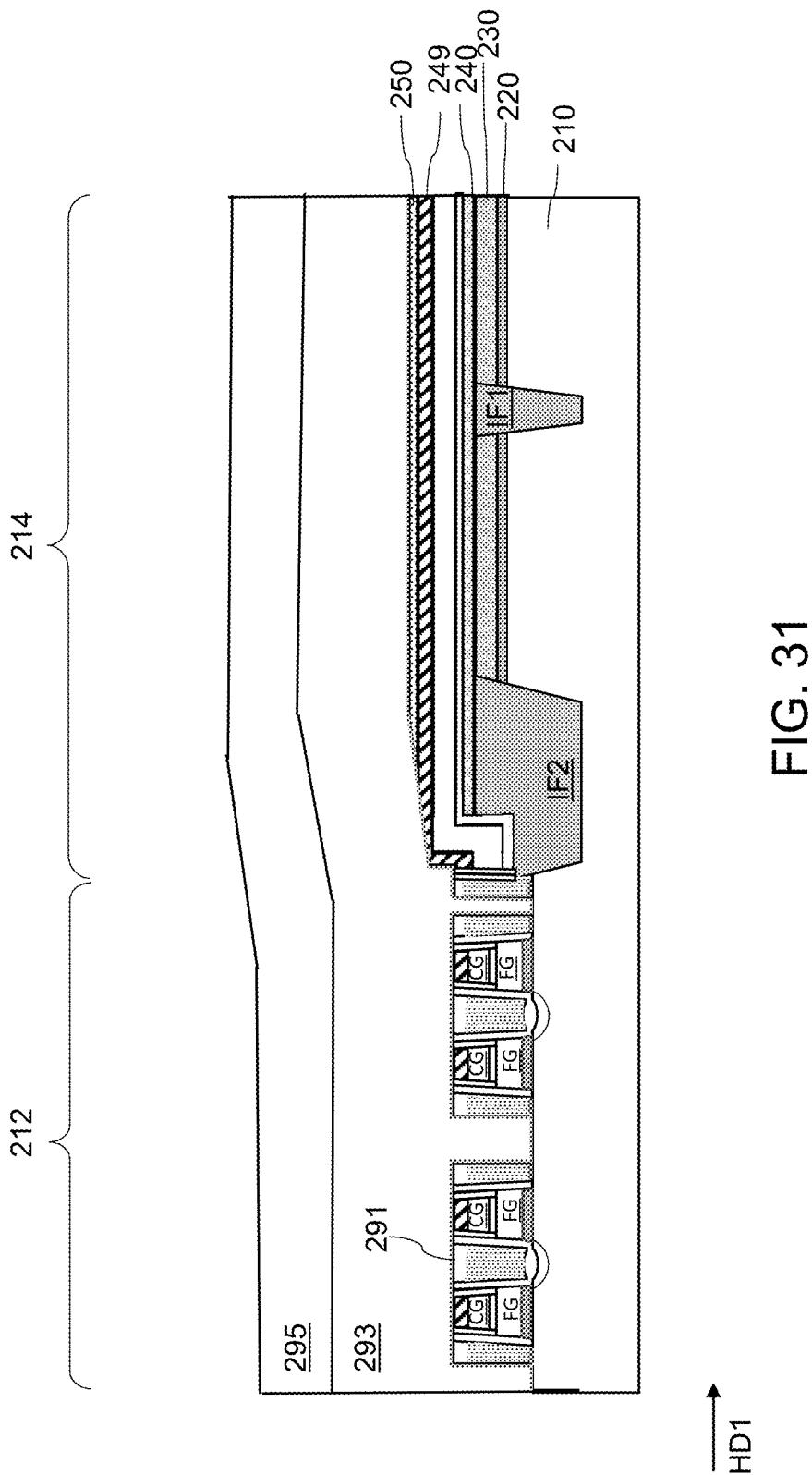
FIG. 31 is a vertical cross-section view of the exemplary intermediate structure showing a capping layer formed over the liner layer and a BARC layer over the capping layer according to various embodiments of the present disclosure.

FIG. 31 is a vertical cross-section view of the exemplary intermediate structure showing a capping layer 293 formed over the liner layer 291 and a BARC layer 295 over the capping layer 293. Referring to FIG. 31, in various embodiments, a capping layer 293 may protect the structures in the memory region 212 during subsequent processing steps to form logic transistors in the peripheral region 214. In some embodiments, the capping layer 293 may be composed of a semiconductor material, such as amorphous silicon or polysilicon. Other suitable materials for the capping layer 293 are within the contemplated scope of disclosure. The capping layer 293 may be deposited using a suitable deposition process as described above.

Figure 32:
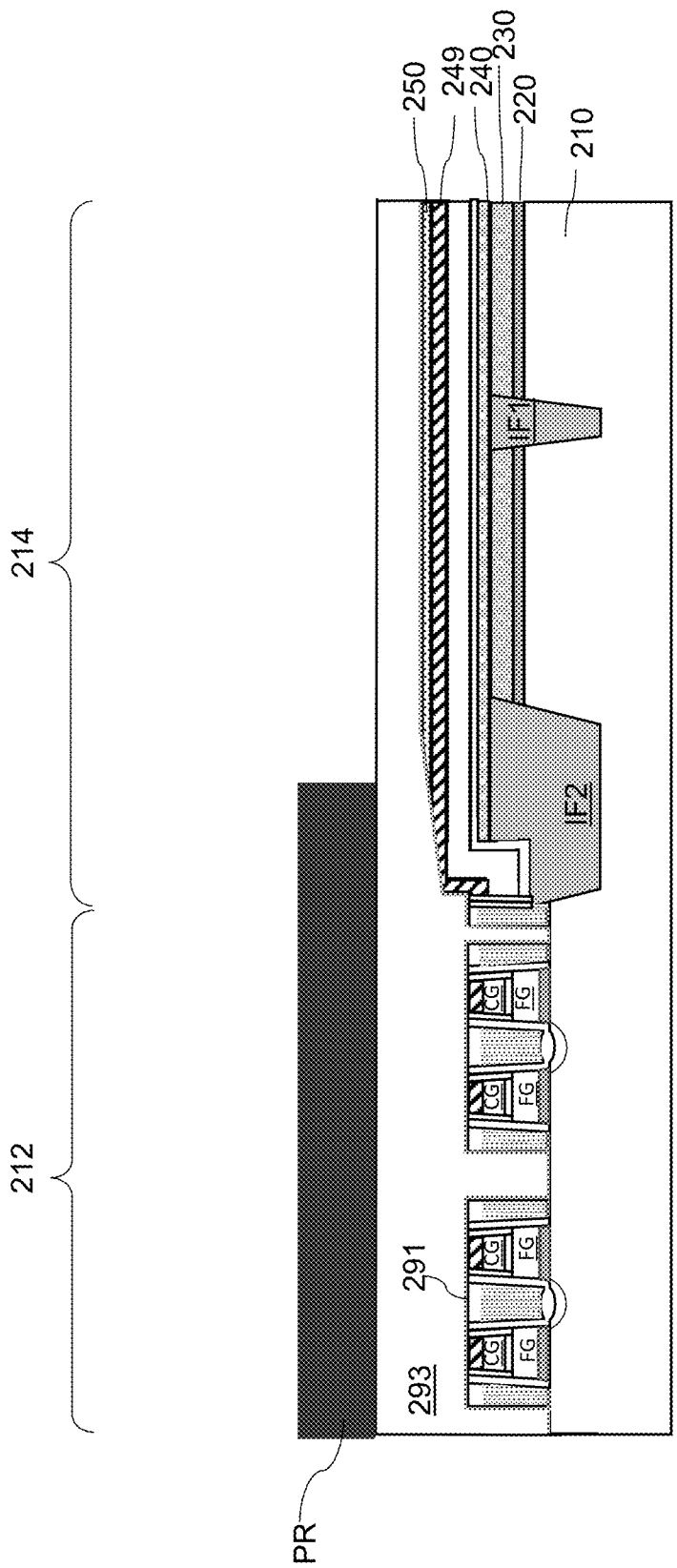
FIG. 32 is a vertical cross-section view of the exemplary intermediate structure following an etching process to remove the BARC layer and reduce the thickness of the capping layer over the exemplary intermediate structure according to various embodiments of the present disclosure.

FIG. 32 is a vertical cross-section view of the exemplary intermediate structure following an etching process to remove the BARC layer 295 and reduce the thickness of the capping layer 293 over the exemplary intermediate structure. Referring to FIG. 31, following the etching process, the capping layer 293 may have a substantially planar upper surface. A patterned mask, PR, may be formed over the upper surface of the capping layer 293. The patterned mask may be formed by depositing a layer of photoresist material over the capping layer 293 and lithographically patterning the photoresist material to form a patterned mask PR. As shown in FIG. 32, the patterned mask PR may completely cover the memory region 212 and may extend partially into the peripheral region 214. In embodiments, the peripheral edge of the patterned mask PR may be above the second isolation feature IF2. The remaining portion of the peripheral region 214 may be exposed through the patterned mask PR.

Figure 33:
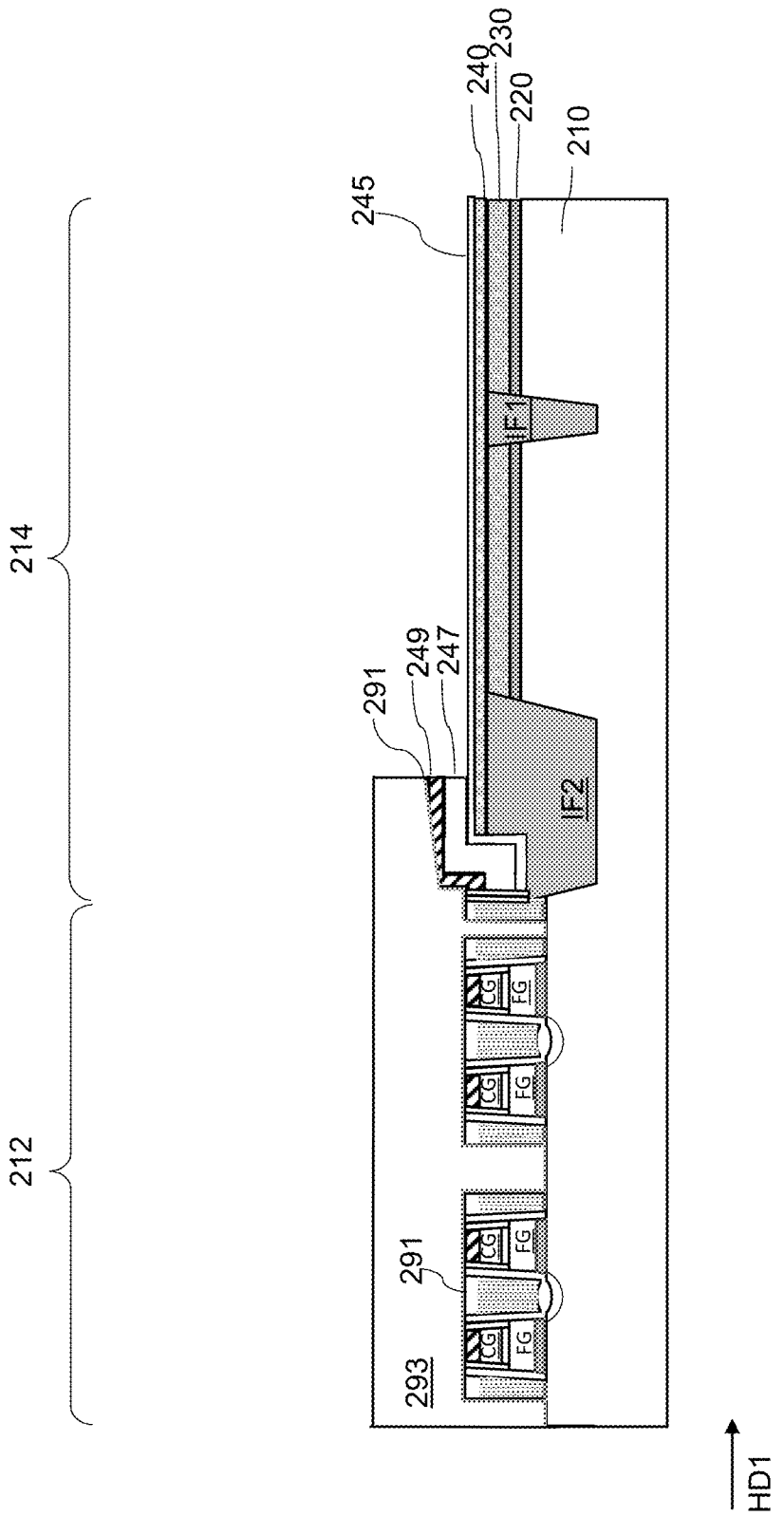
FIG. 33 is a vertical cross-section view of the exemplary intermediate structure following an etching process to remove the capping layer, the liner layer, dielectric material layers, and the control gate layer from the peripheral region according to various embodiments of the present disclosure.

FIG. 33 is a vertical cross-section view of the exemplary intermediate structure following an etching process to remove the capping layer 293, the liner layer 291, dielectric material layer 250, dielectric material layer 249 and control gate layer 247 from the peripheral region 214 of the exemplary intermediate structure. Referring to FIG. 33, an anisotropic etching process may be performed through the patterned mask PR to remove portions of the capping layer 293, the liner layer 291, dielectric material layer 250, dielectric material layer 249 and control gate layer 247 from the peripheral region 214. In some embodiments, the etching process may stop at the blocking layer 245. The etching process may expose side surfaces of the capping layer 293, the liner layer 291, dielectric material layer 249 and control gate layer 247 over the second isolation feature IF2. Following the etching process, the patterned mask PR may be removed using a suitable process, such as by ashing or dissolution using a solvent.

Figure 34:
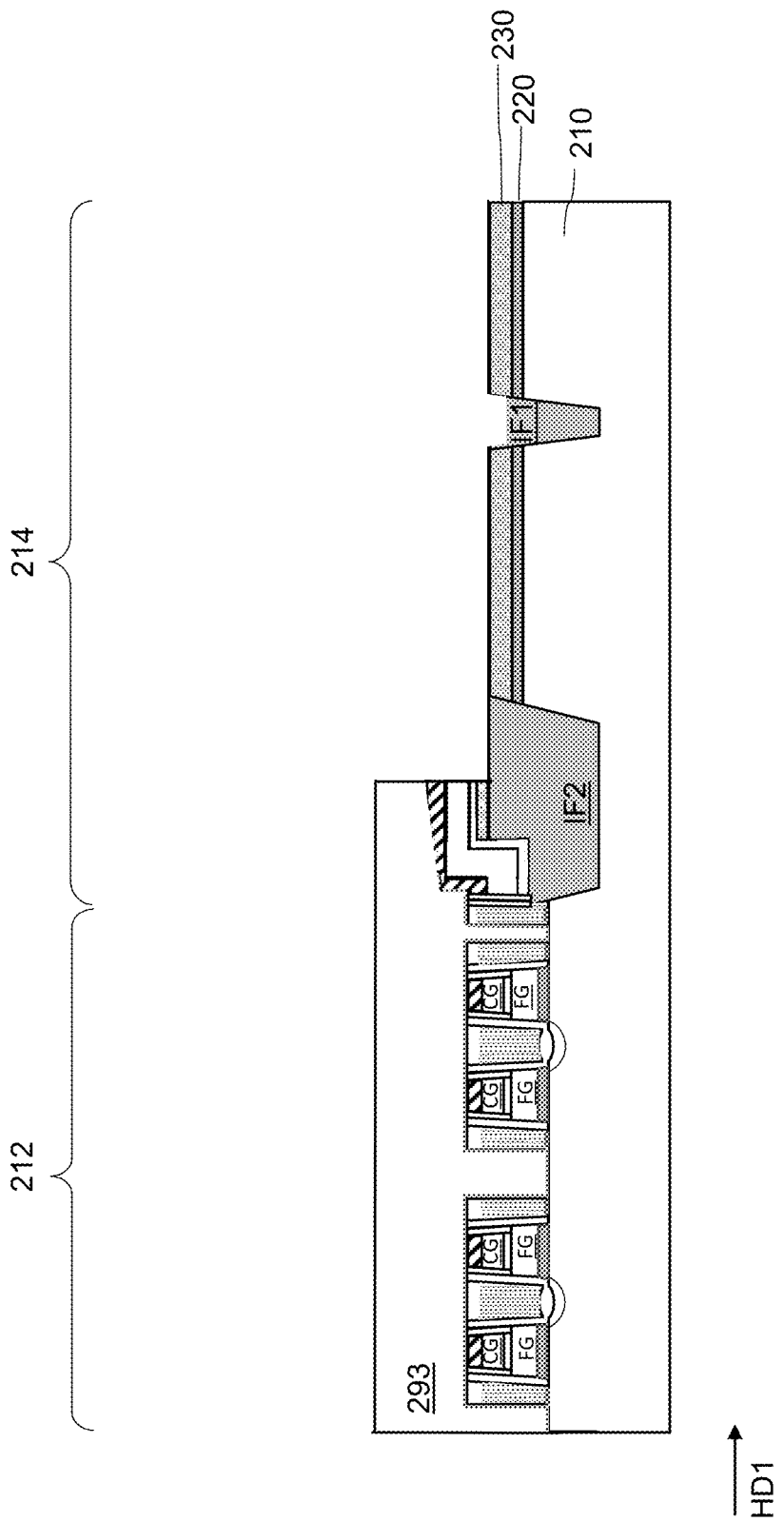
FIG. 34 is a vertical cross-section view of the exemplary intermediate structure following an additional etching process to remove the blocking layer and the third dielectric layer from the peripheral region of the exemplary intermediate structure according to various embodiments of the present disclosure.

FIG. 34 is a vertical cross-section view of the exemplary intermediate structure following an additional etching process to remove the blocking layer 245 and the third dielectric layer 240 from the peripheral region 214 of the exemplary intermediate structure. Referring to FIG. 34, an etching process, which may be a wet etch process (e.g., a hydrofluoric acid etch), may be performed to remove the blocking layer 245 and the third dielectric layer 240 from the peripheral region 214 and expose the upper surfaces of the second dielectric material layer 230 and the second isolation feature IF2 in the peripheral region 214. The etching process may also recess the upper surface of the first isolation feature IF1 with respect to the upper surface of the second dielectric material layer 230. The etching process may also recess portions of the liner layer 291 and the dielectric material layer 250 located over the second isolation feature IF2. During the etching process, the capping layer 293 may protect the memory region 212 from being etched.

Figure 35:
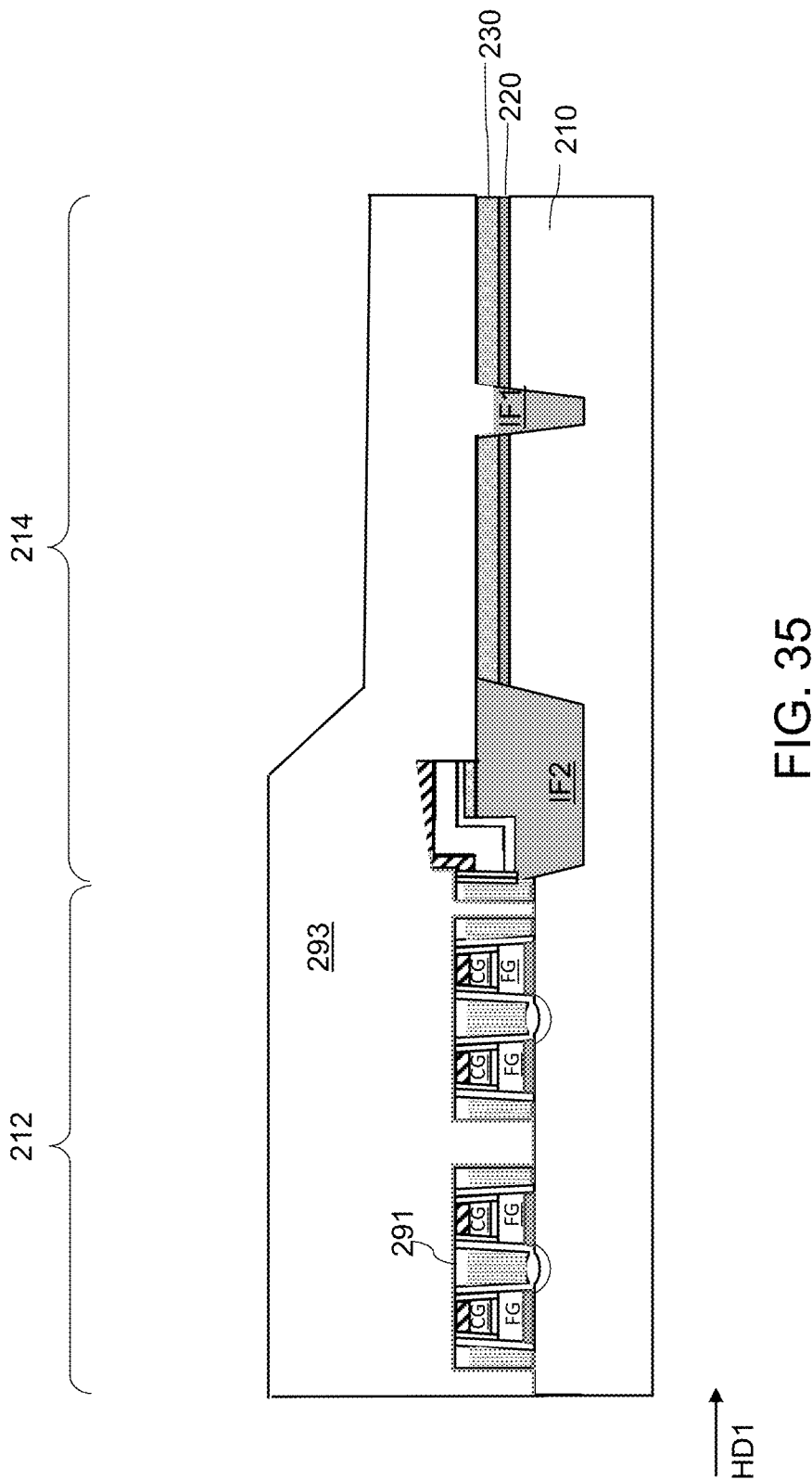
FIG. 35 is a vertical cross-section view of the exemplary intermediate structure showing additional capping material over the memory region and the peripheral region according to various embodiments of the present disclosure.

FIG. 35 is a vertical cross-section view of the exemplary intermediate structure showing additional capping material over the memory region 212 and the peripheral region 214. Referring to FIG. 35, in embodiments, the additional capping material may be composed of the same material as the existing capping layer 293, or may be composed of different material as the material of the existing capping layer 293. In some embodiments, the additional capping material may be a semiconductor material, such as amorphous silicon or polysilicon. Other suitable materials are within the contemplated scope of disclosure. The additional capping material may be deposited using a suitable deposition process as described above. The additional capping material may increase the thickness of the capping layer 293 in the memory region 212 and may extend the capping layer 293 to cover the peripheral region 214 of the exemplary intermediate structure.

Figure 36:
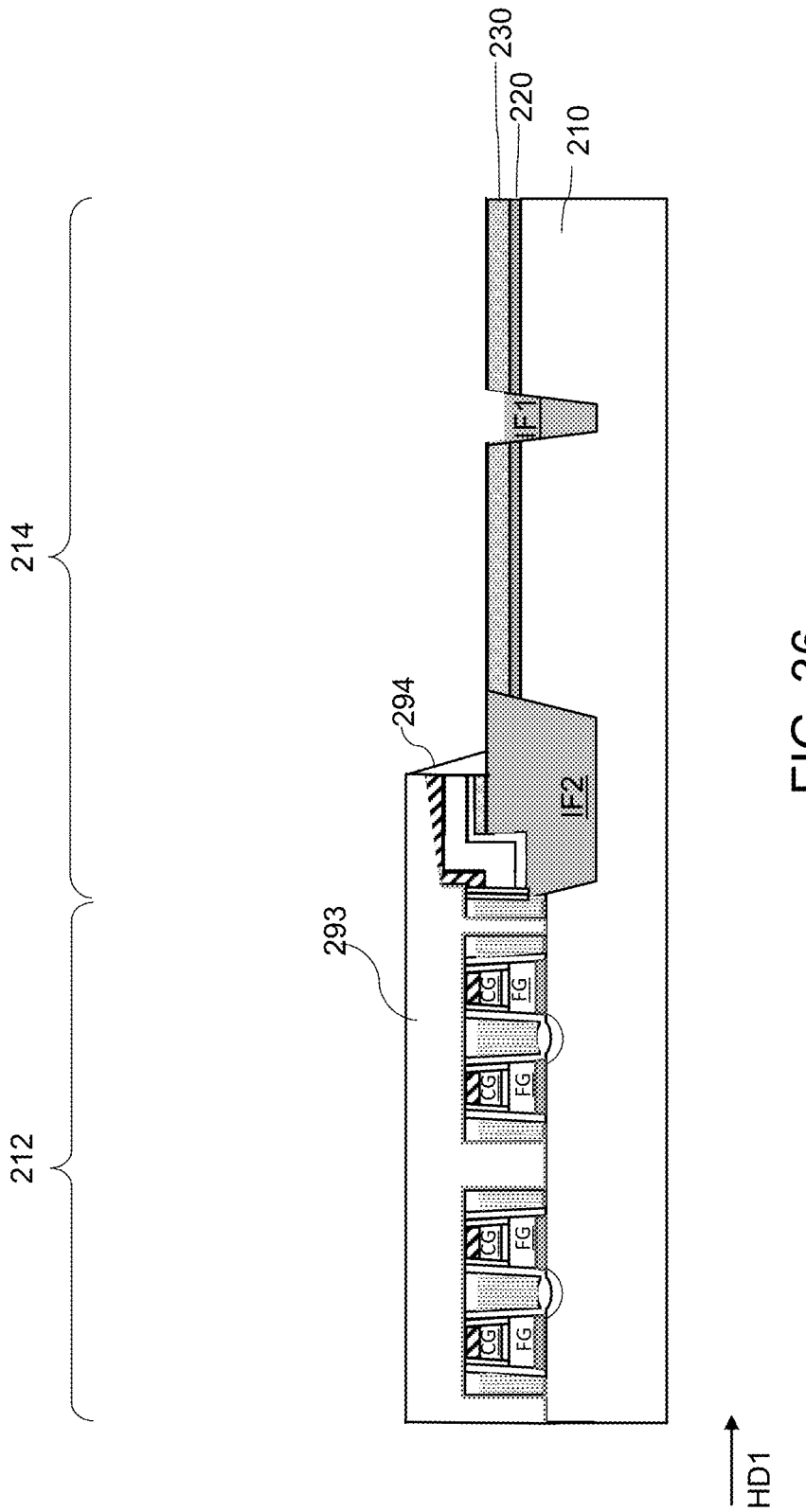
FIG. 36 is a vertical cross-section view of the exemplary intermediate structure following an etching process to remove the capping layer from the peripheral region according to various embodiments of the present disclosure

FIG. 36 is a vertical cross-section view of the exemplary intermediate structure following an etching process to remove the capping layer 293 from the peripheral region 214 of the exemplary intermediate structure. Referring to FIG. 36, an etching process may be performed to remove portions of the capping layer 293 and expose the upper surfaces of the second dielectric layer 230 and the isolation features IF1, IF2 in the peripheral region 214. The etching process may also reduce a thickness of the capping layer 293 in the memory region 212. Following the etching process, the capping layer 293 may include a tapered sidewall 294 over the second isolation feature IF2.

Figure 37:
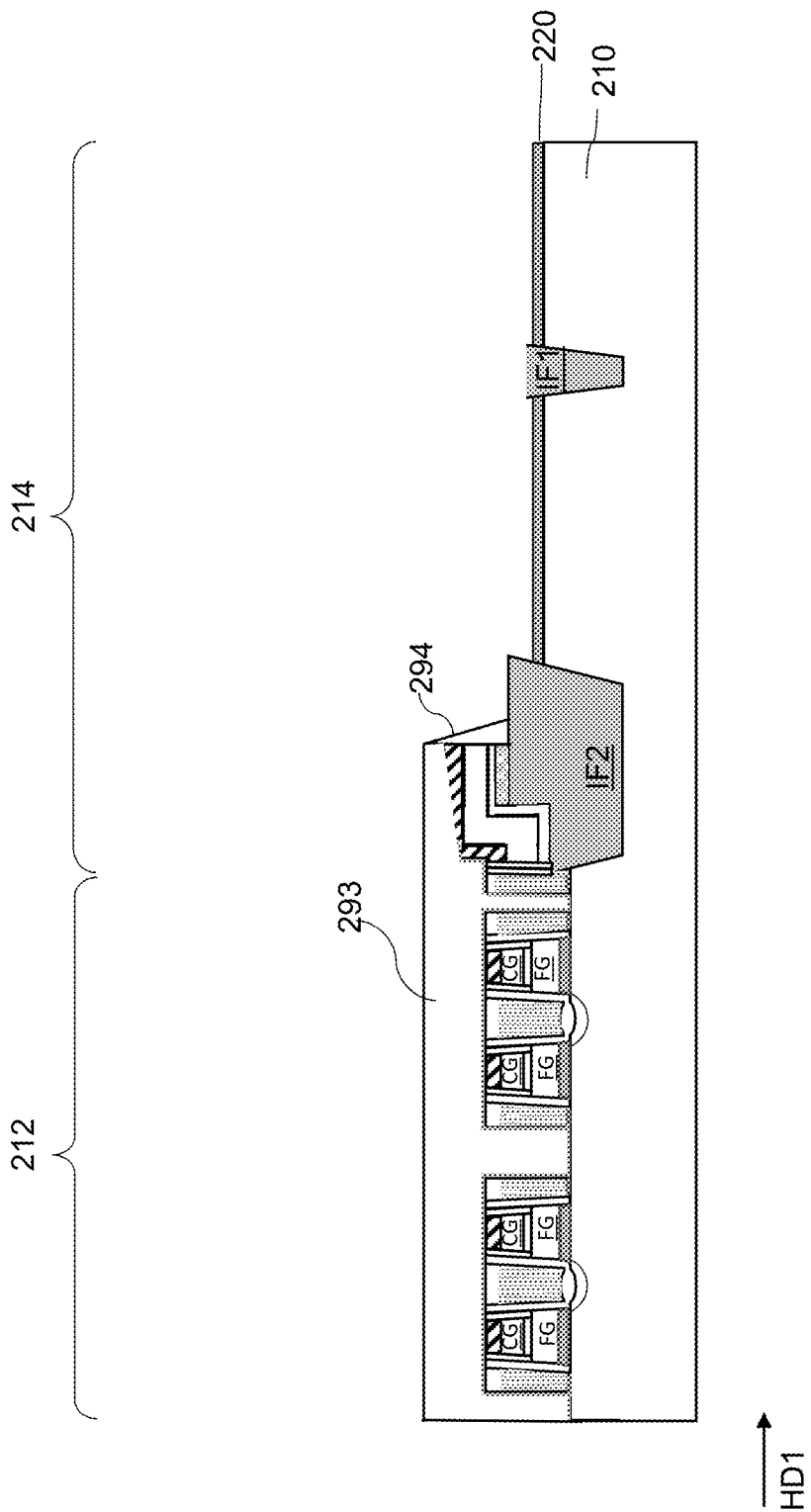
FIG. 37 is a vertical cross-section view of the exemplary intermediate structure following an additional etching process to remove the second dielectric material layer from the peripheral region according to various embodiments of the present disclosure.

FIG. 37 is a vertical cross-section view of the exemplary intermediate structure following an additional etching process to remove the second dielectric material layer 230 from the peripheral region 214. Referring to FIG. 37, an etching process, which may be a wet etch process (e.g., a phosphoric acid etch), may be performed to remove the second dielectric material layer 230 from the peripheral region 214 and expose the upper surface of the first dielectric material layer/tunneling layer 220. Following the etching process, the first and second isolation features IF1, IF2 may protrude above the upper surface of the first dielectric material layer/tunneling layer 220.

Figure 38:
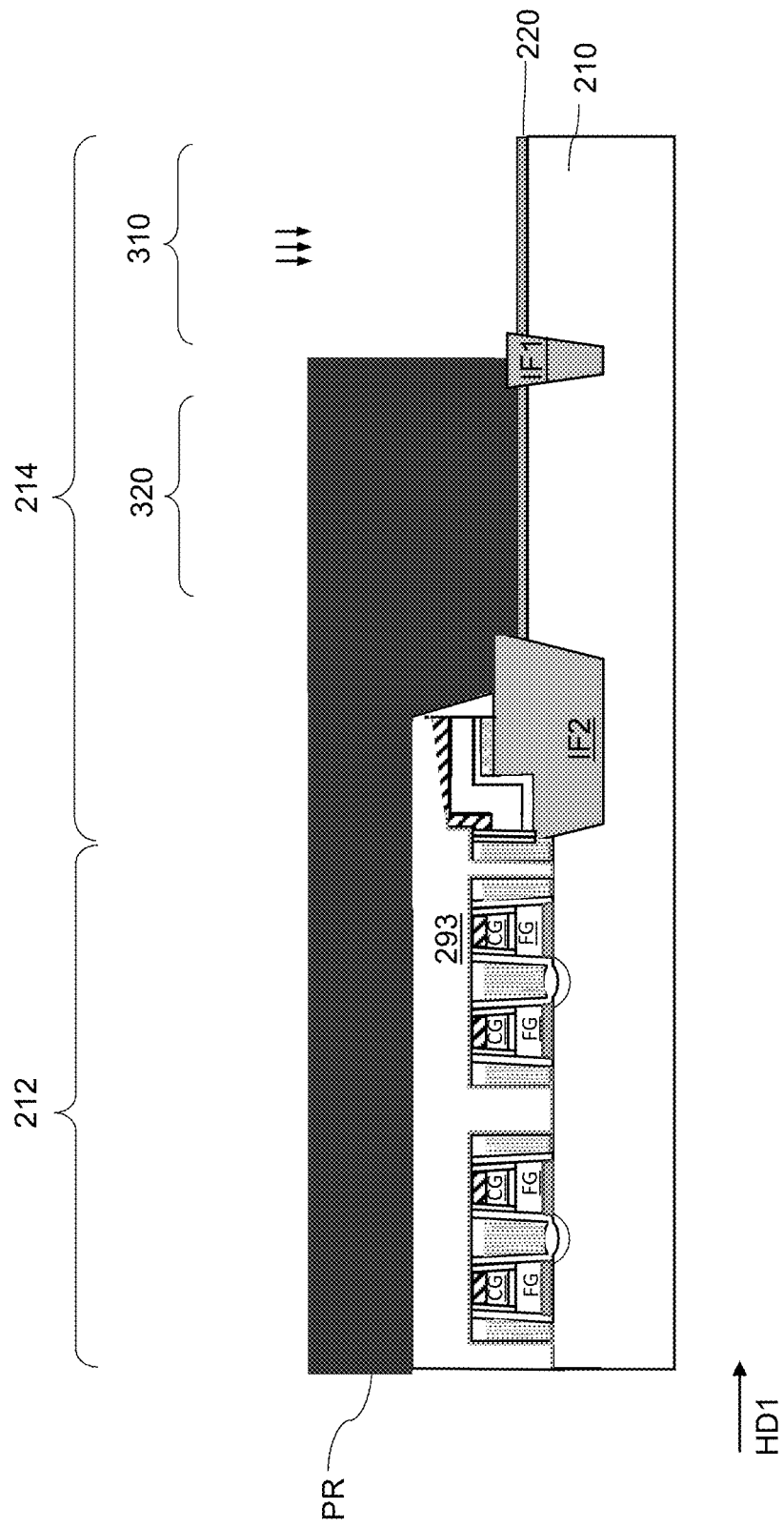
FIG. 38 is a vertical cross-section view of the exemplary intermediate structure showing a masked ion implantation process performed in a first area of the peripheral region according to various embodiments of the present disclosure.
Figure 39:
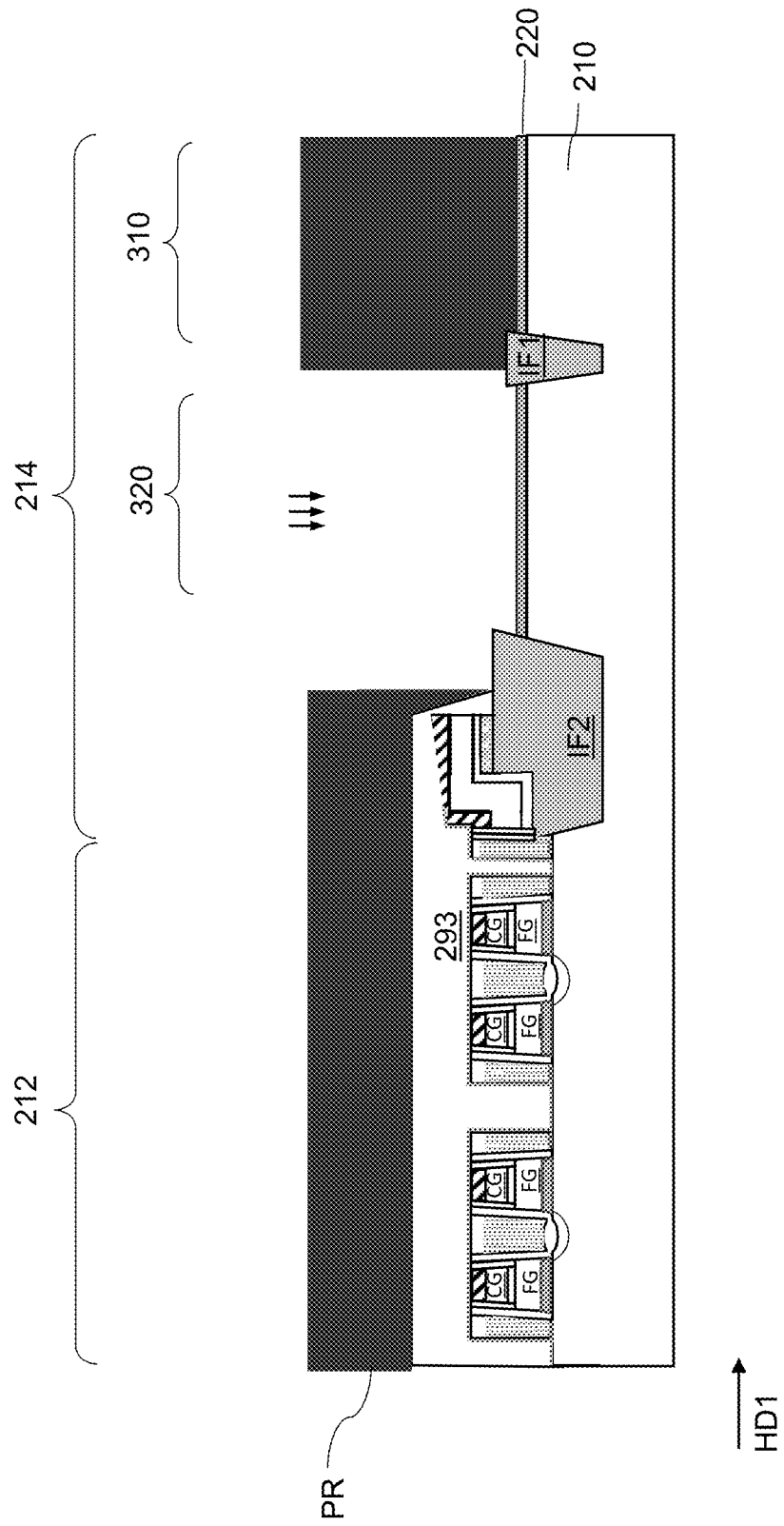
FIG. 39 is a vertical cross-section view of the exemplary intermediate structure showing a masked ion implantation process performed in a second area of the peripheral region according to various embodiments of the present disclosure.

FIG. 38 is a vertical cross-section view of the exemplary intermediate structure showing a masked ion implantation process performed in a first area 310 of the peripheral region 214. FIG. 39 is a vertical cross-section view of the exemplary intermediate structure showing a masked ion implantation process performed in a second area 320 of the peripheral region 214. Referring to FIGS. 38 and 39, an ion implantation process may be performed through a patterned mask PR in areas 310, 320 of the peripheral region 214 in which logic transistors may be subsequently formed. In some embodiments, different types of logic transistors may be formed in different areas of the peripheral region 214. For example, in one non-limiting embodiment, a first logic transistor may be formed in the first area 310 of the peripheral region 214, and a second logic transistor, which may be a high-voltage logic transistor, may be formed in the second area 320 of the peripheral region. Following the implantation process(es), the patterned mask(s) PR may be removed by a suitable process, such as by ashing or dissolution with a solvent.

Figure 40:
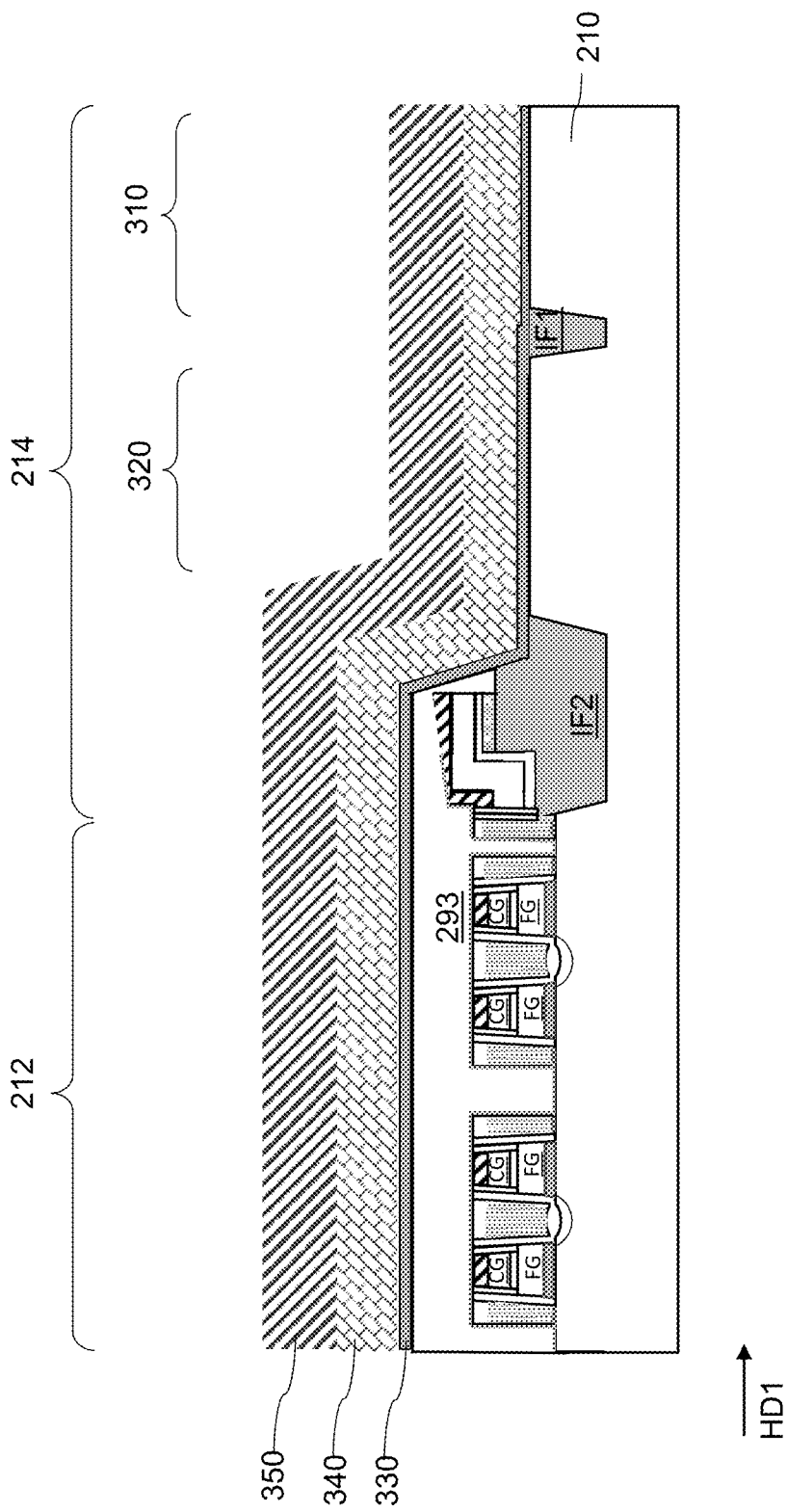
FIG. 40 is a vertical cross-section view of the exemplary intermediate structure showing a layer of gate dielectric material over the exemplary structure, a sacrificial gate material layer over the layer of gate dielectric material, and a hard mask layer over the sacrificial gate material layer according to various embodiments of the present disclosure.

FIG. 40 is a vertical cross-section view of the exemplary intermediate structure showing a layer of gate dielectric material 330 over the exemplary structure, a sacrificial gate material layer 340 over the layer of gate dielectric material 330, and a hard mask layer 350 over the sacrificial gate material layer 340. Referring to FIG. 40, in some embodiments, the first dielectric material layer/tunneling layer 220 may be removed (e.g., via etching) from the peripheral region 214, either prior to or following the ion implantation steps shown in FIGS. 38 and 39. In some embodiments, a planarization process, such as CMP and/or etching process, may be performed such that the upper surfaces of the isolation features IF1, IF2 may be co-planar with the upper surface of the substrate 210 in the peripheral region 214.

Then, a layer of gate dielectric material 330 may be deposited over the exemplary intermediate structure, including over the upper surface of the capping layer 293 in the memory region 212, over the tapered sidewall of the capping layer 293, and over the upper surfaces of the isolation features IF1, IF2 and the substrate 210 in the peripheral region 214. The layer of gate dielectric material 330 may include a suitable dielectric material such as silicon dioxide ($SiO_2$), silicon nitride ($Si_3N_4$), silicon oxynitride (SiON), hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$), combinations thereof, and the like. Other suitable dielectric materials are within the contemplated scope of disclosure. The layer of gate dielectric material 330 may be deposited using a suitable deposition process as described above.

In some embodiments, a thickness of the layer of gate dielectric material 330 may vary in different areas of the peripheral region 214. In one non-limiting example, a thickness of the layer of gate dielectric material 330 in the first area 310 of the peripheral region 214, in which a logic transistor may be subsequently formed, may be less than the thickness of the layer of gate dielectric material 330 in the second area 320 of the peripheral region 214, in which a high-voltage logic transistor may be subsequently formed. In some embodiments, the layer of gate dielectric material 330 may have different compositions in different areas 310, 320 of the peripheral region 214.

Referring again to FIG. 40, a sacrificial gate material layer 340 may be formed over the layer of gate dielectric material 330. In various embodiments, the sacrificial gate material layer 340 may be used to fabricate dummy gate structures that may subsequently be replaced by metal gates (e.g., using an RPG process). In some embodiments, the sacrificial gate material layer 340 may be composed of a semiconductor material, such as polysilicon. Other suitable materials are within the contemplated scope of disclosure. The sacrificial gate material layer 340 may be deposited using a suitable deposition process as described above.

Referring again to FIG. 40, a hard mask layer 350 may be formed over the sacrificial gate material layer 340. The hard mask layer 350 may be composed of a suitable dielectric material, such as a nitride or oxide material, or combinations thereof. The hard mask layer 350 may be deposited using a suitable deposition process as described above.

Figure 41:
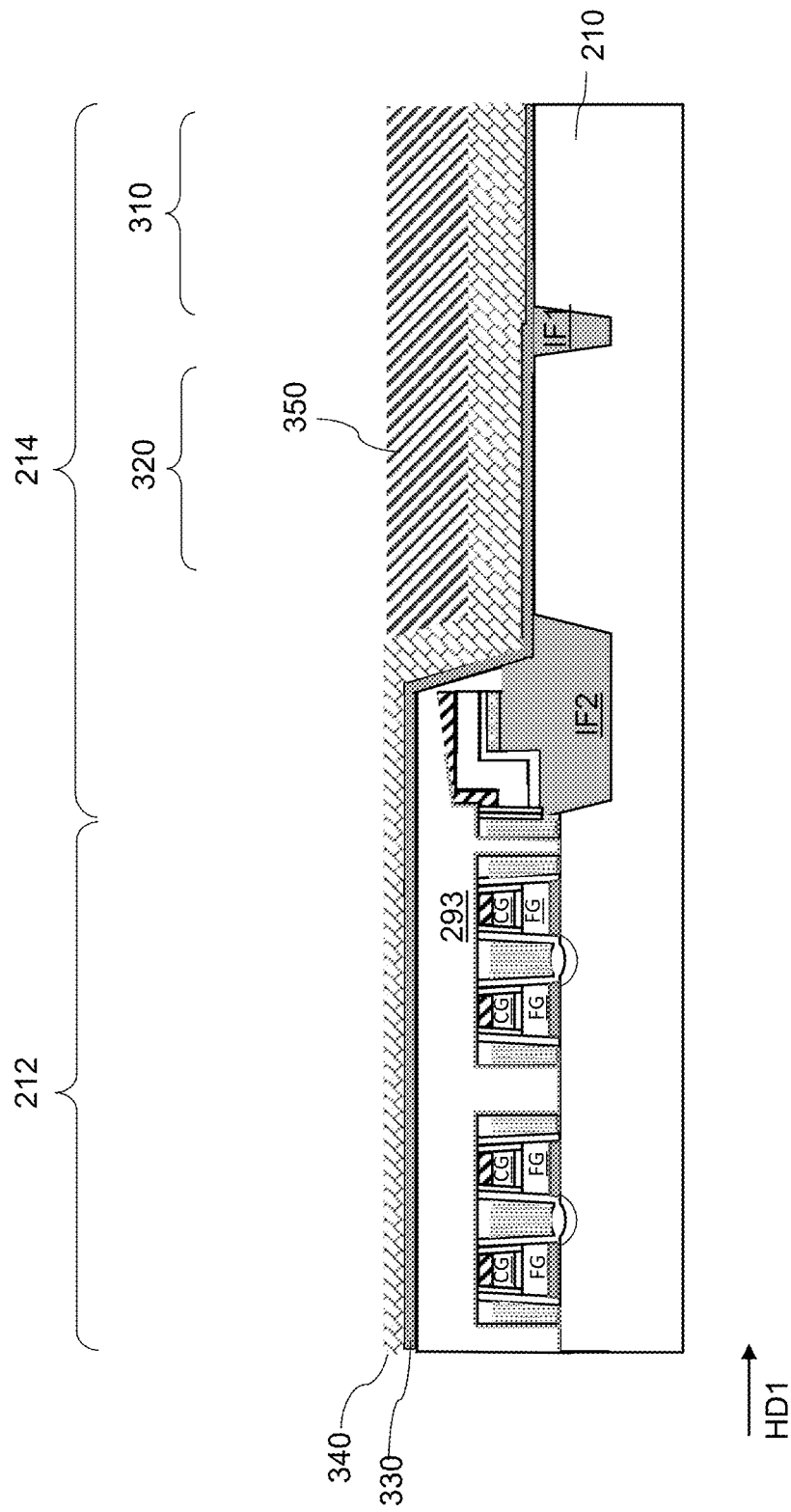
FIG. 41 is a vertical cross-section view of the exemplary intermediate structure following an etching process to remove the hard mask layer and a portion of the sacrificial gate material layer from over the capping layer according to various embodiments of the present disclosure.

FIG. 41 is a vertical cross-section view of the exemplary intermediate structure following an etching process to remove the hard mask layer 350 and a portion of the sacrificial gate material layer 340 from over the capping layer 293. Referring to FIG. 41, a patterned mask (not shown in FIG. 41) may be formed over the hard mask layer 350 in the peripheral region 214. An etching process may be performed through the mask to remove the hard mask layer 350 and a portion of the sacrificial gate material layer 340 from over the capping layer 293. The mask may prevent the hard mask layer 350 and the sacrificial gate material layer 340 from being etched in the peripheral region 214.

Figure 42:
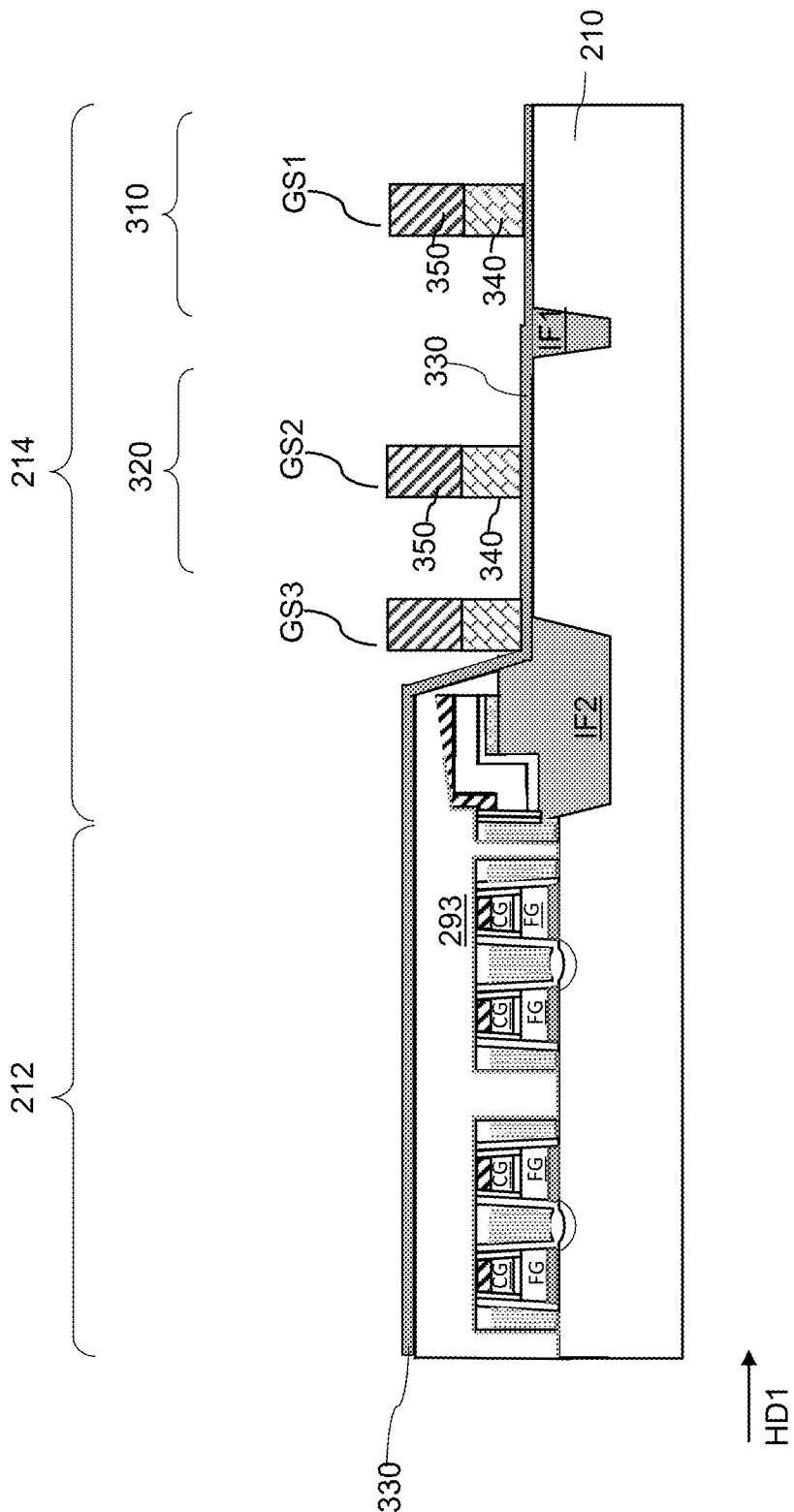
FIG. 42 is a vertical cross-section view of the exemplary intermediate structure showing a plurality of gate stacks formed over the layer of gate dielectric material in the peripheral region according to various embodiments of the present disclosure.

FIG. 42 is a vertical cross-section view of the exemplary intermediate structure showing a plurality of gate stacks GS1, GS2 and GS3 formed over the layer of gate dielectric material 330 in the peripheral region 214 of the exemplary intermediate structure. Referring to FIG. 42, the plurality of gate stacks GS1, GS2, GS3 may be formed in a similar manner as the plurality of memory stacks MS1-MS4 described above with reference to FIGS. 15 and 16. In particular, a patterned mask, such as a photoresist mask PR (not shown in FIG. 42) may be formed over the exemplary intermediate structure. The mask may be lithographically patterned such that the mask covers selected portions of the hard mask layer 350 corresponding to the locations of gate stacks that may be subsequently formed in the peripheral region 214. An anisotropic etching process may be performed to remove portions of the hard mask layer 350 and the sacrificial gate material layer 340 that are exposed through the mask. The etching process may stop at the layer of gate dielectric material 330. Following the etching process, a plurality of gate stacks GS1-GS3 may be located over the layer of gate dielectric material 330 in the peripheral region 214. Each gate stack GS1-GS3 may include a sacrificial gate material layer 340 over the layer of gate dielectric material 330, and a hard mask layer 350 over the sacrificial gate material layer 340. Following the etching process, the patterned mask PR may be removed using a suitable process, such as by ashing or dissolution using a solvent.

Figure 43:
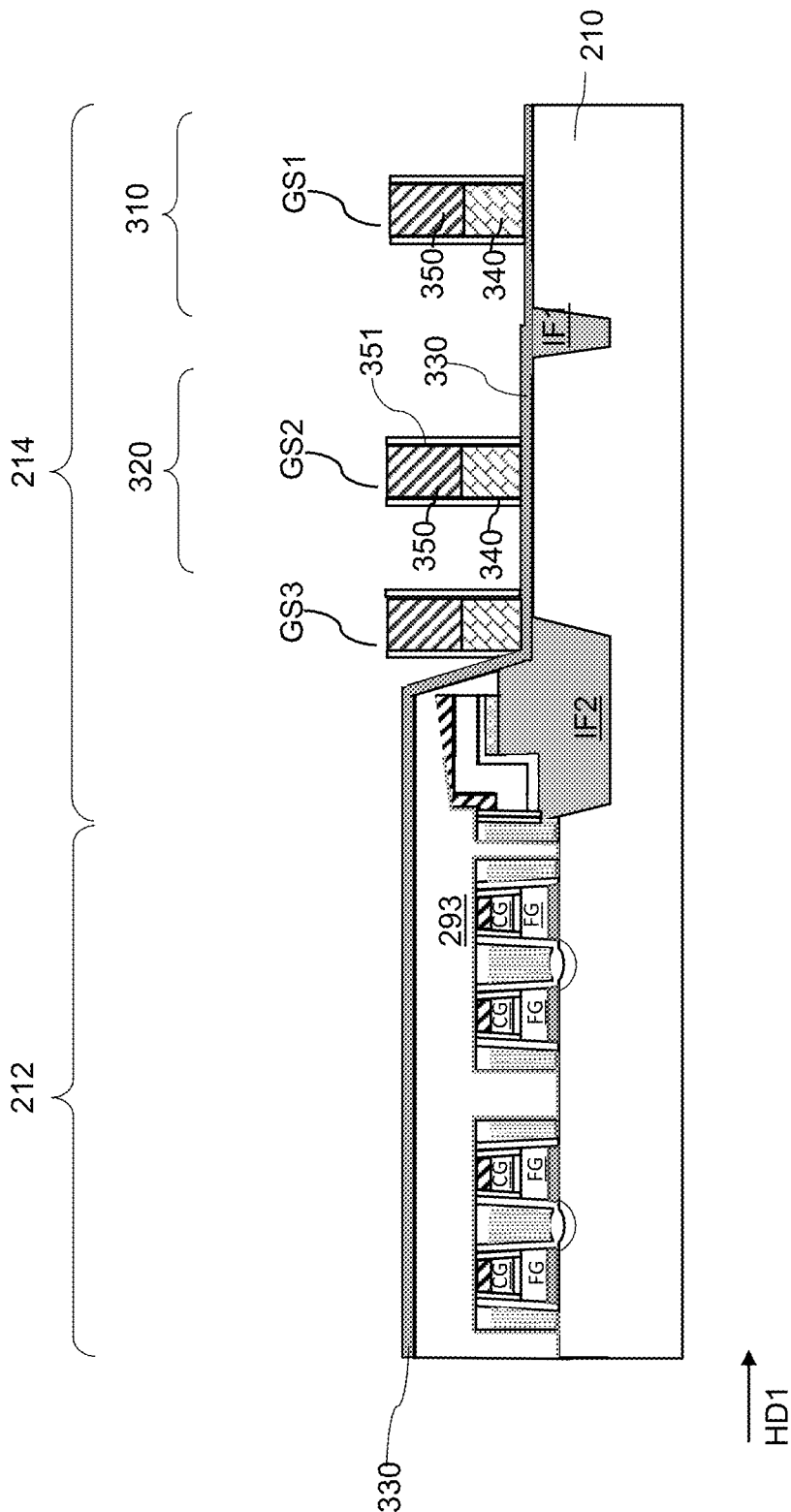
FIG. 43 is a vertical cross-section view of the exemplary intermediate structure showing gate stack side sealing layers over the side surfaces of the gate stacks according to various embodiments of the present disclosure.

FIG. 43 is a vertical cross-section view of the exemplary intermediate structure showing gate stack side sealing layers 351 over the side surfaces of the gate stacks GS1-GS3. Referring to FIG. 43, the gate stack side sealing layers 351 may include one or more dielectric materials over the exposed side surfaces of the hard mask layer 350 and the sacrificial gate material layer 340 in each of the gate stacks GS1-GS3. In one non-limiting embodiment, the gate stack side sealing layers 351 may include a nitride material, such as silicon nitride. In embodiments, the gate stack side sealing layers 351 may be formed by conformally depositing a layer of dielectric material over the intermediate structure, and performing an anisotropic etch process, such as a reactive ion etch process, to remove horizontally-extending portions of the dielectric material layer(s) while leaving the gate stack sealing layers 351 over the side surfaces of the gate stacks GS1-GS3.

Figure 44:
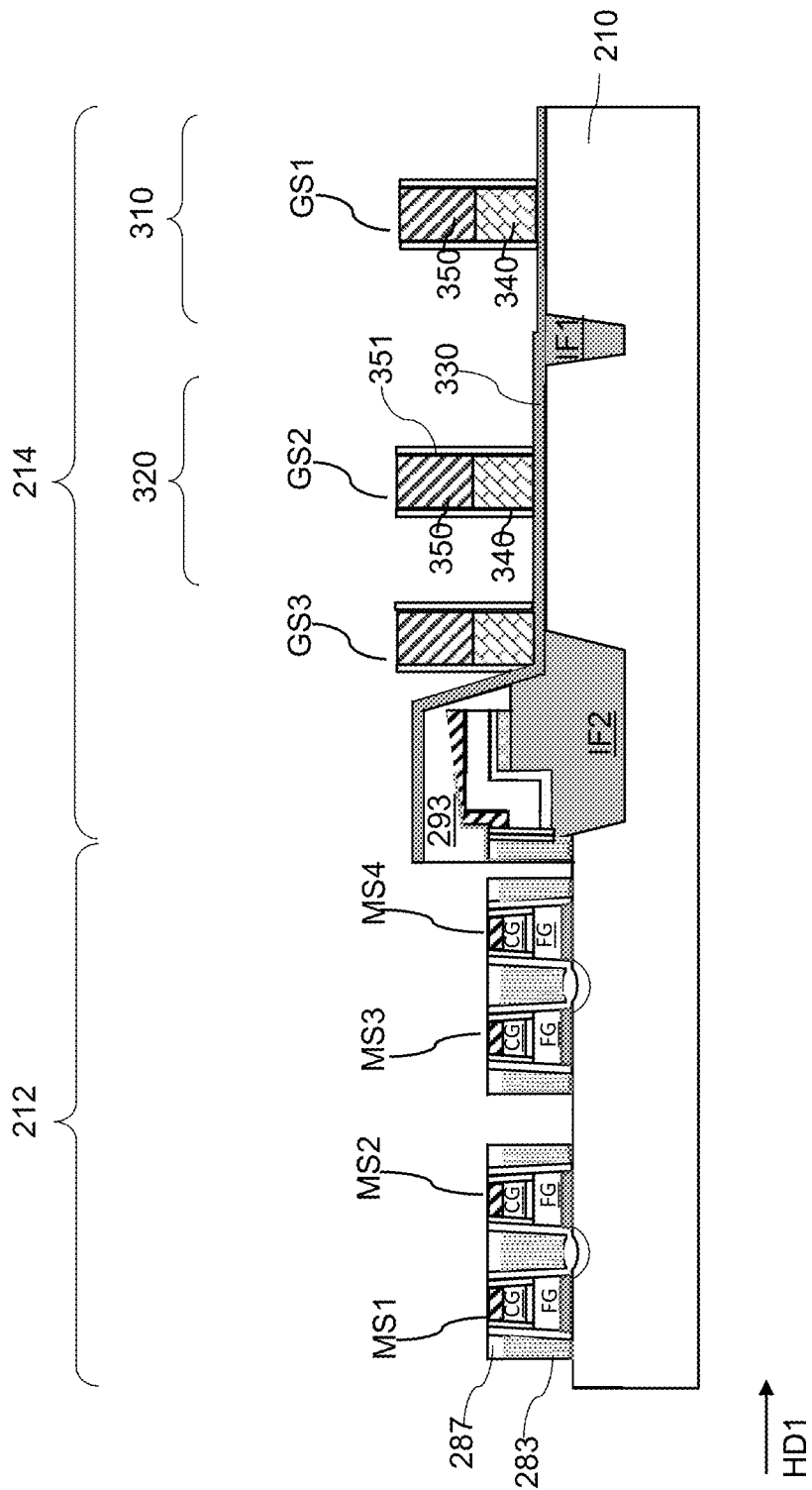
FIG. 44 is a vertical cross-section view of the exemplary intermediate structure following an etching process that removes the layer of gate dielectric material and the capping layer from the memory region according to various embodiments of the present disclosure.

FIG. 44 is a vertical cross-section view of the exemplary intermediate structure following an etching process that removes the layer of gate dielectric material 330 and the capping layer 293 from the memory region 212 of the exemplary intermediate structure. Referring to FIG. 44, an etching process may be performed to remove the layer of gate dielectric material 330 and the capping layer 293. In some embodiments, the etching process may also remove the liner layer 291 (see FIG. 30). During the etching process, the peripheral region 214 may be covered by a mask to prevent etching of the peripheral region. The etching process may expose the upper surfaces of the memory stacks MS1-MS4, the upper and side surfaces of the select gate hard mask layer 287, side surfaces of the conductive material layer 283, and upper surfaces of the substrate 210 in the memory region 212. In some embodiments, following the etching process, an ion implantation process may optionally be performed to form active regions (e.g., drain regions) in the substrate 210 between adjacent pairs of memory stacks MS1-MS4.

Figure 45:
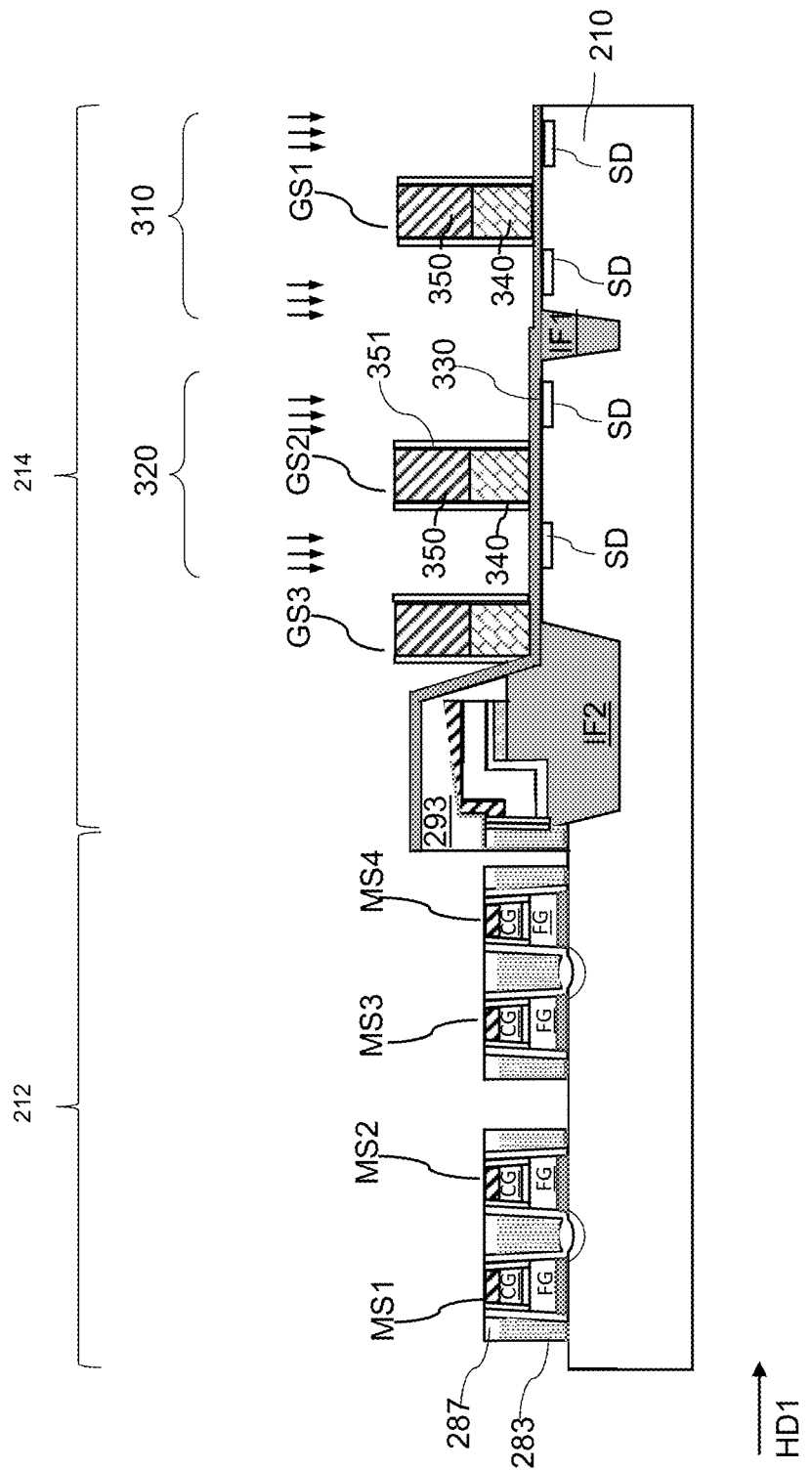
FIG. 45 is a vertical cross-section view of the exemplary intermediate structure schematically illustrating an ion implantation process for forming source and drain regions for logic transistors to be subsequently formed in the peripheral region according to various embodiments of the present disclosure.

FIG. 45 is a vertical cross-section view of the exemplary intermediate structure schematically illustrating an ion implantation process for forming source and drain regions SD for logic transistors to be subsequently formed in the peripheral region 214 of the exemplary intermediate structure. Referring to FIG. 45, one or more ion implantation processes may be performed in the peripheral region 214 to form active regions (i.e., source and drain regions SD) in the substrate 210 adjacent to the gate structures GS1, GS2. In embodiments, the one or more ion implantation processes may be masked implantation processes that may be performed through a patterned mask (not shown in FIG. 45).

Figure 46:
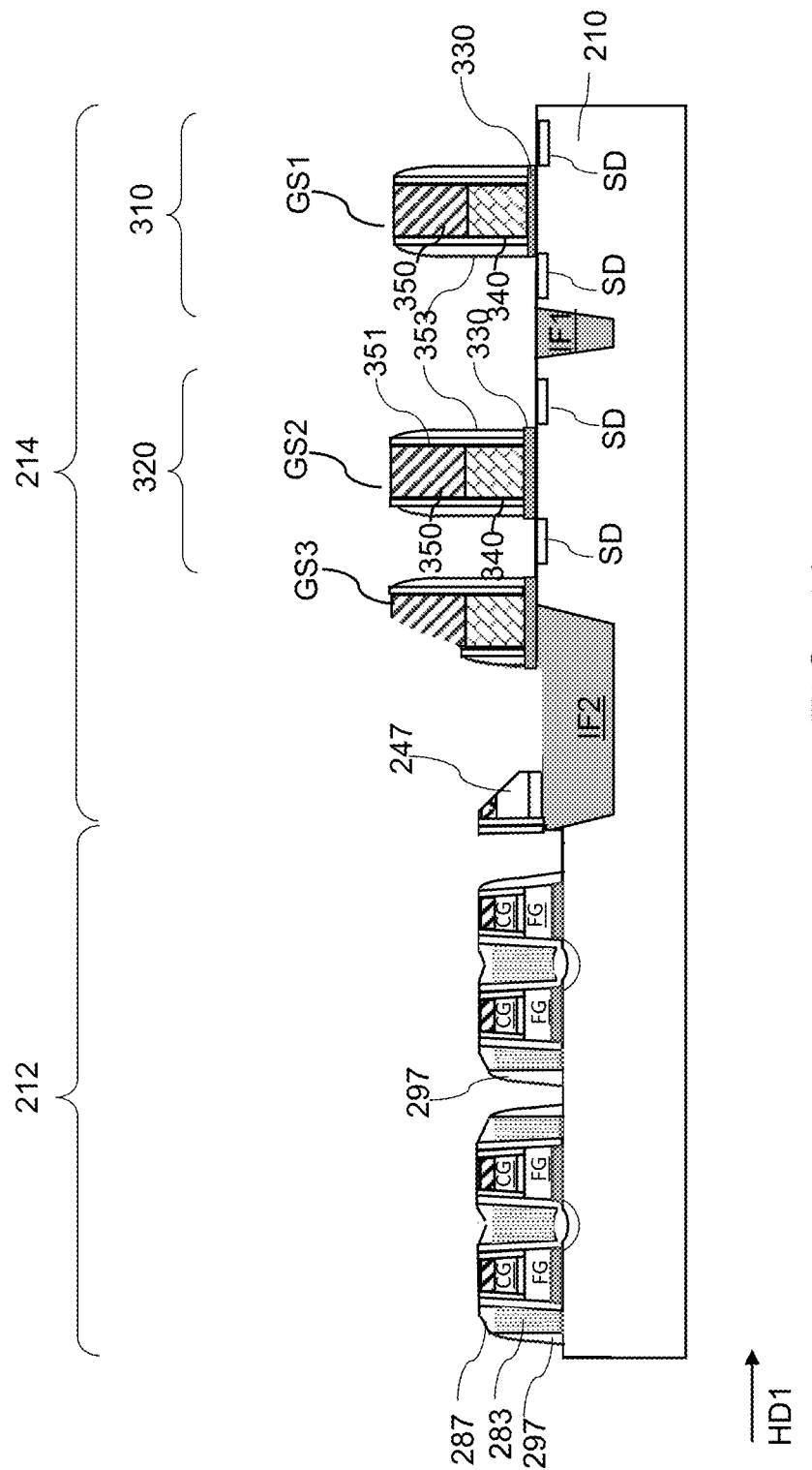
FIG. 46 is a vertical cross-section view of the exemplary intermediate structure following an etching process to remove portions of the layer of gate dielectric material from the peripheral region and the formation of main sidewall spacers over the select gates in the memory region and main sidewall spacers over the gate stacks in the peripheral region according to various embodiments of the present disclosure.

FIG. 46 is a vertical cross-section view of the exemplary intermediate structure following an etching process to remove portions of the layer of gate dielectric material 330 from the peripheral region 214 and the formation of main sidewall spacers 297 over the select gates SG in the memory region 212 and main sidewall spacers 353 over the gate stacks GS in the peripheral region 214. Referring to FIG. 46, an anisotropic etching process may be performed to remove exposed portions of the layer of gate dielectric material 330 from the peripheral region 214. Portions of the gate dielectric material 330 underlying the gate stacks GS1-GS3 may be protected from etching by the gate stacks GS1-GS3. Following the etching process, discrete gate dielectric layers 330 may be located beneath each of the gate stacks GS1-GS3.

Referring again to FIG. 46, an etching process may also be used to expose the upper surface of the second isolation feature IF2. In embodiments, the etching process may expose the upper surface of the second isolation feature IF2 in a central portion of the second isolation feature IF2. In peripheral portions of the second isolation feature IF2, the overlying materials may not be completely removed by the etching process and may form dummy (i.e., non-functional) structures over the surface of the second isolation feature IF2. As shown in FIG. 46, for example, gate stack GS3, which partially overlies the second isolation feature IF2 may be partially etched during the etching process. The partially-etched gate stack GS3 may form a dummy structure over the second isolation feature IF2. A second dummy structure, including a portion of the control gate layer 247, may be located over a peripheral region of the second isolation feature IF2 adjacent to the memory region 212.

Referring again to FIG. 46, a first plurality of main sidewall spacers 297 may be formed over the side surfaces of the select gates SG and the select gate hard mask layer 287 in the memory region 212, and a second plurality of main sidewall spacers 353 may be formed over side surfaces of the gate stacks GS in the peripheral region 214. The main sidewall spacers 297, 353 may be composed of a suitable dielectric material, such as silicon nitride, silicon oxide, silicon oxynitride, a high-k dielectric, combinations thereof, and the like. Other suitable dielectric materials are within the contemplated scope of disclosure. The first plurality of main sidewall spacers 297 and the second plurality of main sidewall spacers 353 may be formed of the same material(s) or of different material(s). The main sidewall spacers 297, 353 may be formed by any suitable method, such as CVD, plasma-enhanced chemical vapor deposition (PECVD) or LPCVD.

Figure 47:
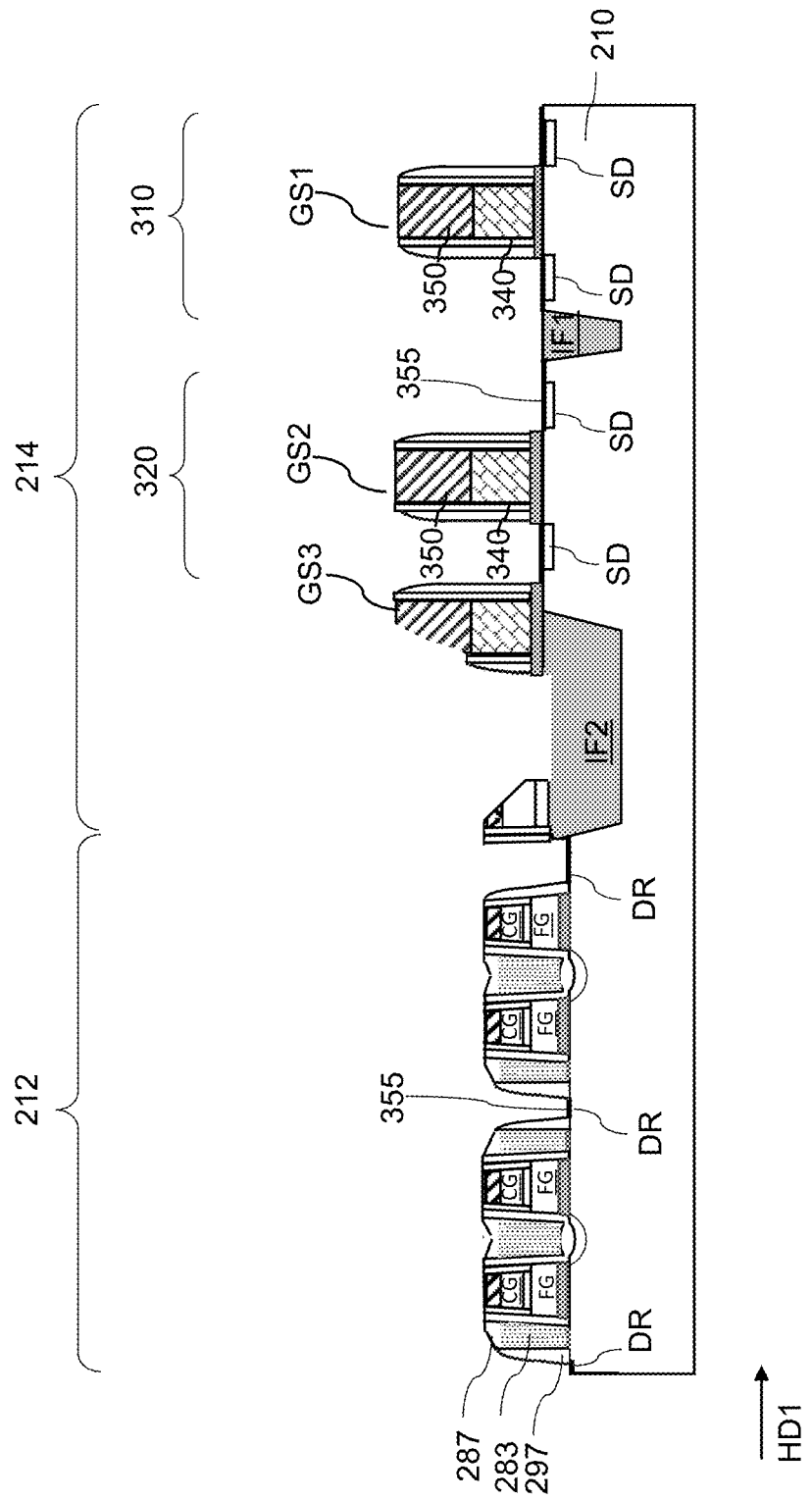
FIG. 47 is a vertical cross-section view of the exemplary intermediate structure showing metal silicide regions on exposed surfaces of the substrate according to various embodiments of the present disclosure.

FIG. 47 is a vertical cross-section view of the exemplary intermediate structure showing metal silicide regions 355 on exposed surfaces of the substrate 210. Referring to FIG. 47, a thin layer of metal, such as Ti, Ni, W, etc., may be deposited on the exposed upper surface of the substrate 210 in the memory region 212 and in the peripheral region 214. The metal may be heated to react the metal with the substrate and form metal silicide regions 355. The metal silicide regions 355 may be located above active (i.e., source and drain) regions of the substrate 210, and may provide an electrical contact layer to the respective source and drain regions DR, SD of the exemplary structure.

Figure 48:
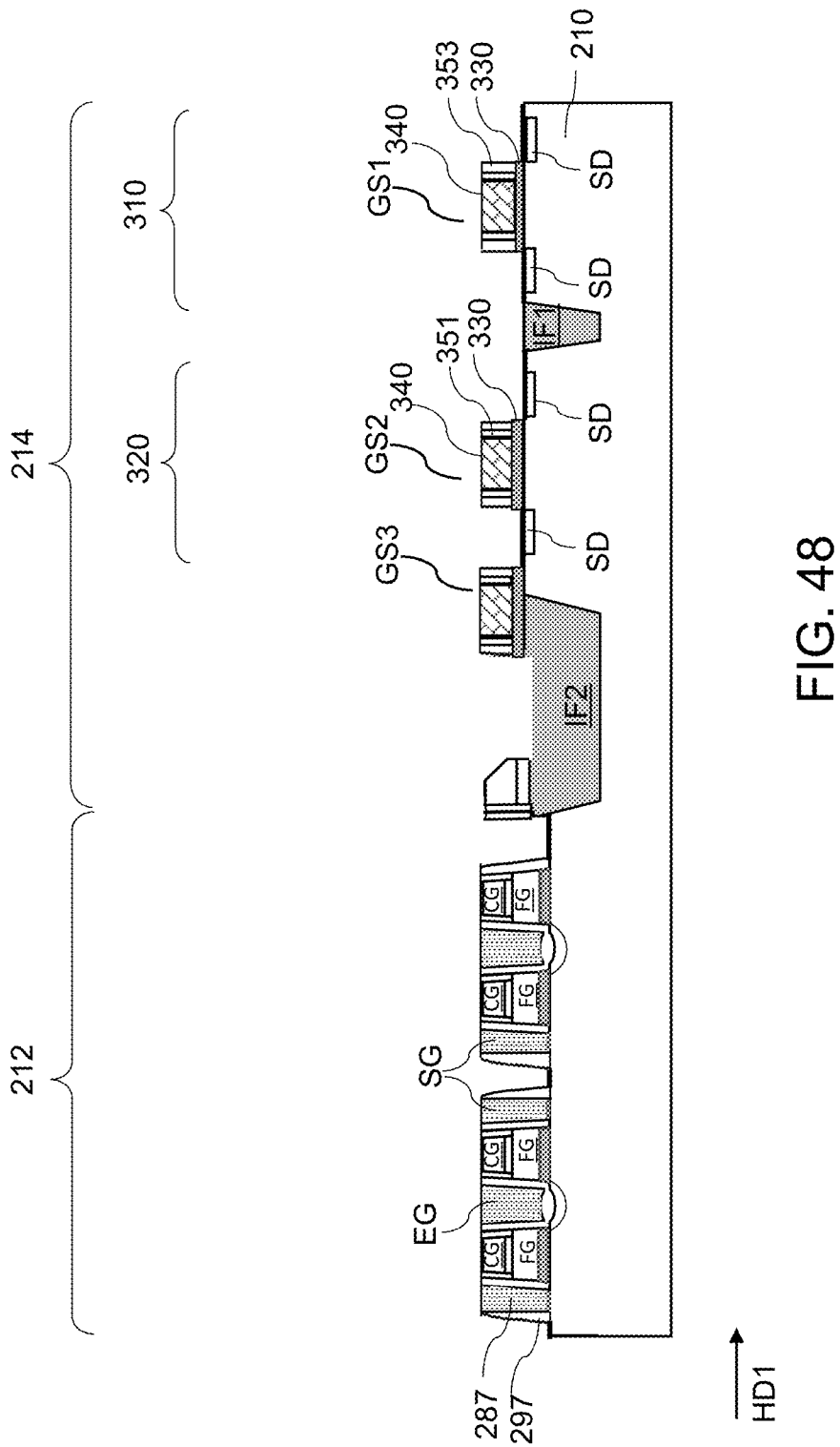
FIG. 48 is a vertical cross-section view of the exemplary intermediate structure following a planarization process that removes the remaining portions of the hard mask and the select gate hard mask layer from the memory region, and the remaining portions of the hard mask layer from the gate stacks in the peripheral region according to various embodiments of the present disclosure.

FIG. 48 is a vertical cross-section view of the exemplary intermediate structure following a planarization process that removes the remaining portions of the hard mask HM and the select gate hard mask layer 287 from the memory region 212, and the remaining portions of the hard mask layer 350 from the gate stacks GS1-GS3 in the peripheral region 214. Referring to FIG. 48, a planarization process, such as a CMP and/or etching process, may be performed to remove the remaining portions of the hard mask HM from the memory stacks MS1-MS4, the select gate hard mask layer 287 from over the select gates SG and the erase gates EG, and the hard mask layer 350 from the gate stacks GS1-GS3. Following the planarization process, the upper surfaces of the control gates CG, the select gates SG and the erase gates EG may be exposed in the memory region 212, and the upper surfaces of the sacrificial gate material layers 340 may be exposed in the peripheral region 214. In various embodiments, the upper surfaces of the control gates CG, the select gates SG, the erase gates EG, and the sacrificial gate material layers 340 may be substantially co-planar.

Figure 49:
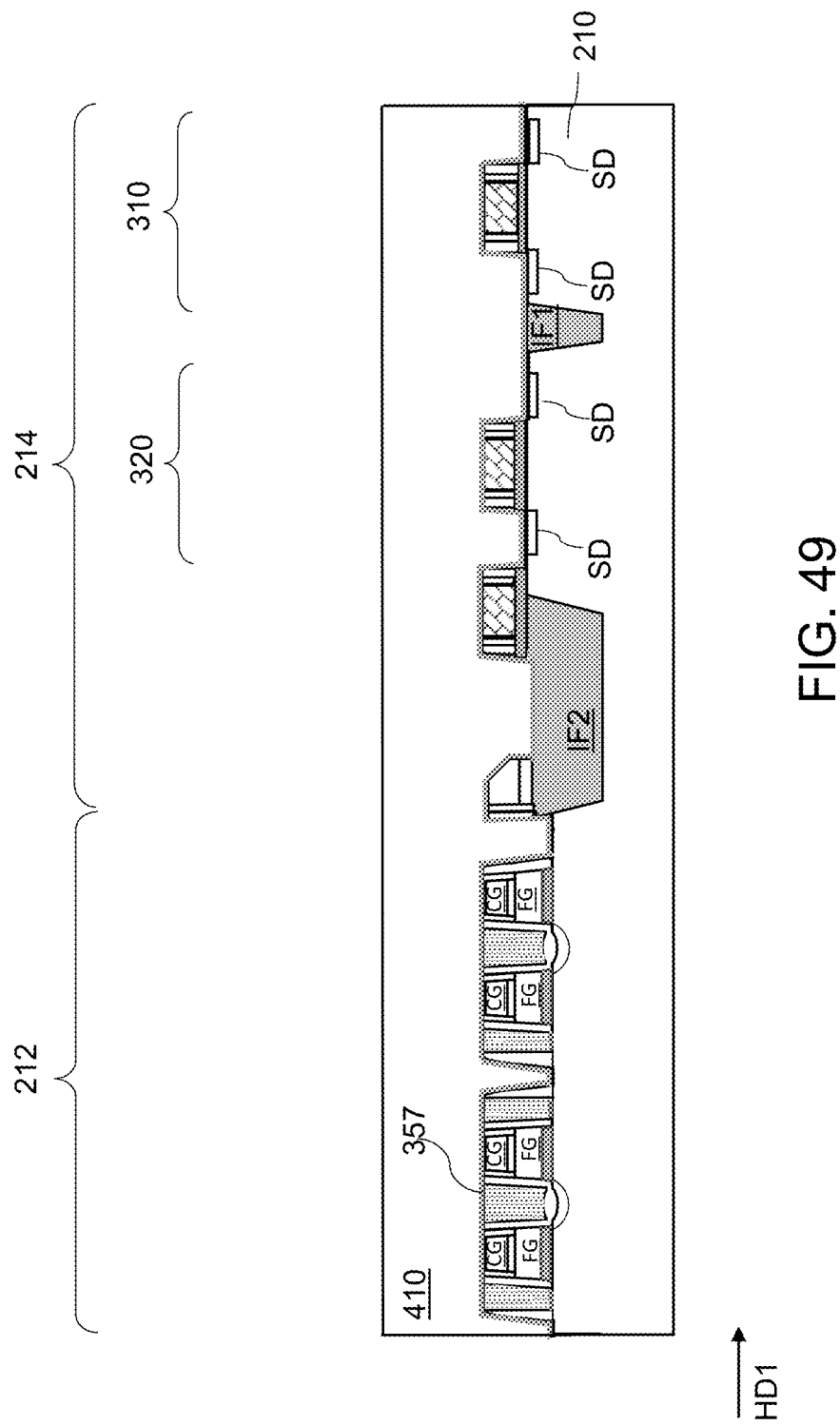
FIG. 49 is a vertical cross-section view of the exemplary intermediate structure showing a contact etch stop layer (CESL) conformally formed over the intermediate structure, and an inter-level dielectric (ILD) layer formed over the CESL according to various embodiments of the present disclosure.

FIG. 49 is a vertical cross-section view of the exemplary intermediate structure showing a contact etch stop layer (CESL) 357 conformally formed over the intermediate structure, and an inter-level dielectric (ILD) layer 410 formed over the CESL 357. Referring to FIG. 49, the CESL 357 and ILD layer 410 may each be composed of a suitable dielectric material, such as silicon oxide, silicon nitride, silicon carbide, phosphosilicate glass (PSG), undoped silicate glass (USG), a doped silicate glass, organosilicate glass, amorphous fluorinated carbon, porous variants thereof, or combinations thereof. Other dielectric materials are within the contemplated scope of disclosure. In various embodiments, CESL 357 may be composed of a different dielectric material than ILD layer 410. In some embodiments, CESL 357 may be an etch stop layer having different etch characteristics (i.e., a higher etch resistivity) than the material of the ILD layer 410. In one non-limiting embodiment, the ILD layer 410 may include phosphosilicate glass (PSG), and the CESL 357 may include silicon nitride. The CESL 357 and ILD layer 410 may each be deposited using suitable deposition methods as described above.

Figure 50:
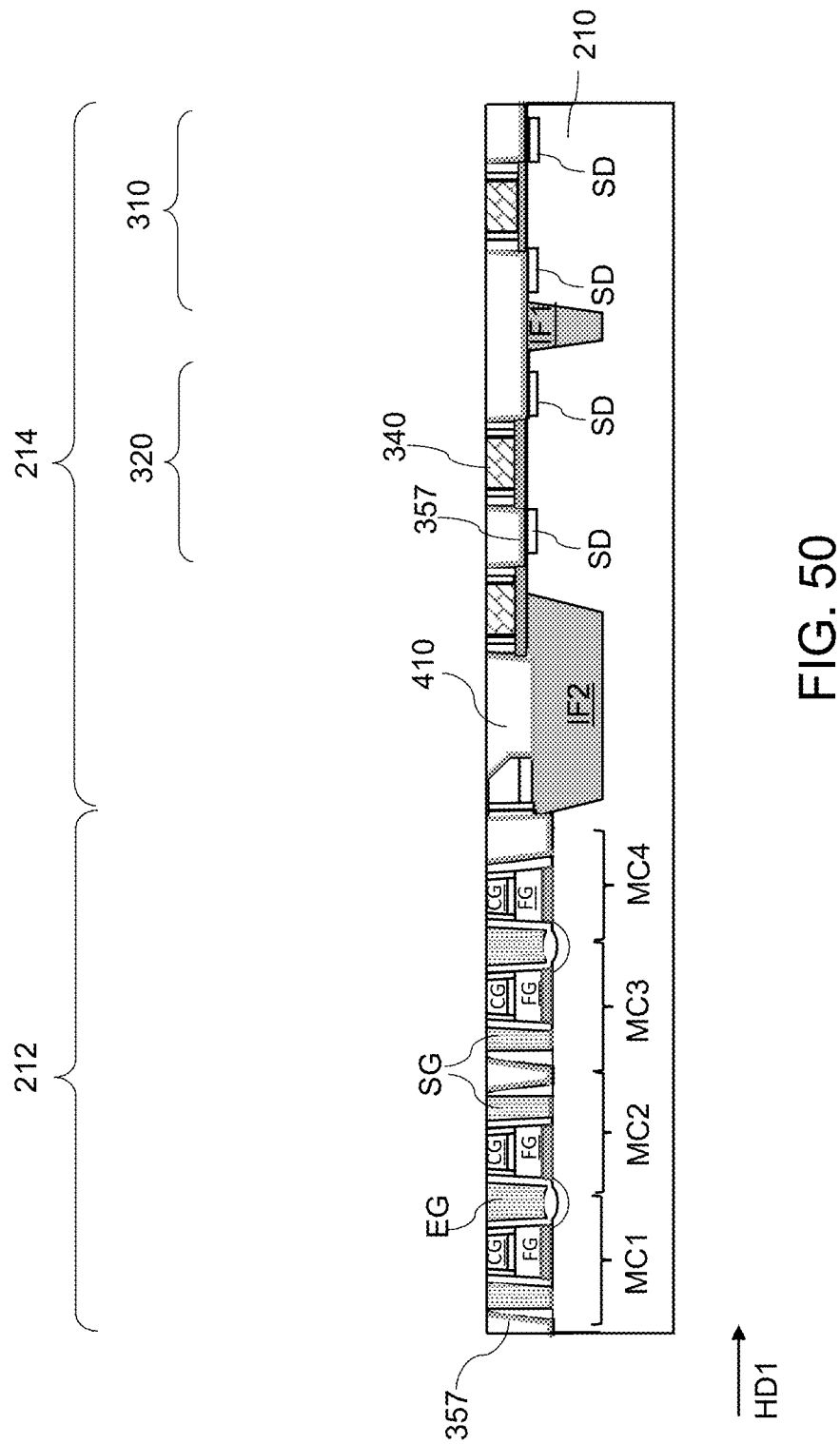
FIG. 50 is a vertical cross-section view of the exemplary intermediate structure following a planarization process that removes the ILD layer and the CESL from above the upper surfaces of the control gates, select gates and erase gates in the memory region and from above the upper surfaces of the sacrificial gate material layers in the peripheral region according to various embodiments of the present disclosure.

FIG. 50 is a vertical cross-section view of the exemplary intermediate structure following a planarization process that removes the ILD layer 410 and the CESL 357 from above the upper surfaces of the control gates CG, select gates SG and erase gates EG in the memory region 212 and from above the upper surfaces of the sacrificial gate material layers 340 in the peripheral region 214. Referring to FIG. 50, a planarization process, such as a CMP and/or etching process, may be performed to remove portions of the ILD layer 410 and the CESL 357. Following the planarization process, the upper surfaces of the control gates CG, the select gates SG and the erase gates EG may be exposed in the memory region 212, and the upper surfaces of the sacrificial gate material layers 340 may be exposed in the peripheral region 214. In various embodiments, the upper surfaces of the control gates CG, the select gates SG, the erase gates EG, and the sacrificial gate material layers 340 may be substantially co-planar.

FIG. 50 additionally illustrates the structure of memory cells MC1-MC4 within the memory region 212 of the exemplary structure. As discussed above, each functional memory cell MC in the memory region 212 may include a select gate SG, a floating gate FG, a control gate CG, and an erase gate EG that may be shared with an adjoining memory cell MC. In some embodiments, at least some of the memory cells MC may be dummy (i.e., non-functional) memory cells, including at least some of the memory cells that are adjacent to the peripheral region 214. As shown in FIG. 50, for example, memory cell MC4 does not include a select gate SG and may be a dummy (i.e., non-functional) memory cell.

Figure 51:
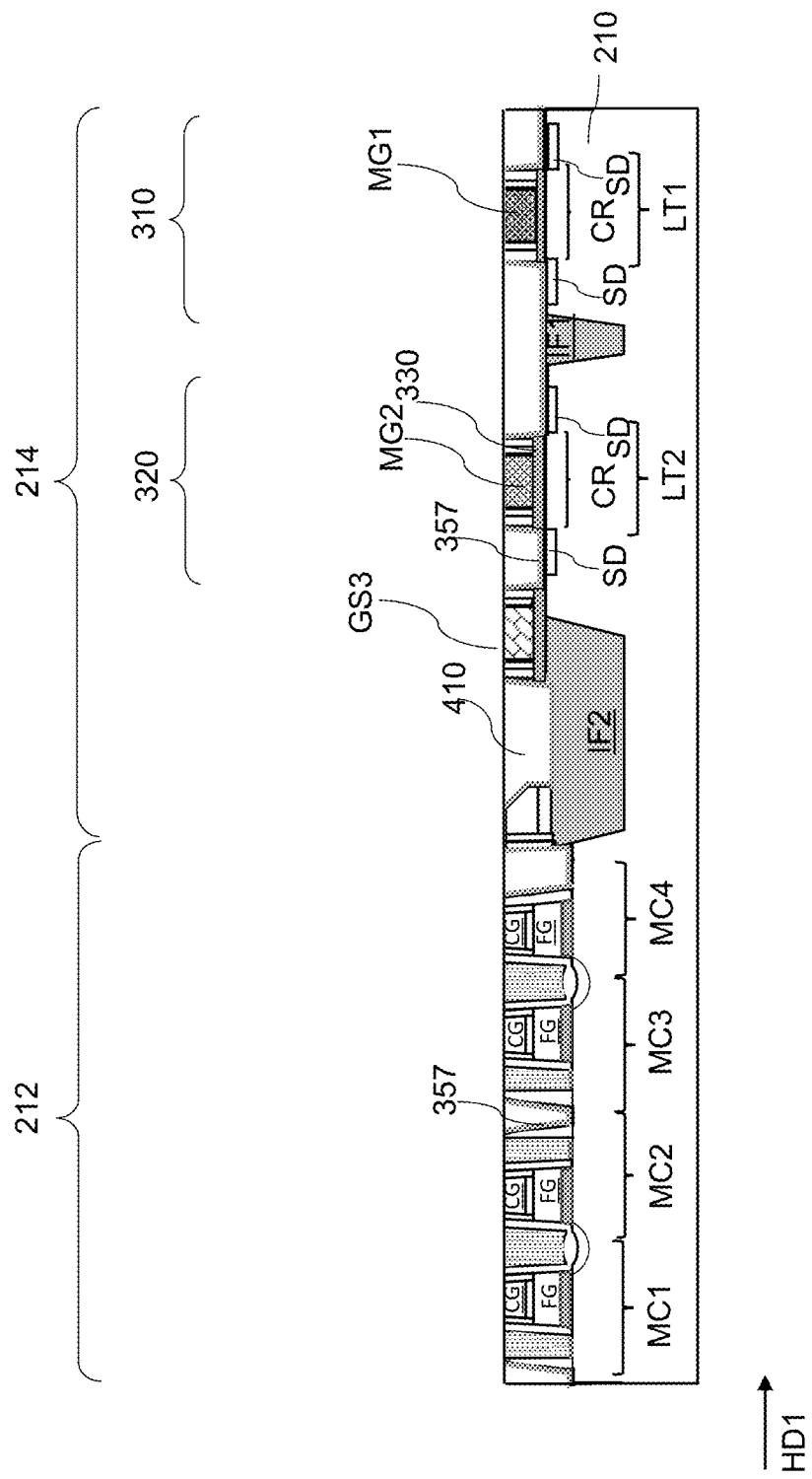
FIG. 51 is a vertical cross-section view of the exemplary intermediate structure showing metal gates formed in the peripheral region according to various embodiments of the present disclosure.

FIG. 51 is a vertical cross-section view of the exemplary intermediate structure showing metal gates MG1, MG2 formed in the peripheral region 214. Referring to FIG. 51, an etching process may be performed to remove the sacrificial gate material layers 340 from the gate stacks GS1 and GS2 in the peripheral region 214. In various embodiments, the etching process may be performed through a patterned mask (not shown in FIG. 51) that includes openings corresponding to the locations of the gate stacks GS1 and GS2. Following the etching process to remove the sacrificial gate material layers 340, the patterned mask may be removed. A layer of a metal material may then be deposited to fill the openings formed in the gate stacks GS1, GS2, and a planarization process (e.g., a CMP process) may be used to remove any excess metal material from above the openings, leaving metal gates MG1, MG2 in the respective gate stacks GS1, GS2. The metal gates MG1, MG2 may be composed of a suitable metallic material, such as aluminum (Al), tantalum (Ta), tungsten (W), titanium (Ti), ruthenium (Ru), titanium nitride (TiN), tantalum nitride (TaN), tungsten nitride (WN), alloys thereof, combinations thereof, and the like. Other suitable metallic materials are within the contemplated scope of disclosure. In some embodiments, each of the metal gates MG may be composed of the same material. Alternatively, different materials may be used in different gate stacks GS1, GS2 in the peripheral region 214.

FIG. 51 additionally illustrates the structure of logic transistors LT1, LT2 within the peripheral region 214 of the exemplary structure. As discussed above, each functional logic transistor LT in the peripheral region may include a metal gate MG over a channel region CR of the substrate 210. A layer of gate dielectric material 330 may be disposed between the metal gate MG and the channel region CR. Source and drain regions SD may be located on either side of the metal gate MG. The logic transistors LT1, LT2 in the peripheral region 214 may form logic devices, such as memory selectors, power gates and input/output elements. As discussed above, different logic transistors LT in different areas of the peripheral region 214 may have different structures and/or perform different functions. For example, in the embodiment shown in FIG. 51, logic transistor LT1 in area 310 may be a logic transistor and logic transistor LT2 in area 320 may be a high-voltage logic transistor.

In some embodiments, at least some of the gate structures in the peripheral region may be dummy (i.e., non-functional) gate structures, including at least some of the gate structures that are adjacent to the peripheral region 214. As shown in FIG. 51, for example, gate structure GS3 does not include a metal gate and may be a dummy (i.e., non-functional) gate structure.

Figure 52:
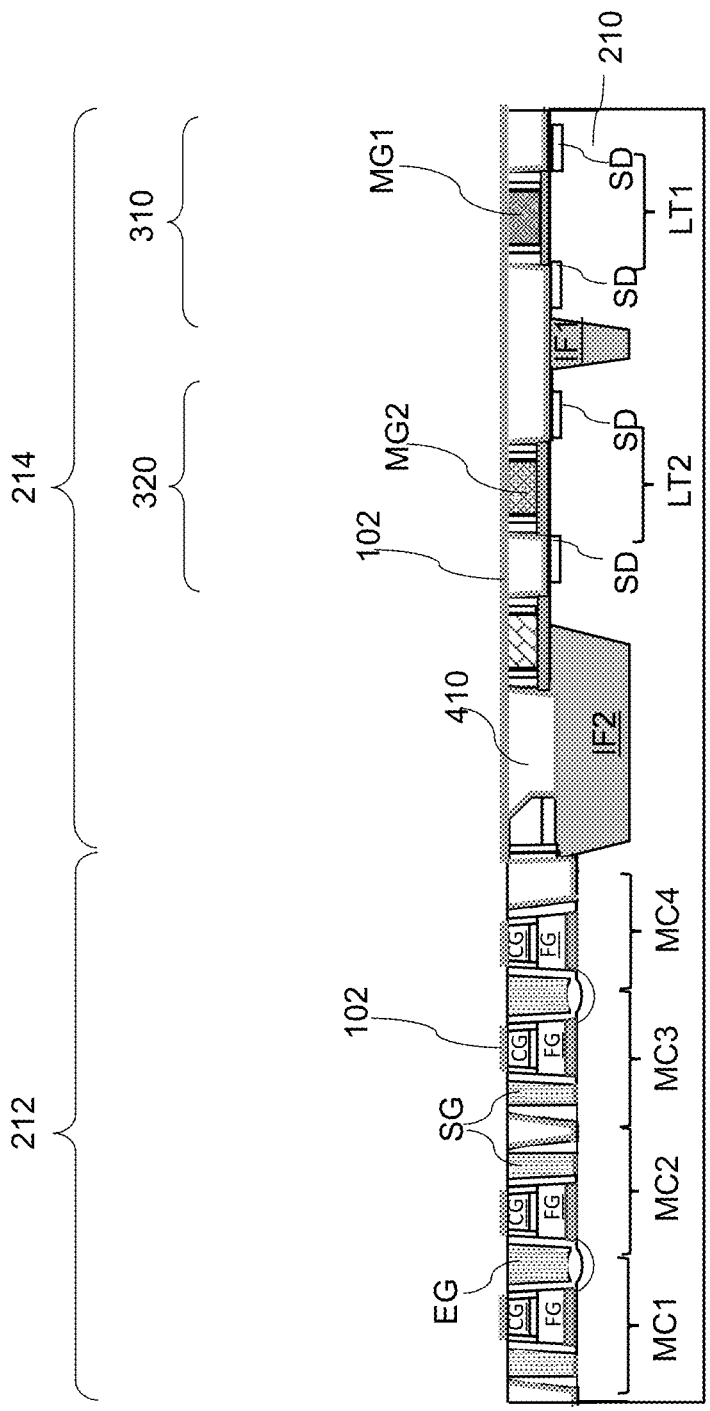
FIG. 52 is a vertical cross-section view of the exemplary intermediate structure showing a first layer of dielectric material over the peripheral region and over the control gates of the memory cells in the memory region according to various embodiments of the present disclosure.

FIG. 52 is a vertical cross-section view of the exemplary intermediate structure showing a first layer of dielectric material 102 over the peripheral region 214 and over the control gates CG of the memory cells MC in the memory region 212. Referring to FIG. 52, in some embodiments a continuous first layer of dielectric material 102 may be deposited over the exemplary intermediate structure, including over the upper surfaces of the logic transistors LT in the peripheral region 214 and over the upper surfaces of the memory cells MC in the memory region 212. In some embodiments, the first layer of dielectric material 102 may be patterned to remove portions of the layer 102 in the memory region 212. For example, a patterned mask, such as a photoresist mask (not shown in FIG. 52) may be formed over the continuous first layer of dielectric material 102. The mask may be lithographically patterned such that the mask covers selected portions of the first layer of dielectric material 102, including portions of the first layer of dielectric material 102 overlying the peripheral region 214 and portions of the first layer of dielectric material 102 overlying the control gates CG of the memory cells MC. An anisotropic etching process may be performed to remove portions of the first layer of dielectric material 102 that are exposed through the mask. The etching process may expose portions of the memory region 212, including the upper surfaces of the select gates SG and the erase gates EG of the memory cells MC, through the first layer of dielectric material 102. Following the etching process, the mask may be removed using a suitable process, such as by ashing or dissolution using a solvent.

The first layer of dielectric material 102 may be composed of a suitable dielectric material, such as an oxide or nitride material (e.g., silicon oxide, silicon nitride, silicon oxynitride, etc.). In some embodiments, the first layer of dielectric material 102 may be composed of silicon oxide formed using a tetraethoxysilane (TEOS) precursor. In some embodiments, the first layer of dielectric material 102 may be a resist protective oxide (RPO) material. Other suitable dielectric materials are within the contemplated scope of disclosure. In some embodiments, the first layer of dielectric material 102 may have good adherence properties, including good adherence to the material(s) of the metal gates MG of the logic transistors LT1, LT2. The first layer of dielectric material 102 may be deposited using a suitable deposition method as discussed above.

Figure 53:
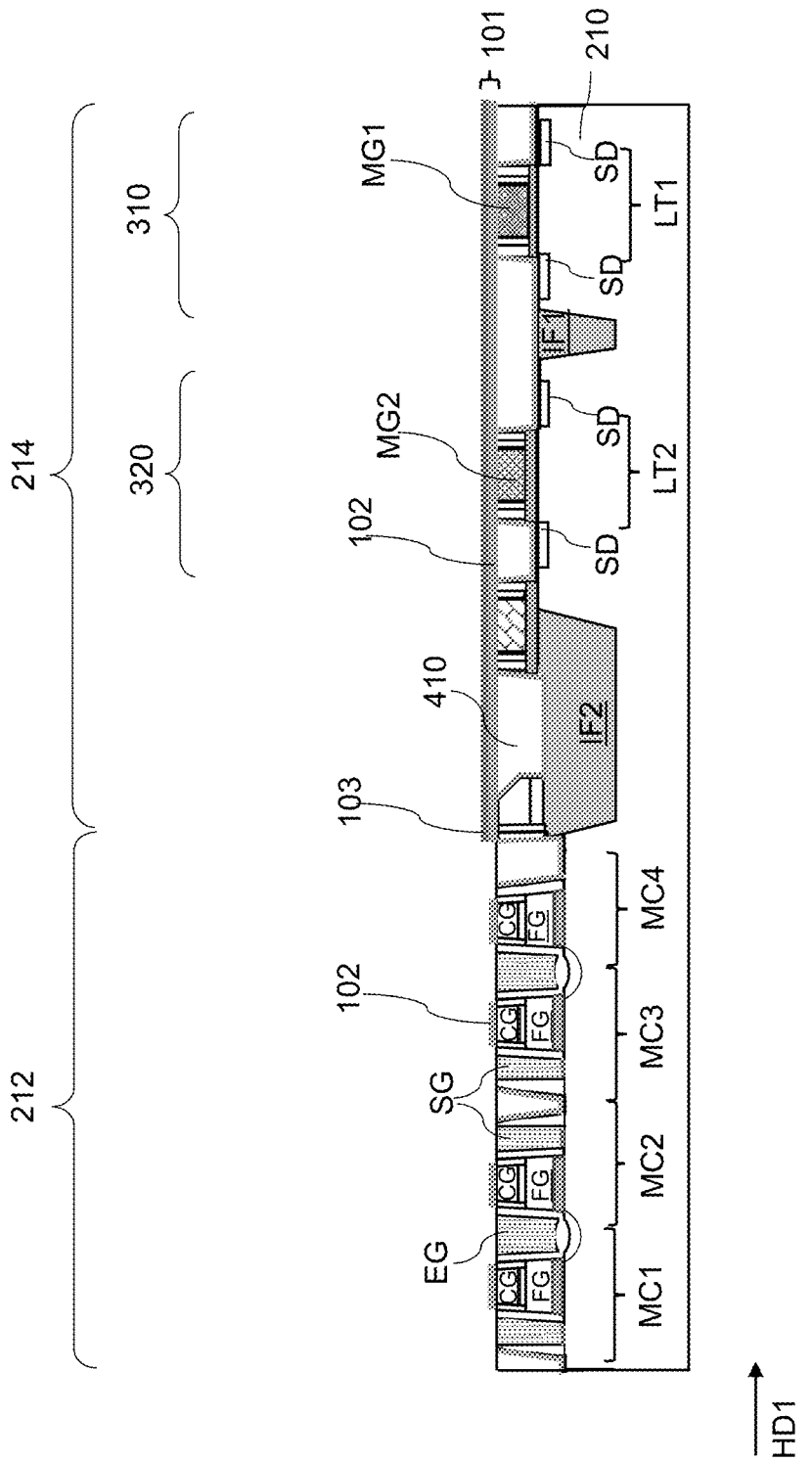
FIG. 53 is a vertical cross-section view of the exemplary intermediate structure showing a second layer of dielectric material over the first layer of dielectric material in the peripheral region according to various embodiments of the present disclosure.

FIG. 53 is a vertical cross-section view of the exemplary intermediate structure showing a second layer of dielectric material 103 over the first layer of dielectric material 102 in the peripheral region 214. Referring to FIG. 53, a multi-layer composite dielectric film structure 101 may be formed in the peripheral region 214 of the exemplary intermediate structure by depositing at least one additional layer of dielectric material 103 over the first layer of dielectric material 102. In some embodiments, a continuous second layer of dielectric material 103 may be deposited over the exemplary intermediate structure. A patterned mask, such as a photoresist mask (not shown in FIG. 53) may be formed over the continuous second layer of dielectric material 103 as described above. The patterned mask may cover the second layer of dielectric material 103 in the peripheral region 214 and may expose the second layer of dielectric material 103 in the memory region 212. An etching process may remove the second layer of dielectric material 103 from the memory region 212, while the second layer of dielectric material 103 may be located over the first layer of dielectric material 102 in the peripheral region 214 to form a composite dielectric film structure 101 in the peripheral region 214. In embodiments, the composite dielectric film structure 101 may extend continuously over the peripheral region 214, including over the metal gates MG of the logic transistors LT. Following the etching process, the mask may be removed using a suitable process, such as by ashing or dissolution using a solvent.

The second layer of dielectric material 103 may be composed of a suitable dielectric material, such as an oxide or nitride material (e.g., silicon oxide, silicon nitride, silicon oxynitride, etc.). In some embodiments, the second layer of dielectric material 103 may be composed of a buffer oxide material, a silicon nitride material, a high-temperature oxide (HTO) material, and the like. Other suitable dielectric materials are within the contemplated scope of disclosure. The second layer of dielectric material 103 may have a different composition and/or different physical characteristics than the first layer of dielectric material 102. In various embodiments, the second layer of dielectric material 103 may have a density that is greater than a density of the first layer of dielectric material 102. For example, the second layer of dielectric material 103 may have a density that is at least 10%, such as at least 50%, including at least 100% greater than a density of the first layer of dielectric material 102. In some embodiments, the second layer of dielectric material 103 may have lower etch rate (i.e., higher etch resistance) than the material of the first layer of dielectric material 102. The second layer of dielectric material 103 may be deposited using a suitable deposition method as discussed above.

Figure 54:
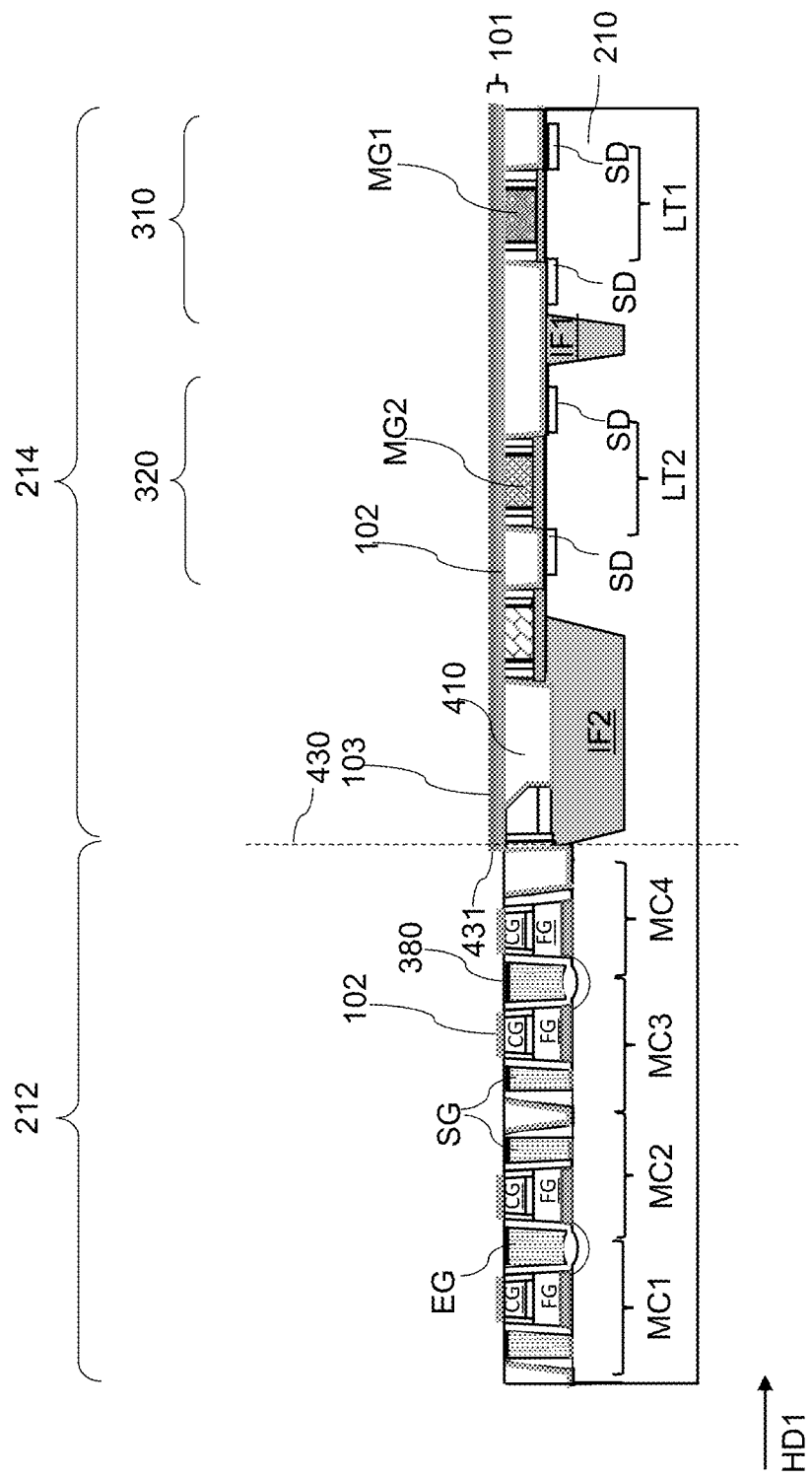
FIG. 54 is a vertical cross-section view of the exemplary intermediate structure showing metal silicide layers over the upper surfaces of the select gates and the erase gates in the memory region according to various embodiments of the present disclosure.

FIG. 54 is a vertical cross-section view of the exemplary intermediate structure showing metal silicide layers 380 over the upper surfaces of the select gates SG and the erase gates EG in the memory region 212. Referring to FIG. 54, a silicidation process may be performed to form metal silicide layers 380 over the upper surfaces of the select gates SG and the erase gates EG of the memory cells MC in the memory region 212 of the exemplary intermediate structure. In various embodiments, a thin layer of a metal material, such as Co, Ni, Ti, Ta, W, alloys thereof, or the like, may be deposited over the exposed surfaces of the select gates SG and the erase gates EG. The metal may be heated to react the metal with the silicon material of the select gates SG and the erase gates EG to form metal silicide layers 380 over the upper surfaces of the select gates SG and the erase gates EG. In one non-limiting example, the metal may be annealed at a temperature in the range of 750-1000° C. for 1-2 hours. Alternatively, the metal may be laser annealed for microseconds to seconds, depending on the power of the laser. During the silicidation process, the control gates CG may be protected by the first layer of dielectric material 102 so that metal silicide layers are not formed over the control gates CG.

Following the formation of metal silicide layers 380 over the select gates SG and erase gates EC, an etching process, such as a wet etch, may be performed to remove any excess metal from the exemplary intermediate structure. During the etching process, the composite dielectric film structure 101 may protect the metal gates MG in the peripheral region 214 from being etched. As discussed above, a composite dielectric film structure 101 over the peripheral region 214 may provide improved protection of the metal gates MG. In particular, weak spots in the first layer of dielectric material 102, such as weak spots due to the presence of metal precipitates from the metal gates MG, may not result in etching damage to the underlying metal gates MG due to the presence of a multi-layer composite dielectric film structure 101 as shown in FIG. 54.

In various embodiments, a peripheral edge 431 of the composite dielectric film structure 101 may be located within ±300 nm (e.g., ±200 nm, such as ±100 nm) of the boundary 430 between the memory region 212 and the peripheral region 214. This may avoid the composite dielectric film structure 101 extending too far into the memory region 212, which may interfere with the silicidation process as described above, or the composite dielectric film structure 101 not extending far enough within the peripheral region 214, which may result in insufficient protection for the metal gates MG of the logic transistors LT.

FIG. 55 is a vertical cross-section view of the exemplary intermediate structure showing an inter-level dielectric (ILD) layer 412 over the intermediate structure, metal features 112 over the ILD layer 412, and conductive vias 110 extending between the metal features 112 and the memory cells MC and the logic transistors LT. Referring to FIG. 55, the ILD layer 412 may be composed of a suitable dielectric material, such as silicon oxide, silicon nitride, silicon carbide, phosphosilicate glass (PSG), undoped silicate glass (USG), a doped silicate glass, organosilicate glass, amorphous fluorinated carbon, porous variants thereof, or combinations thereof. Other dielectric materials are within the contemplated scope of disclosure. The ILD layer 412 may be deposited using a suitable deposition process as described above. In embodiments, a planarization process may be used to provide a planar upper surface of the ILD layer 412.

Referring again to FIG. 55, the conductive vias 110 may be formed by forming via openings through ILD layers 410 and 412, and through the composite dielectric film structure 101 in the peripheral region 214, using an anisotropic etch process. In the memory region 212, the via openings may extend to the CESL 357 overlying each of the drain regions DR of the memory cells MC. In the peripheral region 214, the via openings may extend to the CESL 357 overlying each of the source and drain regions SD of the logic transistors. The via openings may be extended through the CESL 357 via an etching process to expose the contact regions 355 (see FIG. 47) overlying each of the respective source and drain regions DR, SD. Then, the via openings may be filled with a conductive material, such as Cu, Ni, Ti, W, Al, alloys thereof, and the like, to form the conductive vias 110 contacting the respective source and drain region DR, SD.

Metal features 112, such as conductive lines, may be formed over the ILD layer 412, and may contact one or more conductive vias 110. In some embodiments, the metal features 112 may be at least partially embedded within ILD layer 412 such that a bottom surface of the metal features 112 may be below an upper surface of the ILD layer 412. In some embodiments, a distance between the bottom surface of a metal feature 112 that is embedded in the ILD layer 412 and the upper surface of the ILD layer 412 may be ≤30 nm.

Figure 56:
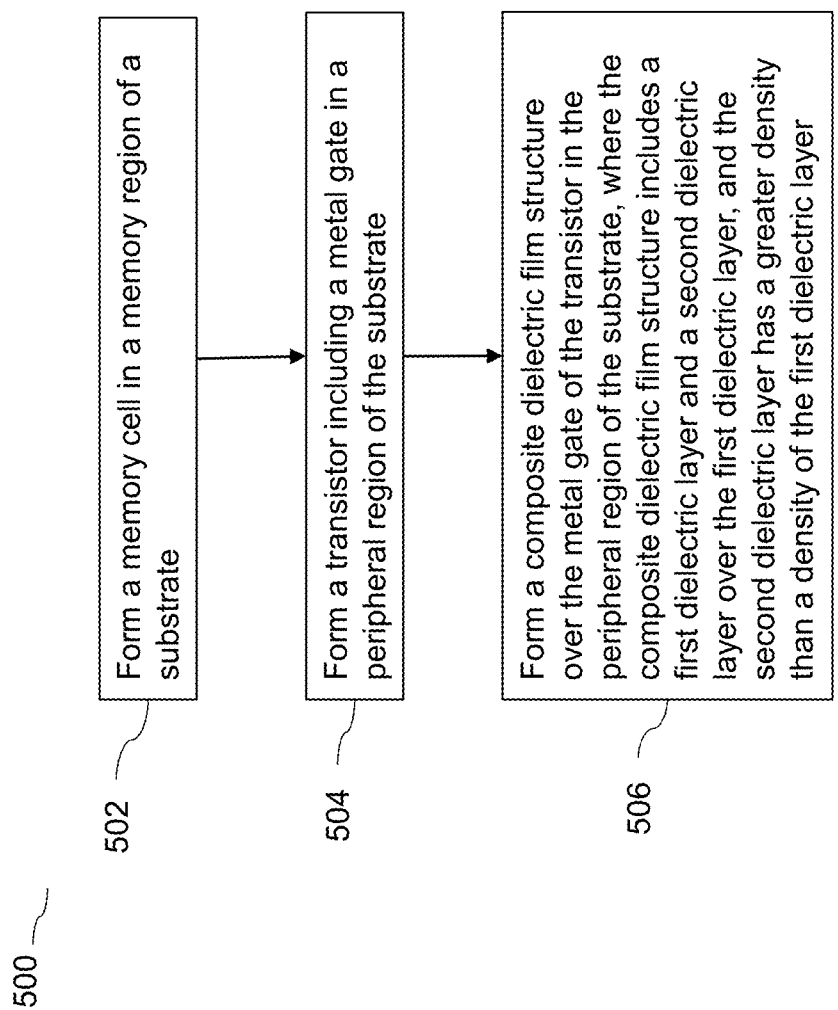
FIG. 56 is a flow diagram that illustrates a general method of making a memory device according to various embodiments of the present disclosure.

FIG. 56 is a flow diagram that illustrates a general method 500 of making a memory device 100 according to various embodiments of the present disclosure. Referring to FIGS. 2-51 and 56, in step 502 of method 500, a memory cell MC may be formed in a memory region 212 of a substrate 210. Referring to FIGS. 2-51 and 56, in step 504 of method 500, a transistor LT including a metal gate MG may be formed in a peripheral region 214 of the substrate 210. Referring to FIGS. 52-54 and 56, in step 506 of method 500, a composite dielectric film structure 101 may be formed over the metal gate MG of the transistor LT in the peripheral region 214 of the substrate 210. The composite dielectric film structure 101 may include a first dielectric layer 102 and a second dielectric layer 103 over the first dielectric layer 102, where the second dielectric layer 103 may have a greater density than a density of the first dielectric layer 102.

Referring to all drawings and according to various embodiments of the present disclosure, a semiconductor device 100 includes a substrate 210 that includes a memory region 212 and a peripheral region 214, a transistor LT including a metal gate MG located in the peripheral region 214, a composite dielectric film structure 101 located over the metal gate MG of the transistor LT, the composite dielectric film structure 101 including a first dielectric layer 102 and a second dielectric layer 103 over the first dielectric layer 102, where the second dielectric layer 103 has a greater density than a density of the first dielectric layer 103, and at least one memory cell MC located in the memory region 212.

In an embodiment, the first dielectric layer 102 contacts an upper surface of the metal gate MG of the transistor LT.

In another embodiment, each of the first dielectric layer 102 and the second dielectric layer 103 have a thickness that is between 5 nm and 30 nm.

In another embodiment, the first dielectric layer 102 is composed of a dielectric material including at least one of silicon oxide formed using a tetraethoxysilane (TEOS) precursor, and a resist protective oxide (RPO) material.

In another embodiment, the second dielectric layer 103 is composed of a dielectric material including at least one of a buffer oxide material, a silicon nitride material, and a high-temperature oxide (HTO) material.

In another embodiment, a lower surface of the composite dielectric film structure 101 is co-planar with an upper surface of the at least one memory cell MC.

In another embodiment, the at least one memory cell MC includes a floating gate FG, a control gate CG located above the floating gate FG, and a select gate SG located on a first side of the floating gate FG and the control gate CG, where the lower surface of the composite dielectric film structure 101 is co-planar with an upper surface of the control gate CG.

In another embodiment, the at least one memory cell further includes an erase gate EG located on a second side of the floating gate FG and the control gate CG, wherein a metal silicide layer 380 is located on an upper surface of the select gate SG and on an upper surface of the erase gate EG.

In another embodiment, the semiconductor device 100 includes a plurality of transistors LT including a metal gate MG located in the peripheral region 214 and a plurality of memory cells MC located in the memory region 212, and the composite dielectric film structure 101 is located over the metal gates MG of the plurality of transistors LT located in the peripheral region 214, and the composite dielectric film structure 101 is not located over the memory cells MC located in the memory region 212.

An additional embodiment is drawn to a semiconductor device 100 that includes a substrate 210 including a memory region 212 and a peripheral region 214, a plurality of memory cells MC located in the memory region 212, a plurality of transistors LT located in the peripheral region 214, and a composite dielectric film structure 101 including at least two dielectric material layers 102, 103 extending over the plurality of transistors LT in the peripheral region 214, where a peripheral edge 431 of the composite dielectric film structure 101 is located within 300 nm of a boundary 430 between the memory region 212 and the peripheral region 214.

In an embodiment, the boundary 430 between the memory region 212 and the peripheral region 214 is defined by a peripheral edge of an isolation feature IF2 located in the substrate 210.

In another embodiment, an upper surface of the substrate 210 is recessed in the memory region 212 relative to an upper surface of the substrate 210 in the peripheral region 214.

In another embodiment, the semiconductor device 100 further includes a plurality of conductive vias 110 extending through the composite dielectric film structure 101, where the composite dielectric film structure 101 extends continuously between the conductive vias 110 in the peripheral region 214.

In another embodiment, each of the transistors LT in the peripheral region 214 includes a metal gate MG, and the composite dielectric film structure 101 is located over the metal gates MG of the plurality of transistors LT in the peripheral region 214.

In another embodiment, the composite dielectric film structure 101 includes at least two dielectric material layers 102, 103 having different compositions and/or physical characteristics.

An additional embodiment is drawn to a method of fabricating a semiconductor device 100 that includes forming a memory cell MC in a memory region 212 of a substrate 210, forming a transistor LT including a metal gate MG in a peripheral region 214 of the substrate 210, forming a composite dielectric film structure 101 over the metal gate MG of the transistor LT in the peripheral region 214 of the substrate 210, wherein the composite dielectric film structure 101 includes a first dielectric layer 102 and a second dielectric layer 103 over the first dielectric layer 102, and the second dielectric layer 103 has a greater density than a density of the first dielectric layer 102, and performing a wet etch to remove a metal material from the semiconductor device 100, wherein the composite dielectric film structure 101 protects the metal gate MG of the transistor LT in the peripheral region 214 from being etched.

In one embodiment, forming the composite dielectric film structure includes forming the first dielectric layer 102 over the metal gate MG of the transistor LT in the peripheral region 214 and over a control gate CG of the memory cell MC in the memory region 212, and forming the second dielectric layer 103 over the first dielectric layer 102 in the peripheral region 214 to form the composite dielectric film structure 101, wherein the composite dielectric film structure 101 does not extend over the memory cell MC in the memory region 212 of the semiconductor device 100.

In another embodiment, the method further includes forming a metal silicide layer 380 over an upper surface of at least one of a select gate SG and an erase gate EG of the memory cell MC, wherein a portion of the first dielectric layer 102 is located over the control gate CG of the memory cell MC during the formation of the metal silicide layer 380.

In another embodiment, forming the metal silicide layer 380 includes depositing a metal layer over at least one of the select gate SG and the erase gate EG of the memory cell MC, and heating the metal layer to form a metal silicide layer 380 over an upper surface of at least one of the select gate SG and the erase gate EG of the memory cell MC, wherein excess metal is removed from the semiconductor device 100 during the wet etch.

In another embodiment, the method further includes forming a conductive via 110 through the composite dielectric film structure 101 and electrically contacting a source or drain region SD of the transistor LT in the peripheral region 214.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate including a first region and a second region;
    a plurality of memory devices located in the first region;
    a plurality of transistors each including a metal gate located in the second region;
    a first dielectric layer extending over the plurality of transistors in the second region and over at least a portion of the plurality of memory devices located in the first region; and
    a second dielectric layer extending over the first dielectric layer in the first region, wherein the second dielectric layer has a different composition and/or physical characteristics than the first dielectric layer, and the second dielectric layer does not extend over the memory devices in the first region.

2. The semiconductor device of claim 1, wherein the first dielectric layer contacts an upper surface of each of the metal gates of the plurality of transistors.

3. The semiconductor device of claim 1, wherein each of the first dielectric layer and the second dielectric layer have a thickness that is between 5 nm and 30 nm.

4. The semiconductor device of claim 1, wherein the first dielectric layer comprises a dielectric material including at least one of silicon oxide formed using a tetraethoxysilane (TEOS) precursor, and a resist protective oxide (RPO) material.

5. The semiconductor device of claim 1, wherein the second dielectric layer comprises a dielectric material including at least one of a buffer oxide material, a silicon nitride material, and a high-temperature oxide (HTO) material.

6. The semiconductor device of claim 1, wherein the first dielectric layer contacts an upper surface of at least one memory device in the first region.

7. The semiconductor device of claim 6, wherein the at least one memory device comprises:
    a floating gate;
    a control gate located above the floating gate; and
    a select gate located on a first side of the floating gate and the control gate, wherein the first dielectric layer contacts an upper surface of the control gate.

8. The semiconductor device of claim 7, wherein the at least one memory device further comprises:
    an erase gate located on a second side of the floating gate and the control gate, wherein a metal silicide layer is located on an upper surface of the select gate and on an upper surface of the erase gate.

9. The semiconductor device of claim 8, wherein the first dielectric layer is not located over the metal silicide layer located on the upper surface of the select gate and on the upper surface of the erase gate.

10. A semiconductor device, comprising:
    a substrate including a first region and a second region, wherein an upper surface of the substrate is recessed in the first region relative to an upper surface of the substrate in the second region;
    a plurality of memory devices located in the first region;
    a plurality of transistors each including a metal gate located in the second region; and
    a composite dielectric film structure comprising at least two dielectric layers extending over the plurality of transistors in the second region, wherein a lower surface of the composite dielectric film structure is coplanar with an upper surface of each of the memory devices.

11. The semiconductor device of claim 10, wherein a peripheral edge of the composite dielectric film structure is located within 300 nm of a boundary between the first region and the second region.

12. The semiconductor device of claim 11, wherein the boundary between a memory region and a peripheral region is defined by a peripheral edge of an isolation feature located in the substrate.

13. The semiconductor device of claim 10, further comprising a plurality of conductive vias extending through the composite dielectric film structure, wherein the composite dielectric film structure extends continuously between the conductive vias in the second region.

14. The semiconductor device of claim 10, wherein each of the transistors in the second region includes a metal gate, and the composite dielectric film structure is located over the metal gates of the plurality of transistors in the second region.

15. The semiconductor device of claim 10, wherein the composite dielectric film structure comprises at least two dielectric layers having different compositions and/or physical characteristics.

16. A method of fabricating a semiconductor device, comprising:
    forming a plurality of memory devices in a first region of a substrate;
    forming a plurality of transistors, each including a metal gate, in a second region of the substrate;
    forming a first dielectric material layer over the plurality of transistors in the second region and over a portion of each of the memory devices in the first region;
    forming a second dielectric material layer over the first dielectric layer in the second region, wherein the second dielectric layer does not extend over the plurality of memory devices in the first region;
    depositing a metal material layer over the semiconductor device;
    heating the metal material layer to form a metal silicide layer over portions of the memory devices that are exposed through the first dielectric layer; and
    performing an etching process to remove remaining portions of the metal material layer.

17. The method of claim 16, wherein forming the first dielectric layer comprises forming the first dielectric layer over each of the metal gates of the plurality of transistors in the second region and over a control gate of each of the plurality of memory devices located in the first region.

18. The method of claim 16, wherein forming the second dielectric layer comprises forming the second dielectric layer over the first dielectric layer in the second region such that a peripheral edge of the second dielectric layer is located within 300 nm of a boundary between the first region and the second region.

19. The method of claim 16, wherein the metal material layer is heated to form the metal silicide layer over an upper surface of at least one of a select gate and a control gate of a memory device in the first region, and a portion of the first dielectric layer is located over a control gate of the memory device during the formation of the metal silicide layer and during the etching process to remove the remaining portions of the metal material layer.

20. The method of claim 16, further comprising:
    forming a conductive via through the first dielectric layer and the second dielectric layer and electrically contacting a source or drain region of a transistor in the second region.

* * * * *